United States Patent
Ohsawa et al.

(10) Patent No.: US 7,514,202 B2
(45) Date of Patent: *Apr. 7, 2009

(54) THERMAL ACID GENERATOR, RESIST UNDERCOAT MATERIAL AND PATTERNING PROCESS

(75) Inventors: Youichi Ohsawa, Joetsu (JP); Takeru Watanabe, Joetsu (JP); Jun Hatakeyama, Joetsu (JP)

(73) Assignee: Shin-Etsu Chemical Co., Ltd., Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 11/797,948

(22) Filed: May 9, 2007

(65) Prior Publication Data

US 2007/0264596 A1 Nov. 15, 2007

(30) Foreign Application Priority Data

May 15, 2006 (JP) .............................. 2006-135169

(51) Int. Cl.
G03F 7/004 (2006.01)
G03F 7/30 (2006.01)
C07C 309/06 (2006.01)

(52) U.S. Cl. ................. 430/270.1; 430/273.1; 430/323; 430/921; 430/925; 562/30; 562/111; 562/113

(58) Field of Classification Search .............. 430/270.1, 430/273.1, 323, 921, 925; 562/30, 111, 113
See application file for complete search history.

(56) References Cited

U.S. PATENT DOCUMENTS

| | | | |
|---|---|---|---|
| 6,261,738 B1 | 7/2001 | Asakura et al. | |
| 6,440,638 B2 | 8/2002 | Golz et al. | |
| 6,849,374 B2 | 2/2005 | Cameron et al. | |
| 6,887,648 B2 | 5/2005 | Pavelchek et al. | |
| 6,897,004 B2 | 5/2005 | Uenishi et al. | |
| 6,908,722 B2 | 6/2005 | Ebata et al. | |
| 6,949,678 B2 | 9/2005 | Kunimoto et al. | |
| 7,163,778 B2 | 1/2007 | Hatakeyama et al. | |
| 2004/0241577 A1 | 12/2004 | Hatakeyama et al. | |
| 2004/0247900 A1 | 12/2004 | Ogihara et al. | |
| 2005/0176982 A1 | 8/2005 | Tomita et al. | |
| 2005/0277058 A1 | 12/2005 | Iwabuchi et al. | |
| 2006/0019195 A1 | 1/2006 | Hatakeyama et al. | |
| 2006/0021964 A1 | 2/2006 | Hirayama et al. | |
| 2006/0228648 A1* | 10/2006 | Ohsawa et al. ........... | 430/270.1 |
| 2007/0003871 A1 | 1/2007 | Kodama et al. | |
| 2008/0032231 A1* | 2/2008 | Hatakeyama et al. .... | 430/270.1 |
| 2008/0085469 A1* | 4/2008 | Ohsawa et al. ........... | 430/286.1 |

FOREIGN PATENT DOCUMENTS

| | | |
|---|---|---|
| JP | 9-95479 A | 4/1997 |
| JP | 9-208554 A | 8/1997 |
| JP | 9-230588 A | 9/1997 |
| JP | 9-301948 A | 11/1997 |
| JP | 2906999 B2 | 6/1999 |
| JP | 2000-314956 A | 11/2000 |
| JP | 2002-167340 A | 6/2002 |
| JP | 2002-214774 A | 7/2002 |
| JP | 2003-114533 A | 4/2003 |
| JP | 2003-252855 A | 9/2003 |
| JP | 2004-205685 A | 7/2004 |
| JP | 2004-531749 A | 10/2004 |
| JP | 2004-341479 A | 12/2004 |
| JP | 2004-354554 A | 12/2004 |
| JP | 2005-15532 A | 1/2005 |
| JP | 2005-18054 A | 1/2005 |
| JP | 2005-84621 A | 3/2005 |
| JP | 2005-128509 A | 5/2005 |
| JP | 2005-352104 A | 12/2005 |

OTHER PUBLICATIONS

Patent Abstract of Japan, Publication No. 2004-002252, published on Jan. 8, 2004.
Patent Abstract of Japan, Publication No. 2001-233842, published on Aug. 28, 2001.
Patent Abstract of WO 2004-074242, published on Sep. 2, 2004.
Patent Abstract of Japan, Publication No. 2001-122850, published on May 8, 2001.
Patent Abstract of Japan, Publication No. 2005-048152, published on Feb. 24, 2005.
Patent Abstract of Japan, Publication No. 2004-310019, published on Nov. 4, 2004.
Patent Abstract of Japan, Publication No. 2004-094029, published on Mar. 25, 2004.
Cheng-Ping Qian et al.,; "Perfluoro-Enolate Chemistry: Facile Generation And Unique Reactivies Of MetalF-1-PORPEN-2-OLATES"; Tetrahedron Letters, vol. 29, No. 33, pp. 4119-4122, (1988).
Romeo B. Wagner et al.,; "Synthetic Organic Chemistry", pp. 813-814, John Wiley & Sons, Inc. (1965).

* cited by examiner

*Primary Examiner*—John S Chu
(74) *Attorney, Agent, or Firm*—Westerman, Hattori, Daniels & Adrian, LLP.

(57) ABSTRACT

A thermal acid generator of generating an acid on heating above 100° C. has formula: $CF_3CH(OCOR)CF_2SO_3^-(R^1)_4N^+$ wherein R is alkyl or aryl, $R^1$ is hydrogen, alkyl, alkenyl, oxoalkyl, aryl, aralkyl or aryloxoalkyl, or $R^1$ may bond together to form a ring with N. The sulfonic acid generated possesses an ester site within molecule so that less bulky acyl groups to bulky groups may be incorporated therein. The thermal acid generator provides a sufficient acid strength, is less volatile due to a high molecular weight, and ensures film formation. Upon disposal of used resist liquid, it may be converted into low accumulative compounds.

9 Claims, 36 Drawing Sheets

THERMAL ACID GENERATOR, RESIST UNDERCOAT MATERIAL AND PATTERNING PROCESS

CROSS-REFERENCE TO RELATED APPLICATION

This non-provisional application claims priority under 35 U.S.C. §119(a) on Patent Application No. 2006-135169 filed in Japan on May 15, 2006, the entire contents of which are hereby incorporated by reference.

TECHNICAL FIELD

This invention relates to a thermal acid generator and a resist undercoat material useful in the multilayer resist technology for micropatterning in a process for the fabrication of semiconductor devices or the like, especially a silicon-containing resist undercoat material based on a polymer containing silicon atoms or a resist undercoat material based on a silicon-free polymer. It also relates to a lithographic process for forming a pattern in a substrate using the resist undercoat material.

BACKGROUND OF THE INVENTION

While a number of recent efforts are being made to achieve a finer pattern rule in the drive for higher integration and operating speeds in LSI devices, the commonly used light exposure lithography is approaching the essential limit of resolution determined by the light source wavelength.

As the light source used in the lithography for resist pattern formation, g-line (436 nm) or i-line (365 nm) from a mercury lamp has been widely used. One means believed effective for further reducing the feature size is to reduce the wavelength of exposure light. For the mass production process of 64 M-bit DRAM, the exposure light source of i-line (365 nm) was replaced by a KrF excimer laser having a shorter wavelength of 248 nm. However, for the fabrication of DRAM with a degree of integration of 1 G or more requiring a finer patterning technology (processing feature size 0.13 µm or less), a shorter wavelength light source is required. In particular, lithography using ArF excimer laser light (193 nm) is on the verge of mass scale production.

In search for a light source of a shorter wavelength, lithography using a $F_2$ laser (157 nm), known as $F_2$ lithography, is under investigations. Even the use of $F_2$ lithography encounters difficulty in complying with the demand for micropatterning to a feature size below 100 nm, especially below 65 nm. Candidates for the technology include high-energy electron beam direct writing, low-energy electron beam direct writing, high-energy ion beam, high-energy electron reduction projection lithography (EPL), low-energy electron beam proximity lithography (LEEPL), extreme ultraviolet lithography (EUV), and the like.

With the progress toward a finer feature size, resist pattern collapse becomes serious. Since a pattern having an aspect ratio of at least 3 undergoes a margin drop due to resist pattern collapse, efforts are made to reduce the thickness of resist film. Since a thinner resist film has lower resistance to dry etching, this propensity accelerates a reduction of the margin for the thickness of a resist film for processing a substrate.

Known methods for processing an extremely thin resist film include a resist process using an organic antireflective coating as an undercoat below the resist film, and multilayer resist processes such as bi- and tri-layer resist processes.

The resist undercoats used in these processes include organic films having an optical constant effective for antireflection, silicon-containing organic and inorganic films having etching resistance, and organic films having a structure for achieving a high carbon density. Particularly when organic films are prepared, it is a common practice to add acid crosslinkers and thermal acid generators for the purposes of forming a robust film, preventing intermixing with an overlying resist layer, and avoiding footing of a resist pattern.

In the multilayer resist process, acid crosslinkers and thermal acid generators added to resist undercoat materials play an important role. To promote crosslinking reaction by heating, thermal acid generators of generating a strong acid are necessary. Then thermal acid generators capable of generating perfluoroalkylsulfonic acid are advantageously used. Undesirably low molecular weight sulfonic acids such as trifluoromethanesulfonic acid and nonafluorobutanesulfonic acid are so volatile that they can volatilize off during heat crosslinking reaction. On the other hand, perfluorooctanesulfonic acid and analogues having a long-chain alkyl group (collectively referred to as PFOS) are less volatile, but suffer from toxic and environmental problems including their stability (or non-degradability) due to C—F bonds, and biological concentration and accumulation due to hydrophobic and lipophilic natures. The US EPA adopted Significant New Use Rule, listing 13 PFOS-related chemical substances and further listing 75 chemical substances although their use in the photoresist field is excluded. Because of the toxic and environmental problems, it would be desirable to develop PFOS-free materials.

Facing the PFOS-related problems, manufacturers made efforts to develop partially fluorinated alkyl sulfonic acids having a reduced degree of fluorine substitution. For instance, JP-A 2004-531749 describes the development of $\alpha,\alpha$-difluoroalkylsulfonic acid salts from $\alpha,\alpha$-difluoroalkene and a sulfur compound and discloses a resist composition comprising a photoacid generator which generates such sulfonic acid upon irradiation, specifically di(4-tert-butylphenyl)iodonium 1,1-difluoro-1-sulfonate-2-(1-naphthyl)ethylene. JP-A 2004-002252 describes the development of $\alpha,\alpha,\beta,\beta$-tetrafluoroalkylsulfonic acid salts from $\alpha,\alpha,\beta,\beta$-tetrafluoro-$\alpha$-iodoalkane and a sulfur compound and discloses a photoacid generator capable of generating such a sulfonic acid and a resist composition comprising the same. JP-A 2002-214774 discloses a number of photoacid generators capable of generating partially fluorinated alkyl sulfonic acids and resist compositions comprising the same, although it lacks synthesis examples of specific compounds. However, these substances still have many problems regarding the availability of starting intermediates and the difficulty of their preparation. These substances are used only as photoacid generators while their use in undercoat material is referred to nowhere.

DISCLOSURE OF THE INVENTION

While a resist undercoat material generally comprises a thermal acid generator and an acid crosslinker, the acid generated by the thermal acid generator is desired to promote the reaction of acid crosslinker to form an undercoat layer, produce a resist pattern profile without footing, eliminate the PFOS-related problems, and be easily degradable at the end of lithography use without imposing a load to the environment. The acids generated by conventional thermal acid generators do not meet these requirements.

The invention intends to overcome the above-discussed problems of conventional thermal acid generators. An object of the invention is to provide a thermal acid generator which is formulated in a resist undercoat material so that the resulting resist undercoat material lends itself to lithography using a light source of wavelength corresponding to electron beam and soft x-ray, exhibits a sufficiently high etching rate relative to a resist topcoat layer and a sufficiently low etching rate relative to a processable substrate and an organic film, allows a resist pattern profile of perpendicular geometry to be formed in the resist topcoat layer, and achieves improvements in line edge roughness and dimensional uniformity. Another object is to provide a resist undercoat material comprising the thermal acid generator. A further object is to provide a process for forming a pattern on a substrate using the resist undercoat material.

The inventors have found that when substituted or unsubstituted 1,1,3,3,3-pentafluoropropen-2-yl aliphatic or aromatic carboxylic acid esters obtained by starting with commercially readily available 1,1,1,3,3,3-hexafluoro-2-propanol are reacted with sulfur compounds such as sodium sulfite and sodium hydrogen sulfite, 1,1,3,3,3-pentafluoro-2-acyloxypropane-1-sulfonic acid salts or 1,1,3,3,3-pentafluoro-2-arylcarbonyloxypropane-1-sulfonic acid salts can be produced; and that ammonium salts, sulfonium salts, and iodonium salts obtained through appropriate anion exchange from these sulfonic acid salts, and compounds as typified by oxime sulfonates and sulfonyloxyimides derived from these sulfonic acid salts are effective as the thermal acid generator in resist undercoat materials.

Accordingly, the present invention provides a thermal acid generator, a resist undercoat material comprising the thermal acid generator, and a patterning process using the resist undercoat material, as defined below.

[1] A thermal acid generator of generating an acid on heating at or above 100° C., having the general formula (1a):

  (1a)

wherein R is a substituted or unsubstituted, straight, branched or cyclic alkyl group of 1 to 20 carbon atoms or a substituted or unsubstituted aryl group of 6 to 14 carbon atoms, $R^1$ is each independently hydrogen, a substituted or unsubstituted, straight, branched or cyclic alkyl, alkenyl or oxoalkyl group of 1 to 10 carbon atoms, or a substituted or unsubstituted aryl, aralkyl or aryloxoalkyl group of 6 to 18 carbon atoms, or any two or more of $R^1$ may bond together to form a ring with the nitrogen atom.

[2] A resist undercoat material for use as an undercoat layer beneath a chemically amplified photoresist layer, comprising a resin, an acid crosslinker, and an onium salt having the general formula (1):

  (1)

wherein R is a substituted or unsubstituted, straight, branched or cyclic alkyl group of 1 to 20 carbon atoms or a substituted or unsubstituted aryl group of 6 to 14 carbon atoms; A is a nitrogen, sulfur or iodine atom, m is 4 when A is a nitrogen atom, m is 3 when A is a sulfur atom, or m is 2 when A is an iodine atom; $R^1$ is each independently hydrogen, a substituted or unsubstituted, straight, branched or cyclic alkyl, alkenyl or oxoalkyl group of 1 to 10 carbon atoms, or a substituted or unsubstituted aryl, aralkyl or aryloxoalkyl group of 6 to 18 carbon atoms, or any two or more of $R^1$ may bond together to form a ring with A, with the proviso that $R^1$ is not hydrogen when A is a sulfur or iodine atom.

[3] A resist undercoat material for use as an undercoat layer beneath a chemically amplified photoresist layer, comprising a resin, an acid crosslinker, and a thermal acid generator of generating an acid on heating at or above 100° C., the acid having the general formula (2):

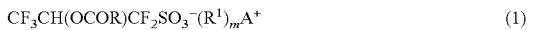  (2)

wherein R is a substituted or unsubstituted, straight, branched or cyclic alkyl group of 1 to 20 carbon atoms or a substituted or unsubstituted aryl group of 6 to 14 carbon atoms.

[4] The resist undercoat material of [2] or [3], wherein said resin contains silicon atoms.

[5] The resist undercoat material of any one of [2] to [4], wherein said resin and said acid crosslinker are included within a common resin.

[6] The resist undercoat material of any one of [2] to [5], further comprising an organic solvent.

[7] A lithographic process for forming a pattern in a substrate, comprising the steps of applying the resist undercoat material of [3] onto at least a substrate to form a resist undercoat layer; applying a resist topcoat material in the form of a photoresist composition onto the undercoat layer to form a resist topcoat layer, thus constructing a multilayer resist film; exposing the multilayer resist film in a pattern circuit region to radiation; developing with a developer to form a resist pattern in the resist topcoat layer; and etching the resist undercoat layer and the substrate through the patterned resist topcoat layer as a mask for forming a pattern in the substrate.

[8] A lithographic process for forming a pattern in a substrate, comprising the steps of applying the silicon-containing resist undercoat material of [4] onto at least a substrate to form a resist undercoat layer; applying a resist topcoat material in the form of a photoresist composition onto the undercoat layer to form a resist topcoat layer, thus constructing a multilayer resist film; exposing the multilayer resist film in a pattern circuit region to radiation; developing with a developer to form a resist pattern in the resist topcoat layer; etching the resist undercoat layer through the patterned resist topcoat layer as a mask; and etching the substrate through the patterned resist undercoat layer as a mask for forming a pattern in the substrate.

[9] A lithographic process for forming a pattern in a substrate, comprising the steps of applying the resist undercoat material of [3] onto at least a processable substrate to form an organic undercoat layer; applying a silicon-containing intermediate layer onto the undercoat layer; applying a photoresist composition onto the intermediate layer to form a photoresist layer; exposing the photoresist layer in a predetermined region to radiation; developing with a developer to form a patterned photoresist layer; processing the intermediate layer through the patterned photoresist layer as a mask by means of a dry etching apparatus; removing the patterned photoresist layer; etching the undercoat layer through the processed intermediate layer as a mask; and processing the processable substrate through the processed undercoat layer as a mask.

BENEFITS OF THE INVENTION

The thermal acid generator of the invention has a wide spectrum of molecular design because the sulfonic acid generated thereby possesses an ester site within its molecule so that a variety of substituent groups ranging from less bulky acyl groups to bulky acyl groups, benzoyl groups, naphthoyl groups, and anthranyl groups may be easily incorporated therein. The thermal acid generator generates a sulfonic acid having a sufficient acid strength to induce crosslinkage between the acid crosslinker and the resin, and is less volatile because it has a high molecular weight and does not belong to perfluoroalkanes. The thermal acid generator acts, upon heating, to induce crosslinkage between the acid crosslinker and the resin and ensures film formation. Upon disposal of spent resist liquid after the device fabrication, the ester site is susceptible to alkaline hydrolysis so that it may be converted into low molecular weight low accumulative compounds. Upon disposal by burning, the thermal acid generator residue is fully combustible because of a low percent fluorine substitution.

DESCRIPTION OF THE PREFERRED EMBODIMENTS

Figure 1:
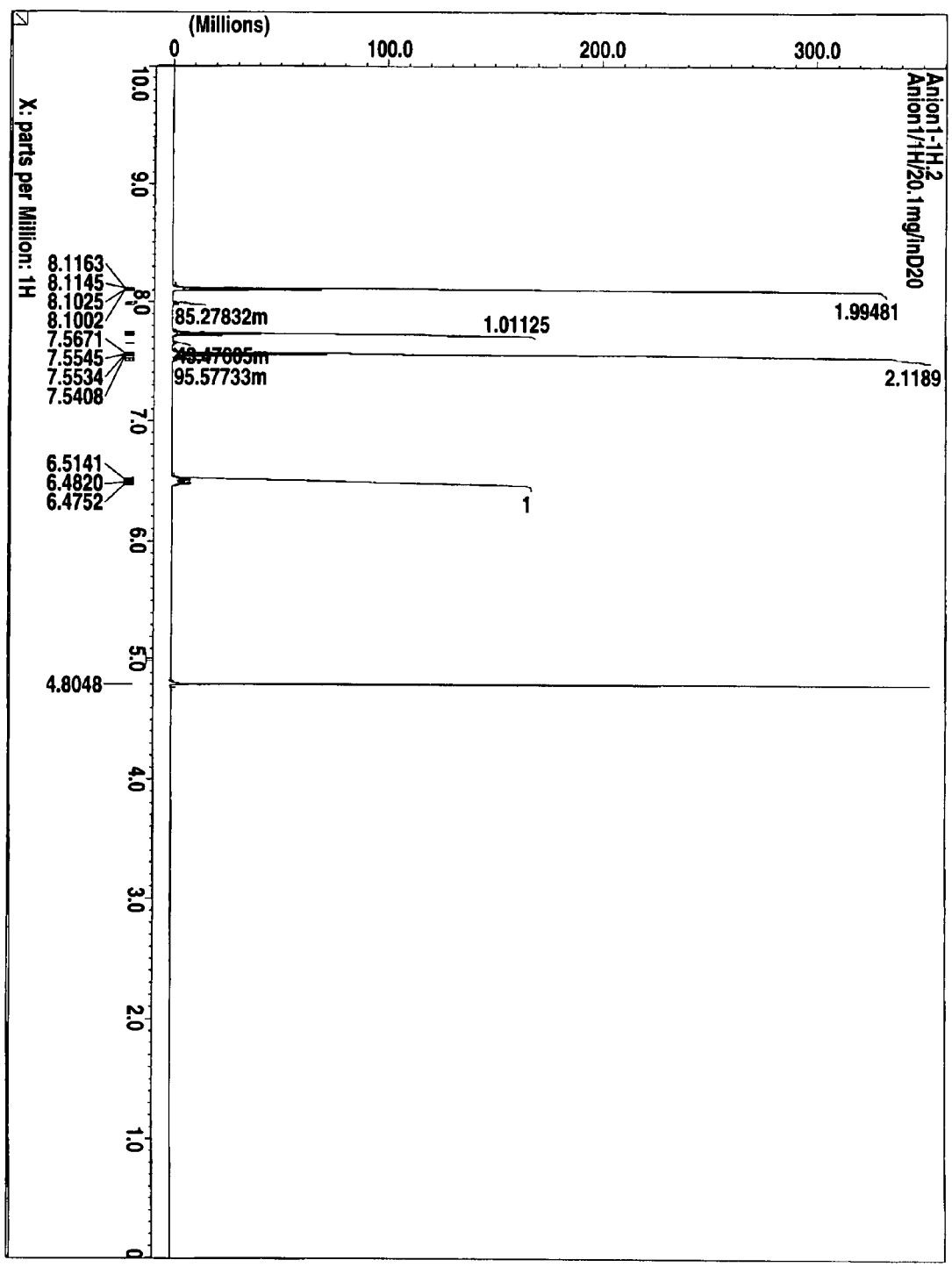
FIG. 1 is a diagram of $^1$H-NMR/D$_2$O of Anion 1 in Synthesis Example 9.

The thermal acid generator which generates an acid on heating at or above 100° C. according to the invention has the general formula (1a).

$$CF_3CH(OCOR)CF_2SO_3^-(R^1)_4N^+ \qquad (1a)$$

Herein R is a substituted or unsubstituted, straight, branched or cyclic alkyl group of 1 to 20 carbon atoms or a substituted or unsubstituted aryl group of 6 to 14 carbon atoms; $R^1$ is each independently a hydrogen atom, a substituted or unsubstituted, straight, branched or cyclic alkyl, alkenyl or oxoalkyl group of 1 to 10 carbon atoms, or a substituted or unsubstituted aryl, aralkyl or aryloxoalkyl group of 6 to 18 carbon atoms, or any two or more of $R^1$ may bond together to form a ring with the nitrogen atom.

In formula (1a), R is a substituted or unsubstituted, straight, branched or cyclic alkyl group of 1 to 20 carbon atoms or a substituted or unsubstituted aryl group of 6 to 14 carbon atoms. Suitable groups include methyl, ethyl, n-propyl, sec-propyl, cyclopropyl, n-butyl, sec-butyl, iso-butyl, tert-butyl, n-pentyl, cyclopentyl, n-hexyl, cyclohexyl, n-octyl, n-decyl, n-dodecyl, 1-adamantyl, 2-adamantyl, bicyclo[2.2.1]hepten-2-yl, phenyl, 4-methoxyphenyl, 4-tert-butylphenyl, 4-biphenyl, 1-naphthyl, 2-naphthyl, 10-anthranyl, and 2-furanyl. Substituent groups thereon include halogen, alkoxy, carboxyl, and carbonyl groups. Of these groups represented by R, tert-butyl, cyclohexyl, 1-adamantyl, phenyl, 4-tert-butylphenyl, 4-methoxyphenyl, 4-biphenyl, 1-naphthyl, and 2-naphthyl are preferred. Inter alia, tert-butyl, cyclohexyl, phenyl, and 4-tert-butylphenyl groups are more preferred.

In formula (1a), $R^1$ is each independently a hydrogen atom, a substituted or unsubstituted, straight, branched or cyclic alkyl, alkenyl or oxoalkyl group of 1 to 10 carbon atoms, or a substituted or unsubstituted aryl, aralkyl or aryloxoalkyl group of 6 to 18 carbon atoms, or any two or more of $R^1$ may bond together to form a ring with the nitrogen atom. Substituent groups thereon include hydroxyl, alkoxy, halogen, and carbonyl groups. Suitable alkyl groups include methyl, ethyl, propyl, isopropyl, n-butyl, sec-butyl, tert-butyl, pentyl, hexyl, heptyl, octyl, cyclopentyl, cyclohexyl, cycloheptyl, cyclopropylmethyl, 4-methylcyclohexyl, cyclohexylmethyl, norbornyl, and adamantyl. Suitable alkenyl groups include vinyl, allyl, propenyl, butenyl, hexenyl, and cyclohexenyl. Suitable oxoalkyl groups include 2-oxocyclopentyl, 2-oxocyclohexyl, 2-oxopropyl, 2-oxoethyl, 2-cyclopentyl-2-oxoethyl, 2-cyclohexyl-2-oxoethyl, and 2-(4-methylcyclohexyl)-2-oxoethyl. Suitable aryl groups include phenyl, naphthyl and thienyl, alkoxyphenyl groups such as 4-hydroxyphenyl, p-methoxyphenyl, m-methoxyphenyl, o-methoxyphenyl, p-ethoxyphenyl, p-tert-butoxyphenyl, and m-tert-butoxyphenyl, alkylphenyl groups such as 2-methylphenyl, 3-methylphenyl, 4-methylphenyl, ethylphenyl, 4-tert-butylphenyl, 4-butylphenyl, 2,4-dimethylphenyl, alkylnaphthyl groups such as methylnaphthyl and ethylnaphthyl, alkoxynaphthyl groups such as methoxynaphthyl and ethoxynaphthyl, dialkylnaphthyl groups such as dimethylnaphthyl and diethylnaphthyl, and dialkoxynaphthyl groups such as dimethoxynaphthyl and diethoxynaphthyl. Suitable aralkyl groups include benzyl, 1-phenylethyl, and 2-phenylethyl. Suitable aryloxyalkyl groups are 2-aryl-2-oxoethyl groups such as 2-phenyl-2-oxoethyl, 2-(1-naphthyl)-2-oxoethyl, and 2-(2-naphthyl)-2-oxoethyl.

When any two or more of $R^1$ bond together to form a ring structure with the nitrogen atom, suitable ring structures include piperidine, morpholine, pyridine, quinoline, acridine, imidazole, and benzimidazole structures, in which the nitrogen atom may be protonated or alkylated. Also included are aryl groups having substituted thereon polymerizable substituent groups such as acryloyloxy and methacryloyloxy groups, for example, 4-(acryloyloxy)phenyl, 4-(methacryloyloxy)phenyl, 4-vinyloxyphenyl and 4-vinylphenyl groups.

A non-exclusive list of preferred examples of $(R^1)_4N^+$ includes ammonium, trimethylammonium, tetramethylammonium, triethylammonium, tributylammonium, tetrabutylammonium, trioctylammonium, anilinium, 2,6-dimethylanilinium, N,N-dimethylanilinium, N-benzyl-N,N-dimethylanilinium, and N-(p-methoxy)benzyl-N,N-dimethylanilinium.

Most often the resist undercoat material is stored in solution form. If an acid is generated in the solution, it can induce undesirable crosslinking reaction between the acid crosslinker and the resin. This leads to troubles in subsequent steps such as gelation, a variation in coating film thickness, and a lowering of coating uniformity. Thus a thermal acid generator which generates an acid only when heated is desirable. This stability requires an incipient pyrolysis temperature, that is, a thermal acid generating temperature of at least 100° C., and preferably at least 150° C. Notably, the incipient pyrolysis temperature is usually 300° C. or below.

A choice of ammonium cation $(R^1)_4N^+$ is important in controlling the incipient pyrolysis temperature. Except for quaternary ammonium salts, many ammonium cations are more stable when conjugated bases thereof have a stronger basicity. Such cations as N-benzyl-N,N-dimethylanilinium have relatively low heat stability.

The onium salt used in the resist undercoat material of the invention has the general formula (1):

$$CF_3CH(OCOR)CF_2SO_3^-(R^1)_mA^+ \quad (1)$$

wherein R is a substituted or unsubstituted, straight, branched or cyclic alkyl group of 1 to 20 carbon atoms or a substituted or unsubstituted aryl group of 6 to 14 carbon atoms; A is a nitrogen, sulfur or iodine atom, m is 4 when A is a nitrogen atom, m is 3 when A is a sulfur atom, or m is 2 when A is an iodine atom; $R^1$ is each independently hydrogen, a substituted or unsubstituted, straight, branched or cyclic alkyl, alkenyl or oxoalkyl group of 1 to 10 carbon atoms, or a substituted or unsubstituted aryl, aralkyl or aryloxoalkyl group of 6 to 18 carbon atoms, or any two or more of $R^1$ may bond together to form a ring with A, with the proviso that $R^1$ is not hydrogen when A is a sulfur or iodine atom.

R and $R^1$ in formula (1) are as described above for formula (1a). Notably, $R^1$ does not stand for hydrogen when A is a sulfur or iodine atom. When any two of $R^1$ bond together to form a ring with a sulfur atom, exemplary ring structures include tetrahydrothiophene, 1,4-thioxane, dibenzothiophene, and phenoxthine structures. The remaining one $R^1$ is as described above for formula (1a).

Illustrative examples of cation $(R^1)_mA^+$ include the following:

those cations wherein A is a nitrogen atom, such as ammonium, trimethylammonium, tetramethylammonium, triethylammonium, tributylammonium, tetrabutylammonium, trioctylammonium, anilinium, 2,6-dimethylanilinium, N,N-dimethylanilinium, N-benzyl-N,N-dimethylanilinium, and N-(p-methoxy)benzyl-N,N-dimethylanilinium;

those cations wherein A is a sulfur atom, such as triphenylsulfonium, 4-hydroxyphenyldiphenylsulfonium, bis(4-hydroxyphenyl)phenylsulfonium, tris(4-hydroxyphenyl)sulfonium, (4-tert-butoxyphenyl)diphenylsulfonium, bis(4-tert-butoxyphenyl)phenylsulfonium, tris(4-tert-butoxyphenyl)sulfonium, (3-tert-butoxyphenyl)diphenylsulfonium, bis(3-tert-butoxyphenyl)phenylsulfonium, tris(3-tert-butoxyphenyl)sulfonium, (3,4-di-tert-butoxyphenyl)diphenylsulfonium, bis(3,4-di-tert-butoxyphenyl)phenylsulfonium, tris(3,4-di-tert-butoxyphenyl)sulfonium, diphenyl(4-thiophenoxyphenyl)sulfonium, (4-tert-butoxycarbonylmethyloxyphenyl)diphenylsulfonium, tris(4-tert-butoxycarbonylmethyloxyphenyl)sulfonium, (4-tert-butoxyphenyl)bis(4-dimethylaminophenyl)sulfonium, tris(4-dimethylaminophenyl)sulfonium, 2-naphthyldiphenylsulfonium, dimethyl-2-naphthylsulfonium, 4-hydroxyphenyldimethylsulfonium, 4-methoxyphenyldimethylsulfonium, trimethylsulfonium, 2-oxocyclohexylcyclohexylmethylsulfonium, trinaphthylsulfonium, tribenzylsulfonium, diphenylmethylsulfonium, dimethylphenylsulfonium, 2-oxo-2-phenylethylthiacyclopentanium, diphenyl-2-thienylsulfonium, 4-n-butoxynaphthyl-1-thiacyclopentanium, 2-n-butoxynaphthyl-1-thiacyclopentanium, 4-methoxynaphthyl-1-thiacyclopentanium, 2-methoxynaphthyl-1-thiacyclopentanium, 4-methylphenyldiphenylsulfonium, 4-ethylphenyldiphenylsulfonium, 4-tert-butylphenyldiphenylsulfonium, 4-cyclohexylphenyldiphenylsulfonium, 4-n-hexylphenyldiphenylsulfonium, 4-n-octylphenyldiphenylsulfonium, 4-methoxyphenyldiphenylsulfonium, 4-ethoxyphenyldiphenylsulfonium, 4-cyclohexyloxyphenyldiphenylsulfonium, 4-n-hexyloxyphenyldiphenylsulfonium, 4-n-octyloxyphenyldiphenylsulfonium, 4-dodecyloxyphenyldiphenylsulfonium, 4-trifluoromethylphenyldiphenylsulfonium, 4-trifluoromethyloxyphenyldiphenylsulfonium, 4-tert-butoxycarbonylmethyloxyphenyldiphenylsulfonium, etc., with triphenylsulfonium, 4-tert-butylphenyldiphenylsulfonium, 4-tert-butoxyphenyldiphenylsulfonium, tris(4-tert-butylphenyl)sulfonium, (4-tert-butoxycarbonylmethyloxyphenyl)diphenylsulfonium, diphenylmethylsulfonium, dimethylphenylsulfonium, 2-oxo-2-phenylethylthiacyclopentanium being preferred, and those cations wherein A is an iodine atom, such as bis(4-methylphenyl)iodonium, bis(4-ethylphenyl)iodonium, bis(4-tert-butylphenyl)iodonium, bis(4-(1,1-dimethylpropyl)phenyl)iodonium, 4-methoxyphenylphenyliodonium, 4-tert-butoxyphenylphenyliodonium, 4-acryloyloxyphenylphenyliodonium, 4-methacryloyloxyphenylphenyliodonium, etc., with bis(4-tert-butylphenyl)iodonium being preferred.

Any desired one may be selected from among the ammonium salts, sulfonium salts, and iodonium salts, in consideration of an incipient pyrolysis temperature, solvent solubility, and residues after decomposition. Of these, ammonium salts are superior in availability and cost.

The thermal acid generator used in the resist undercoat material of the invention generates an acid of the general formula (2) when heated at or above 100° C.

$$CF_3CH(OCOR)CF_2SO_3^-H^+ \qquad (2)$$

Herein R is a substituted or unsubstituted, straight, branched or cyclic alkyl group of 1 to 20 carbon atoms or a substituted or unsubstituted aryl group of 6 to 14 carbon atoms.

In formula (2), R is as defined above. Illustrative examples of the thermal acid generator include those exemplified for formula (1), and N-sulfonyloxyimide compounds and oxime sulfonate compounds to be described below, but are not limited thereto as long as they generate acids of formula (2). It is noted that well-known photoacid generators not only generate acids upon exposure to high-energy radiation, but also generate acids upon heating. Then the existing photoacid generators may be used as the thermal acid generator in the invention as long as they have a sulfonic acid or sulfonate moiety of formula (2) as a sulfonic acid unit.

As described above, the resist undercoat material is often stored in solution form. If an acid is generated in the solution, it can induce undesirable crosslinking reaction between the acid crosslinker and the resin. This leads to troubles in subsequent steps such as gelation, a variation in coating film thickness, and a lowering of coating uniformity. Thus a thermal acid generator which generates an acid only when heated is desirable. This stability requires an incipient pyrolysis temperature, that is, a thermal acid generating temperature of at least 100° C., and preferably at least 150° C. Many sulfonic acid esters have relatively low heat stability while compounds stabilized with an electron-withdrawing group as illustrated below have good heat stability.

N-Sulfonyloxyimide

N-sulfonyloxyimide compounds of the general formula (3a) may be used as the thermal acid generator in the invention.

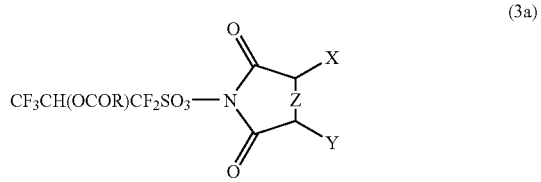

(3a)

Herein R is a substituted or unsubstituted, straight, branched or cyclic $C_1$-$C_{20}$ alkyl group or a substituted or unsubstituted $C_6$-$C_{14}$ aryl group; X and Y are each independently a hydrogen atom or a substituted or unsubstituted $C_1$-$C_6$ alkyl group, or X and Y may bond together to form a saturated or unsaturated ring of 6 to 12 carbon atoms with the carbon atoms to which they are attached; and Z is a single bond, a double bond, a methylene group or an oxygen atom.

In formula (3a), R is as defined above. X and Y are each independently a hydrogen atom or a substituted or unsubstituted $C_1$-$C_6$ alkyl group. Alternatively, X and Y may bond together to form a saturated or unsaturated ring of 6 to 12 carbon atoms with the carbon atoms to which they are attached. Z is a single bond, a double bond, a methylene group or an oxygen atom. Only the imide skeleton of the compound excluding the sulfonate moiety is illustrated below. With respect to the imide skeleton, reference should also be made to JP-A 2003-252855.

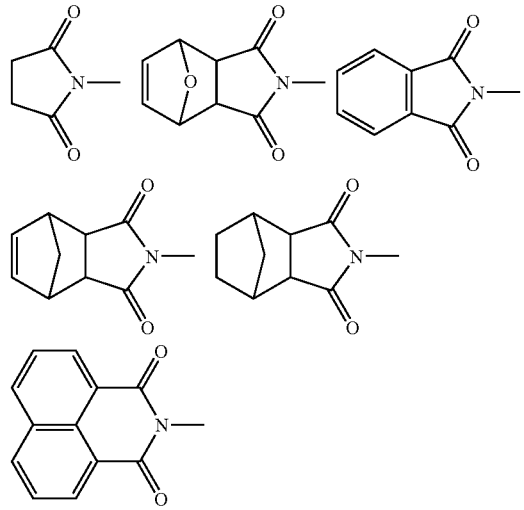

Oxime Sulfonate

Oxime sulfonate compounds of the general formula (3b) may also be used as the thermal acid generator in the invention.

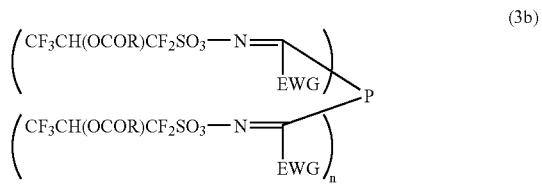

(3b)

Herein R is a substituted or unsubstituted, straight, branched or cyclic $C_1$-$C_{20}$ alkyl group or a substituted or unsubstituted $C_6$-$C_{14}$ aryl group; n is 0 or 1, when n is 0, p is a substituted or unsubstituted $C_1$-$C_{20}$ alkyl group or a substituted or unsubstituted $C_6$-$C_{12}$ aryl group, and when n is 1, p is a substituted or unsubstituted $C_1$-$C_{20}$ alkylene group or a substituted or unsubstituted $C_6$-$C_{12}$ arylene group, EWG is a cyano, trifluoromethyl, perfluoroethyl, perfluoropropyl, 5H-perfluoropentyl, 6H-perfluorohexyl, nitro or methyl group, and when n is 1, two EWG's may bond together to form a ring of 6 carbon atoms with the carbon atoms to which they are attached.

In formula (3b), R and n are as defined above. When n is 0, p is a substituted or unsubstituted $C_1$-$C_{20}$ alkyl group or a substituted or unsubstituted $C_6$-$C_{12}$ aryl group. When n is 1, p is a substituted or unsubstituted $C_1$-$C_{20}$ alkylene group or a substituted or unsubstituted $C_6$-$C_{12}$ arylene group. EWG is a cyano, trifluoromethyl, perfluoroethyl, perfluoropropyl, 5H-perfluoropentyl, 6H-perfluorohexyl, nitro or methyl group. When n is 1, two EWG's may bond together to form a ring of 6 carbon atoms with the carbon atoms to which they are attached. The skeletons of these oxime sulfonate compounds are described in U.S. Pat. No. 6,261,738, JP-A 9-95479, JP-A 9-208554, JP-A 9-230588, Japanese Patent No. 2,906,999, JP-A 9-301948, JP-A 2000-314956, JP-A 2001-233842, and International Publication 2004-074242.

Exemplary skeletons of oxime sulfonates excluding the sulfonate moiety are illustrated below.

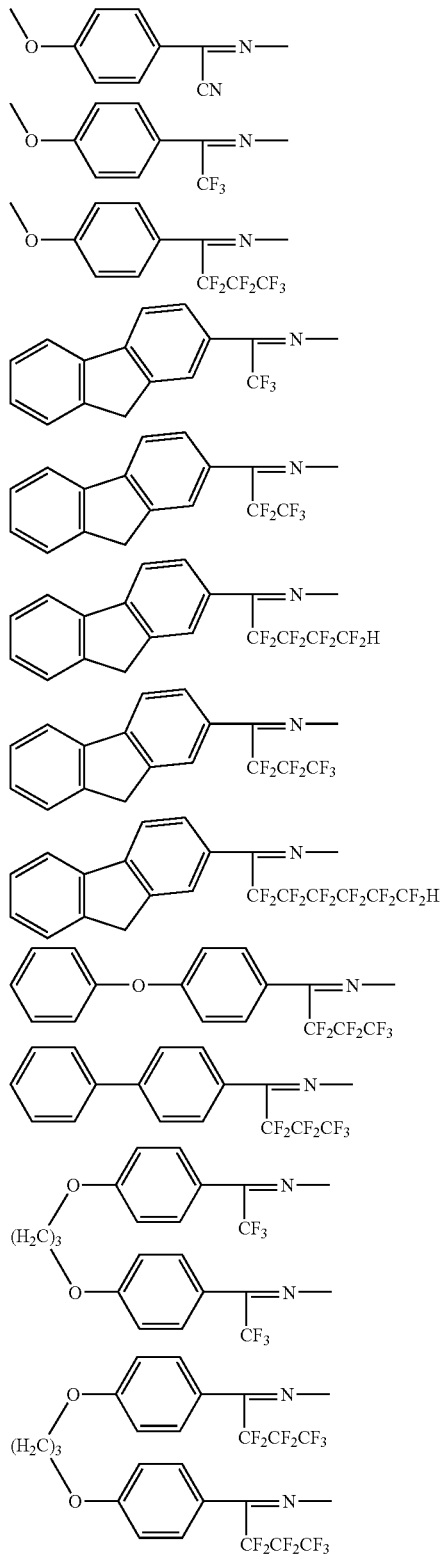

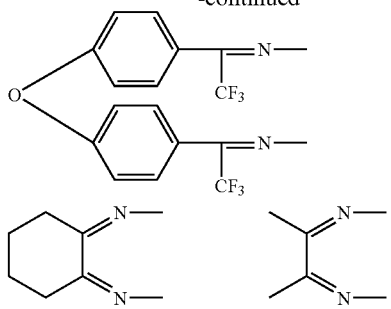

Described below is how to synthesize the onium salts having formula (1). Sulfonic acid inorganic salts such as sodium sulfonate can be synthesized by starting with aliphatic or aromatic carboxylic acid esters of 1,1,3,3,3-pentafluoropropen-2-yl, typically 1,1,3,3,3-pentafluoropropen-2-yl benzoate which was developed by Nakai et al. using 1,1,1,3,3,3-hexafluoro-2-propanol as the starting reactant (see Tetrahedron Lett., Vol. 29, 4119 (1988)), and reacting them with sodium hydrogen sulfite or sodium sulfite in the presence of a radical initiator such as azobisisobutyronitrile or benzoyl peroxide in a solvent which is water or alcohol or a mixture thereof. See R. B. Wagner et al., Synthetic Organic Chemistry, pp. 813-814, John Wiley & Sons, Inc. (1965).

These sulfonic acid sodium salts can be exchanged with ammonium cations, sulfonium cations or iodonium cations by well-known techniques and further converted into other thermal acid generators. More specifically, by subjecting the carboxylic acid ester moiety of an onium salt of formula (1) or a sulfonate of formula (3a) or (3b) to hydrolysis with an alkali such as sodium hydroxide or potassium hydroxide, or solvolysis with an alcohol and a base, and then reacting with an appropriate one such as aliphatic carboxylic acid halide, aliphatic carboxylic acid anhydride, aromatic carboxylic acid halide, aromatic carboxylic acid anhydride, a thermal acid generator in the form of an onium salt of formula (1) or a sulfonate of formula (3a) or (3b) having a carboxylic acid ester structure different from the original carboxylic acid ester structure is obtainable.

In preparing the sulfonic acid salt described above, an onium salt of the following general formula (1') or (1'') corresponding to the onium salt of formula (1) with hydrogen fluoride being eliminated can sometimes form as well.

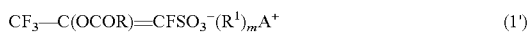

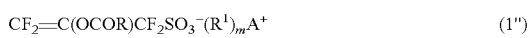

Herein, R, $R^1$, m and A are as defined above.

Accordingly, sulfonic acids generated by these thermal acid generators have the following general formula (2') or

When a mixture of onium salts is available during the above-described onium salt preparation, the onium salt of formula (1) and the onium salt of formula (1') or (1'') are often in a molar ratio from 100:0 to 100:10 although the exact ratio varies with the identity of R and preparation conditions.

From the onium salt of formula (1') or (1'') alone or in admixture with the onium salt of formula (1), a thermal acid generator other than onium salt may be derived. Further the onium salt alone or in admixture as above may be included as a thermal acid generator in the resist undercoat material of the invention or applied to the patterning process.

It is noted that the onium salt of formula (1') or (1") in the form of a mixture with the sulfonic acid salt of formula (1) is identifiable by $^{19}$F nuclear magnetic resonance (NMR) spectroscopy as demonstrated by diagrams in Synthesis Examples to be described later. From minute peaks of doublet in proximity to −66 ppm and quartet in proximity to −125 ppm observable in addition to the main component, the presence of sulfonic acid anion of (1') type is presumed. Understandably, the chemical shifts described above are exemplary, and they vary with a particular compound, measuring solvent, and measuring conditions. Further, on time-of-flight mass spectrometry (TOFMS), aside from the major anion, an anion having a mass number smaller by 20 than the major anion is sometimes observed on the negative side as a minute peak although a chance of observation depends on an existence ratio and sensitivity.

Synthesis of sulfonium salts and iodonium salts can be performed in accordance with the teachings of JP-A 2001-122850 and JP-A 2004-002252. With respect to ammonium salts, commercially available ammonium salts such as ammonium chlorides, bromides or hydrogen sulfates may be used as well as ammonium chlorides converted from commercially available amines with hydrochloric acid or the like.

Anion exchange may be performed in an alcohol solvent such as methanol, ethanol or the like, or in a two-layer system of dichloromethane/water or the like. Another possible recipe of effecting anion exchange with methyl sulfate is by reacting a corresponding sulfonic acid methyl ester with a sulfonyl halide or iodonium halide and removing the halide ion as methyl halide as described in JP-A 2002-167340.

Also, the compounds of formula (3a) and (3b) can be synthesized by reacting the aforementioned sulfonic acid salt with a chlorinating agent such as thionyl chloride, phosphorus oxychloride or phosphorus pentachloride to form a corresponding sulfonyl chloride or sulfonic acid anhydride, and further reacting with N-hydroxydicarboxylimide or oxime in a conventional way.

The first embodiment of the invention is a thermal acid generator of formula (1a). The second embodiment of the invention is a resist undercoat material comprising a thermal acid generator in the form of an onium salt of formula (1) or a thermal acid generator capable of generating a sulfonic acid of formula (2), an acid crosslinker, and a resin. The third embodiment of the invention is a patterning process using the resist undercoat material of the second embodiment.

Resist Undercoat Material

The resist undercoat material of the invention is defined as comprising the following:

(A) an onium salt of formula (1) or a thermal acid generator capable of generating a sulfonic acid of formula (2), (B) a resin, and (C) an acid crosslinker, and optionally, (D) an organic solvent, (E) a surfactant, and further optionally, (F) an acid generator capable of generating a sulfonic acid other than formula (2), and (G) a basic compound for improving shelf stability.

B. Resin

The resin (B) used in the resist undercoat material of the invention includes polymers containing silicon atoms and polymers not containing silicon atoms.

Exemplary polymers are those described in JP-A 2005-015532, JP-A 2005-048152, JP-A 2004-205685, JP-A 2004-310019, JP-A 2004-354554, JP-A 2005-018054, JP-A 2005-128509, JP-A 2005-084621, JP-A 2005-352104, JP-A 2003-114533, JP-A 2004-341479, and JP-A 2004-094029, which are incorporated herein by reference.

Exemplary of silicon-free polymers are cresol novolac, naphthol novolac, bisphenol fluorene novolac, phenol dicyclopentadiene novolac, naphthol dicyclopentadiene novolac, amorphous carbon, polyhydroxystyrene, acenaphthylene-based polymers, (meth)acrylate, polyimide, and polysulfone resins, as described in JP-A 2005-015532, JP-A 2004-205685, JP-A 2004-354554, JP-A 2005-128509, and JP-A 2005-084621.

Silicon-containing polymers are often used in the tri-layer process as a silicon-containing intermediate layer, with a polysilsesquioxane-based intermediate layer being preferred. By providing the intermediate layer with the function of an antireflective coating, reflection can be restrained. Especially for 193-nm exposure, while the use of a material containing more aromatic groups and having high resistance to substrate etching as the undercoat layer provides a high k value and high substrate reflection, the combined use of an intermediate layer that restrains reflection is successful in reducing the substrate reflection to 0.5% or less.

As the intermediate layer having an antireflection effect, use is preferably made of anthracene for 248-nm and 157-nm exposure, and polysilsesquioxane with phenyl groups or silicon-silicon bond-bearing light absorbing groups as pendants for 193-nm exposure (see JP-A 2004-341479). Of these silicon-containing polymers, those polymers having as substituent groups crosslinkable substituent groups, such as epoxy groups are preferred (see JP-A 2005-048152, JP-A 2004-310019, JP-A 2005-018054, and JP-A 2005-352104).

An appropriate amount of the thermal acid generator (A) used is 1 to 20 parts, more preferably 1 to 10 parts by weight per 100 parts by weight of the resin (B). The thermal acid generator may be a single one or a mixture of such generators.

C. Acid Crosslinker

Examples of the acid crosslinker which serves to form a crosslinked structure under the action of acid include melamine compounds, guanamine compounds, glycoluril compounds and urea compounds having substituted thereon at least one group selected from among methylol, alkoxymethyl and acyloxymethyl groups, epoxy compounds, thioepoxy compounds, isocyanate compounds, azido compounds, and compounds having a double bond such as an alkenyl ether group. These compounds may be used as an additive or introduced as pendant groups on polymer side chains. Compounds having a hydroxy group are also useful as the crosslinker.

Of the foregoing compounds, examples of suitable epoxy compounds include tris(2,3-epoxypropyl)isocyanurate, trimethylolmethane triglycidyl ether, trimethylolpropane triglycidyl ether, and triethylolethane triglycidyl ether.

Examples of the melamine compound include hexamethylol melamine, hexamethoxymethyl melamine, hexamethylol melamine compounds having 1 to 6 methylol groups methoxymethylated and mixtures thereof, hexamethoxyethyl melamine, hexaacyloxymethyl melamine, hexamethylol melamine compounds having 1 to 6 methylol groups acyloxymethylated and mixtures thereof. Examples of the guanamine compound include tetramethylol guanamine, tetramethoxymethyl guanamine, tetramethylol guanamine compounds having 1 to 4 methylol groups methoxymethylated and mixtures thereof, tetramethoxyethyl guanamine, tetraacyloxyguanamine, tetramethylol guanamine compounds having 1 to 4 methylol groups acyloxymethylated and mixtures thereof. Examples of the glycoluril compound include tetramethylol glycoluril, tetramethoxyglycoluril, tetramethoxymethyl glycoluril, tetramethylol glycoluril compounds having 1 to 4 methylol groups methoxymethylated and mixtures thereof, tetramethylol glycoluril compounds having 1 to 4 methylol groups acyloxymethylated and mixtures thereof. Examples of the urea compound include tetramethylol urea, tetramethoxymethyl urea, tetramethylol urea compounds having 1 to 4 methylol groups methoxymethylated and mixtures thereof, and tetramethoxyethyl urea.

Examples of the alkenyl ether group-containing compound include ethylene glycol divinyl ether, triethylene glycol divinyl ether, 1,2-propanediol divinyl ether, 1,4-butanediol divinyl ether, tetramethylene glycol divinyl ether, neopentyl glycol divinyl ether, trimethylol propane trivinyl ether, hexanediol divinyl ether, 1,4-cyclohexanediol divinyl ether, pentaerythritol trivinyl ether, pentaerythritol tetravinyl ether, sorbitol tetravinyl ether, sorbitol pentavinyl ether, and trimethylol propane trivinyl ether.

In the case of novolac resins having fluorene or spiroindene structure wherein the hydrogen atoms of hydroxyl groups are replaced by glycidyl groups, it is effective to add compounds containing groups in which hydroxyl groups or the hydrogen atoms of hydroxyl groups are replaced by glycidyl groups. In particular, compounds having at least two hydroxyl or glycidyloxy groups in a molecule are preferred.

Suitable alcoholic group-containing compounds include naphthol novolac, m- and p-cresol novolac, naphthol-dicyclopentadiene novolac, m- and p-cresol-dicyclopentadiene novolac, 4,8-bis(hydroxymethyl)tricyclo[5.2.1.0$^{2,6}$]-decane, pentaerythritol, 1,2,6-hexanetriol, 4,4',4"-methylidene triscyclohexanol, 4,4'-[1-[4-[1-(4-hydroxycyclohexyl)-1-methylethyl]phenyl]-ethylidene]biscyclohexanol, [1,1'-bicyclohexyl]-4,4'-diol, methylenebiscyclohexanol, decahydronaphthalene-2,6-diol, and [1,1'-bicyclohexyl]-3,3',4,4'-tetrahydroxy. Suitable low-nuclear phenol compounds include bisphenol, methylene bisphenol, 2,2'-methylenebis[4-methylphenol], 4,4'-methylidene-bis[2,6-dimethylphenol], 4,4'-(1-methyl-ethylidene)bis[2-methylphenol], 4,4'-cyclohexylidene bisphenol, 4,4'-(1,3-dimethylbutylidene)bisphenol, 4,4'-(1-methylethylidene)bis[2,6-dimethylphenol], 4,4'-oxybisphenol, 4,4'-methylenebisphenol, bis(4-hydroxyphenyl)methanone, 4,4'-methylene bis[2-methylphenol], 4,4'-[1,4-phenylenebis(1-methylethylidene)]bisphenol, 4,4'-(1,2-ethanediyl)bisphenol, 4,4'-(diethylsilylene)bisphenol, 4,4'-[2,2,2-trifluoro-1-(trifluoromethyl)ethylidene]bisphenol, 4,4'"-methylidene trisphenol, 4,4'-[1-(4-hydroxyphenyl)-1-methylethyl]phenyl]ethylidene]-bisphenol, 2,6-bis[(2-hydroxy-5-methylphenyl)methyl]-4-methylphenol, 4,4',4"-ethylidyne tris[2-methylphenol], 4,4',4"-ethylidyne trisphenol, 4,6-bis[(4-hydroxyphenyl)methyl]-1,3-benzenediol, 4,4'-[(3,4-dihydroxyphenyl)methylene]bis[2-methylphenol], 4,4',4",4'"-(1,2-ethanediylidene)tetrakisphenol, 4,4',4",4'"-(1,2-ethanediylidene)tetrakis[2-methylphenol], 2,2'-methylenebis[6-[(2-hydroxy-5-methylphenyl)methyl]-4-methylphenol], 4,4',4",4'"-(1,4-phenylenedimethylidyne)tetrakisphenol, 2,4,6-tris(4-hydroxyphenylmethyl)-1,3-benzenediol, 2,4',4"-methylidenetrisphenol, 4,4',4"'-(3-methyl-1-propanyl-3-ylidene)trisphenol, 2,6-bis[(4-hydroxy-3-fluorophenyl)methyl]-4-fluorophenol, 2,6-bis[4-hydroxy-3-fluorophenyl]methyl]-4-fluorophenol, 3,6-bis[(3,5-dimethyl-4-hydroxyphenyl)methyl]-1,2-benzenediol, 4,6-bis[(3,5-dimethyl-4-hydroxyphenyl)methyl]-1,3-benzenediol, p-methylcalix[4]arene, 2,2'-methylenebis[6-[(2,5/3,6-dimethyl-4/2-hydroxyphenyl)-methyl]-4-methylphenol], 2,2'-methylenebis[6-[(3,5-dimethyl-4-hydroxyphenyl)methyl]-4-methylphenol, 4,4',4",4'"-tetrakis[(1-methylethylidene)bis(1,4-cyclo-hexylidene)]phenol, 6,6'-methylenebis[4-(4-hydroxyphenylmethyl)-1,2,3-benzenetriol, and 3,3',5,5'-tetrakis[(5-methyl-2-hydroxyphenyl)methyl]-[(1,1'-biphenyl)-4,4'-diol], and analogous compounds whose hydroxyl group is converted to a glycidyl ether form.

In the undercoat material, the crosslinker is preferably compounded in an amount of 5 to 50 parts by weight, more preferably 10 to 40 parts by weight per 100 parts by weight of the resin. Less than 5 pbw of the crosslinker may allow for mixing with the resist. More than 50 pbw of the crosslinker may invite a degraded antireflection effect or cracking of the crosslinked film.

The crosslinkers may be used alone or in admixture of two or more.

D. Solvent

The organic solvent used herein may be any organic solvent in which the resin, acid generator, crosslinker and other components are soluble. Illustrative, non-limiting, examples of the organic solvent include ketones such as cyclohexanone and methyl-2-n-amylketone; alcohols such as 3-methoxybutanol, 3-methyl-3-methoxybutanol, 1-methoxy-2-propanol, and 1-ethoxy-2-propanol; ethers such as propylene glycol monomethyl ether, ethylene glycol monomethyl ether, propylene glycol monoethyl ether, ethylene glycol monoethyl ether, propylene glycol dimethyl ether, and diethylene glycol dimethyl ether; and esters such as propylene glycol monomethyl ether acetate (PGMEA), propylene glycol monoethyl ether acetate, ethyl lactate, ethyl pyruvate, butyl acetate, methyl 3-methoxypropionate, ethyl 3-ethoxypropionate, tert-butyl acetate, tert-butyl propionate, and propylene glycol mono-tert-butyl ether acetate. These solvents may be used alone or in combinations of two or more thereof. Of the above organic solvents, preferred are diethylene glycol dimethyl ether, 1-ethoxy-2-propanol, ethyl lactate, propylene glycol monomethyl ether acetate and propylene glycol monomethyl ether, and mixtures thereof.

The organic solvent is preferably added in an amount of about 200 to 10,000 parts by weight, especially about 300 to 5,000 parts by weight per 100 parts by weight of the resin.

E. Surfactant

Illustrative, non-limiting, examples of the surfactant include nonionic surfactants, for example, polyoxyethylene alkyl ethers such as polyoxyethylene lauryl ether, polyoxyethylene stearyl ether, polyoxyethylene cetyl ether, and polyoxyethylene oleyl ether, polyoxyethylene alkylaryl ethers such as polyoxyethylene octylphenol ether and polyoxyethylene nonylphenol ether, polyoxyethylene polyoxypropylene block copolymers, sorbitan fatty acid esters such as sorbitan monolaurate, sorbitan monopalmitate, and sorbitan monostearate, and polyoxyethylene sorbitan fatty acid esters such as polyoxyethylene sorbitan monolaurate, polyoxyethylene sorbitan monopalmitate, polyoxyethylene sorbitan monostearate, polyoxyethylene sorbitan trioleate, and polyoxyethylene sorbitan tristearate; fluorochemical surfactants such as EFTOP EF301, EF303 and EF352 (JEMCO Inc.), Megaface F171, F172, F173, R08 and R30 (Dai-Nippon Ink & Chemicals, Inc.), Fluorad FC430, FC431, FC-4430 and FC-4432 (Sumitomo 3M Co., Ltd.), Asahiguard AG710, Surflon S-381, S-382, SC101, SC102, SC103, SC104, SC105, SC106, Surfynol E1004, KH-10, KH-20, KH-30 and KH-40 (Asahi Glass Co., Ltd.); organosiloxane polymers KP341, X-70-092 and X-70-093 (Shin-Etsu Chemical Co., Ltd.), acrylic acid or methacrylic acid Polyflow No. 75 and No. 95 (Kyoeisha Ushi Kagaku Kogyo Co., Ltd.). Inter alia, FC430, Surflon S-381, Surfynol E1004, KH-20 and KH-30 are preferred. These surfactants may be used alone or in admixture.

In the resist undercoat material, the surfactant is preferably added in an amount of up to 2 parts by weight, especially up to 1 part by weight per 100 parts by weight of the resin.

A list of the acid generator (F) which generates a sulfonic acid other than formula (2) includes acid generators such as sulfonium salts, iodonium salts and diazomethanes described in JP-A 2005-128509, and acid generators of generating partially fluorinated alkanesulfonic acids described in the above-referred JP-A 2004-531749, JP-A 2004-002252, and JP-A 2002-214774. As mentioned previously, since well-known photoacid generators not only generate acids upon exposure to high-energy radiation, but also generate acids upon heating, the existing photoacid generators may be used as the thermal acid generator which generates an acid other than the sulfonic acid of formula (2).

An appropriate amount of component (F) added is up to 10 parts by weight, especially up to 5 parts by weight per 100 parts by weight of the resin, though not limited thereto as long as the effect of component (A) is not compromised.

The basic compound (G) for improving shelf stability plays the role of a quencher to acid for preventing the acid generated in a minor amount by the acid generator from driving forward crosslinking reaction.

Suitable basic compounds include primary, secondary, and tertiary aliphatic amines, mixed amines, aromatic amines, heterocyclic amines, nitrogen-containing compounds with carboxyl group, nitrogen-containing compounds with sulfonyl group, nitrogen-containing compounds with hydroxyl group, nitrogen-containing compounds with hydroxyphenyl group, alcoholic nitrogen-containing compounds, amide derivatives, and imide derivatives. Specifically, the basic compounds described in JP-A 2005-128509 may be used.

The amount of component (G) added is not particularly limited as long as the effect of component (A) is not compromised. An appropriate amount is usually 0.001 to 2 parts by weight, especially 0.01 to 1 part by weight per 100 parts by weight of the resin. Less than 0.001 pbw of the basic compound fails to achieve the desired addition effect whereas more than 2 pbw of the basic compound may trap all the acid generated upon heating, inhibiting crosslinkage.

Process

It is now described how to form a pattern using the resist undercoat material of the invention.

Like photoresists, the undercoat material of the invention can be applied onto a processable substrate by any desired technique such as spin coating, to form an undercoat layer thereon. After spin coating, the coating is desirably baked in order to evaporate off the solvent and to promote crosslinking reaction for preventing the undercoat layer from mixing with the overlying resist. The baking is preferably effected at a temperature of 80 to 300° C. for a time of 10 to 300 seconds. The thickness of the undercoat layer may be suitably determined although it is preferably in the range of 30 to 20,000 nm, especially 50 to 15,000 nm.

In one embodiment of the invention wherein a resist undercoat layer is formed using a silicon-containing resin, an organic film is formed on a processable substrate using a resist undercoat material comprising a thermal acid generator of generating an acid of formula (2), an acid crosslinker, and a silicon-free resin according to the invention or the existing organic film material, after which an undercoat film is formed thereon using a resist undercoat material comprising a thermal acid generator of generating an acid of formula (2), an acid crosslinker, and a silicon-containing resin according to the invention.

In another embodiment of the invention wherein a resist undercoat layer is formed using a silicon-free resin, at least two processes as described below are involved. Once the undercoat layer is formed, a silicon-containing resist layer is formed thereon in the case of bi-layer process; and a silicon-containing intermediate layer is formed thereon, and a silicon-free monolayer resist layer is further formed on the intermediate layer in the case of tri-layer process. Any of well-known photoresist compositions may be used to form the resist layer.

As the silicon-containing resist composition for the bilayer process, a positive photoresist composition comprising a silicon atom-containing polymer such as a polysilsesquioxane derivative or vinylsilane derivative as a base polymer, an organic solvent, an acid generator, and optionally, a basic compound and the like is often used from the standpoint of oxygen gas etching resistance. As the silicon atom-containing polymer, any of well-known polymers which are used in resist compositions of this type may be used.

As the silicon-containing intermediate layer for the tri-layer process, the resist undercoat material comprising a thermal acid generator of generating an acid of formula (2), an acid crosslinker, and a silicon-containing resin according to the invention or the existing silicon-containing intermediate layer may be used.

Also, an intermediate layer formed by chemical vapor deposition (CVD) may be used. Know intermediate layers formed by CVD and fully effective as an antireflective coating are SiON coatings. As compared with the CVD, formation of an intermediate layer by a spin coating technique is simple and economical. The topcoat resist material in the tri-layer process may be either positive or negative and may be the same as a commonly used monolayer resist material.

Therefore, the patterning process of the invention involves at least four combinations of processable substrate, undercoat material, intermediate layer, and resist material as described below, but is not limited thereto.

(1) (silicon free) photoresist layer/inventive resist undercoat material comprising thermal acid generator, acid crosslinker and silicon-containing resin (intermediate layer)/existing organic undercoat material/processable substrate (2) (silicon free) photoresist layer/inventive resist undercoat material comprising thermal acid generator, acid crosslinker and silicon-containing resin (intermediate layer)/inventive resist undercoat material comprising thermal acid generator, acid crosslinker and silicon-free resin/processable substrate (3) (silicon free) photoresist layer/existing silicon-containing intermediate layer/inventive resist undercoat material comprising thermal acid generator, acid crosslinker and silicon-free resin/processable substrate (4) silicon-containing photoresist layer/inventive resist undercoat material comprising thermal acid generator, acid crosslinker and silicon-free resin/processable substrate When the photoresist composition is applied to form a resist layer, a spin coating technique is preferably used as in the case of the undercoat layer. The resist composition is spin coated and then pre-baked, preferably at 80 to 180° C. for 10 to 300 seconds. Thereafter, the resist layer is routinely exposed to radiation through a desired pattern, post-exposure baked (PEB) and developed with a developer, obtaining a resist pattern. The thickness of the resist layer is preferably in a range of 30 to 500 nm, more preferably 50 to 400 nm, though not particularly limited. The radiation for exposure may be selected from among high-energy radiation having a wavelength of up to 300 nm, specifically excimer laser beams of 248 nm, 193 nm and 157 nm, soft X-rays of 3 to 20 nm, electron beams, and X-rays.

Next, etching is carried out using the resist pattern as a mask. In the bilayer process, the undercoat layer is typically etched with oxygen gas. In addition to oxygen gas, an inert gas such as He or Ar or another gas such as CO, $CO_2$, $NH_3$, $SO_2$, $N_2$, $NO_2$ or $H_2$ may be added to the etchant gas. The other gas is used for sidewall protection, that is, for preventing the pattern sidewalls from being undercut. Etching solely with CO, $CO_2$, $NH_3$, $SO_2$, $NO_2$ or $H_2$ gas without using oxygen gas is also acceptable. In the tri-layer process, the intermediate layer is etched with a fluorocarbon-base gas using the patterned resist as a mask. Then the undercoat layer is etched with oxygen gas (same as above) using the patterned intermediate layer as a mask.

The undercoat layer of the invention comprising a silicon atom-containing resin, a thermal acid generator of generating an acid of formula (2), and an acid crosslinker is characterized by resistance to patternwise etching of the intermediate layer.

Next, the processable substrate is etched by a conventional technique. For example, when the substrate is $SiO_2$ or SiN, etching with a fluorocarbon-base gas is employed. When the substrate is p-Si, Al or W, etching with a chlorine or bromine-base gas is employed. When the substrate processing is etching with a fluorocarbon-base gas, the silicon-containing resist in the bilayer resist process and the silicon-containing intermediate layer in the tri-layer process are stripped at the same time as the substrate processing. When the substrate is etched with a chlorine or bromine-base gas, the silicon-containing resist or the silicon-containing intermediate layer must be subsequently stripped by dry etching with a fluorocarbon-base gas after the substrate processing.

The undercoat layer of the invention comprising a silicon atom-free resin, a thermal acid generator of generating an acid of formula (2), and an acid crosslinker is characterized by resistance to etching of the processable substrate.

The processable substrate is formed on a support substrate. The support substrate includes those of Si, $\alpha$-Si, p-Si, $SiO_2$, SiN, SiON, W, TiN, Al and the like, and a suitable material different from the processable film (or processable substrate) is selected among them. The processable film is selected from low-k films of Si, $SiO_2$, SiON, SiN, p-Si, $\alpha$-Si, W, W—Si, Al, Cu, Al—Si and the like and stop films thereof, and typically has a thickness of 50 to 10,000 nm, especially 100 to 5,000 nm.

EXAMPLE

Synthesis Examples and Examples are given below together with Comparative Examples for further illustrating the invention although the invention is not limited thereby. The term "pbw" is parts by weight, Mw is a weight average molecular weight, Mn is a number average molecular weight, and Mw/Mn is a dispersity.

Synthesis Example 1

Synthesis of Triphenylsulfonium Chloride

Diphenyl sulfoxide, 40 g (0.2 mol), was dissolved in 400 g of dichloromethane, which was stirred under ice cooling. At a temperature below 20° C., 65 g (0.6 mol) of trimethylsilyl chloride was added dropwise to the solution, which was aged at the temperature for 30 minutes. Next, a Grignard reagent which had been separately prepared from 14.6 g (0.6 mol) of metallic magnesium, 67.5 g (0.6 mol) of chlorobenzene, and 168 g of tetrahydrofuran (THF) was added dropwise at a temperature below 20° C. The reaction solution was aged at the temperature for one hour. At a temperature below 20° C., 50 g of water was added to quench the reaction. To this solution, 150 g of water, 10 g of 12N hydrochloric acid and 200 g of diethyl ether were further added.

The water layer was separated and washed with 100 g of diethyl ether, yielding an aqueous solution of triphenylsulfonium chloride. The compound in aqueous solution form was used in the subsequent reaction without further isolation.

Synthesis Example 2

Synthesis of 4-tert-butylphenyldiphenylsulfonium bromide

The target compound was obtained by following the procedure of Synthesis Example 1 aside from using 4-tert-butylbromobenzene instead of the chlorobenzene in Synthesis Example 1 and increasing the amount of water for extraction.

Synthesis Example 3

Synthesis of 4-tert-butoxyphenyldiphenylsulfonium chloride

The target compound was obtained by following the procedure of Synthesis Example 1 aside from using 4-tert-butoxychlorobenzene instead of the chlorobenzene in Synthesis Example 1, using dichloromethane containing 5 wt % of triethylamine as the solvent, and increasing the amount of water for extraction.

Synthesis Example 4

Synthesis of tris(4-methylphenyl)sulfonium chloride

The target compound was obtained by following the procedure of Synthesis Example 1 aside from using bis(4-methylphenyl) sulfoxide instead of the diphenyl sulfoxide and 4-chlorotoluene instead of the chlorobenzene in Synthesis Example 1, and increasing the amount of water for extraction.

Synthesis Example 5

Synthesis of tris(4-tert-butylphenyl)sulfonium bromide

The target compound was obtained by following the procedure of Synthesis Example 1 aside from using bis(4-tert-butylphenyl) sulfoxide instead of the diphenyl sulfoxide and 4-tert-butylbromobenzene instead of the chlorobenzene in Synthesis Example 1, and increasing the amount of water for extraction.

Synthesis Example 6

Synthesis of bis(4-tert-butylphenyl)iodonium hydrogen sulfate

A mixture of 84 g (0.5 mole) of tert-butylbenzene, 53 g (0.25 mole) of potassium iodate and 50 g of acetic anhydride was stirred under ice cooling, and a mixture of 35 g of acetic anhydride and 95 g of conc. sulfuric acid was added dropwise thereto at a temperature below 30° C. The resulting solution was aged for 3 hours at room temperature and ice cooled again, after which 250 g of water was added dropwise to quench the reaction. The reaction solution was extracted with 400 g of dichloromethane. The organic layer was discolored by adding 6 g of sodium hydrogen sulfite. The organic layer was washed with 250 g of water three times. The washed organic layer was concentrated in vacuum, obtaining a crude target product. The product was used in the subsequent reaction without further purification.

Synthesis Example 7

Synthesis of Phenacyltetrahydrothiophenium Bromide 88.2 g (0.44 mole) of phenacyl bromide and 39.1 g (0.44 mole) of tetrahydrothiophene were dissolved in 220 g of nitromethane, which was stirred for 4 hours at room temperature. 800 g of water and 400 g of diethyl ether were added to the reaction solution whereupon the mixture separated into two layers. The aqueous layer was taken out, which was an aqueous solution of the target compound, phenacyltetrahydrothiophenium bromide.

Synthesis Example 8

Synthesis of Dimethylphenylsulfonium Hydrogen Sulfate 6.2 g (0.05 mole) of thioanisole and 6.9 g (0.055 mole) of dimethyl sulfate were stirred for 12 hours at room temperature. 100 g of water and 50 ml of diethyl ether were added to the reaction solution whereupon the mixture separated into two layers. The aqueous layer was taken out, which was an aqueous solution of the target compound, dimethylphenylsulfonium hydrogen sulfate.

Synthesis Example 9

Synthesis of sodium 1,1,3,3,3-pentafluoro-2-benzoyloxy-propane-1-sulfonate (Anion 1)

10.0 g of 1,1,3,3,3-pentafluoropropen-2-yl benzoate, which had been synthesized by a conventional technique, was dispersed in 72 g of water, after which 12.0 g of sodium hydrogen sulfite and 1.24 g of benzoyl peroxide were added. The reaction took place at 85° C. for 65 hours. The reaction solution was allowed to cool. Toluene was added, followed by separatory operation to separate a water layer. A saturated sodium chloride aqueous solution was added to the water layer whereupon white crystals settled out. The crystals were collected by filtration, washed with a small volume of saturated sodium chloride aqueous solution and then dried in vacuum, obtaining the target compound, sodium 1,1,3,3,3-pentafluoro-2-benzoyloxypropane-1-sulfonate. White crystals, 5.85 g (yield 43%).

Figure 2:
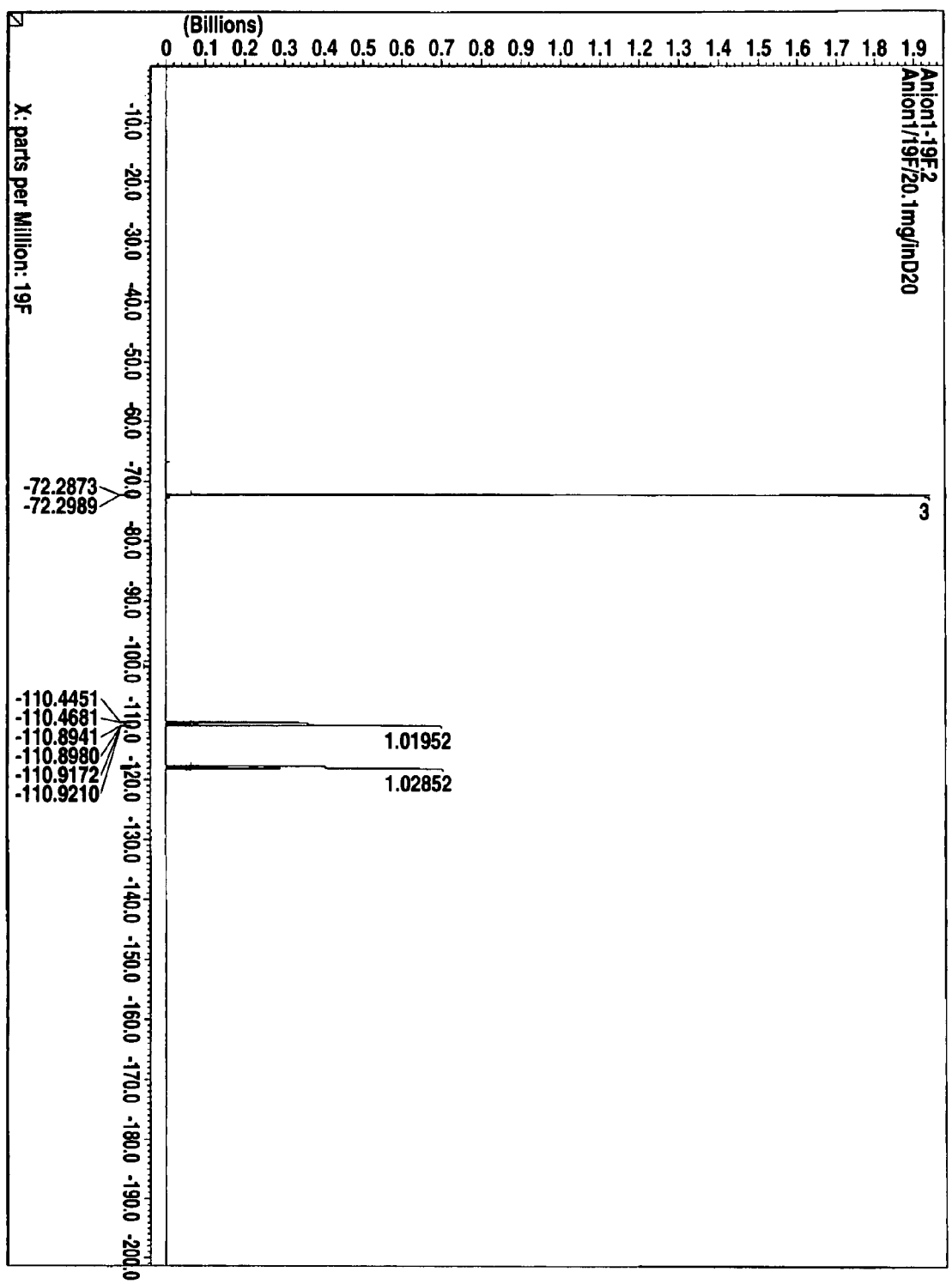
FIG. 2 is a diagram of $^{19}$F-NMR/D$_2$O of Anion 1 in Synthesis Example 9.

The target compound was analyzed by spectroscopy, with the data shown below. The spectra of nuclear magnetic resonance spectroscopy ($^1$H-NMR and $^{19}$F-NMR/D$_2$O) are shown in FIGS. 1 and 2.

Infrared absorption spectra (IR; KBr disc, cm$^{-1}$) 1752, 1643, 1604, 1454, 1367, 1344, 1286, 1245, 1189, 1159, 1114, 1097, 1041, 1024, 1002, 908, 707, 647

Time-of-flight mass spectrometry (TOFMS; MALDI) NEGATIVE M$^-$333 (corresponding to CF$_3$CH (OCOC$_6$H$_5$)CF$_2$SO$_3^-$)

Synthesis Example 10

Synthesis of sodium 1,1,3,3,3-pentafluoro-2-(4-phenyl-benzoyloxy)propanesulfonate (Anion 2)

The target sodium sulfonate was obtained by following the procedure of Synthesis Example 9 aside from using 1,1,3,3,3-pentafluoropropen-2-yl-4-phenyl benzoate which had been synthesized by a conventional technique.

Synthesis Example 11

Synthesis of triphenylsulfonium 1,1,3,3,3-pentafluoro-2-benzoyloxypropane-1-sulfonate (PAG1)

To 50 g of dichloromethane were added an amount (corresponding to 0.011 mole) of the triphenylsulfonium chloride aqueous solution of Synthesis Example 1 and 3.6 g (0.01 mole) of sodium 1,1,3,3,3-pentafluoro-2-benzoyloxy-propane-1-sulfonate synthesized in Synthesis Example 9, followed by stirring. The organic layer was separated and washed with 50 g of water three times. The organic layer was concentrated and 25 g of diethyl ether was added to the residue for crystallization. The crystals were filtered and dried, obtaining the target compound. White crystals, 4.5 g (yield 75%).

Figure 3:
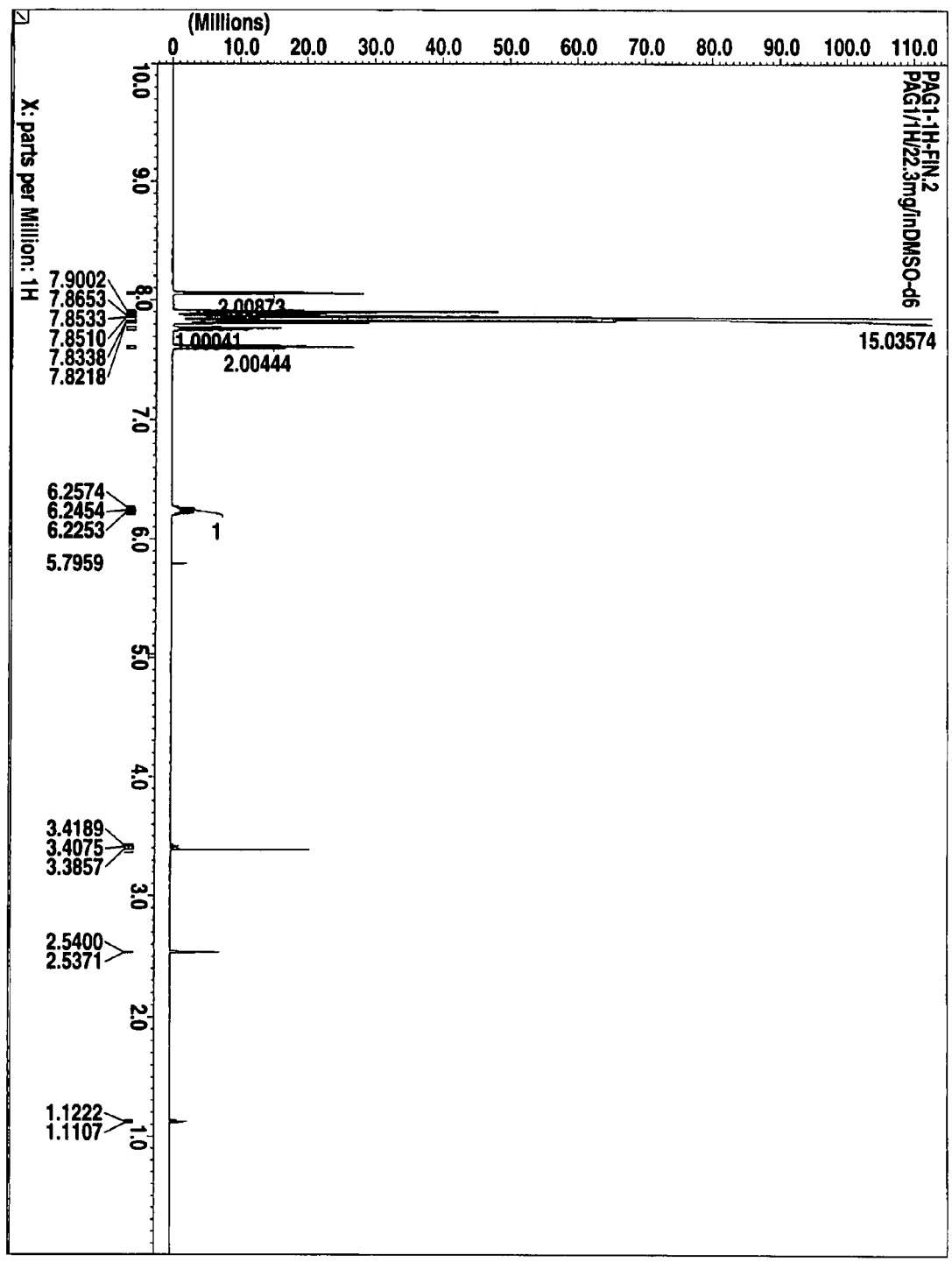
FIG. 3 is a diagram of $^1$H-NMR/DMSO-d$_6$ of PAG1 in Synthesis Example 11.
Figure 4:
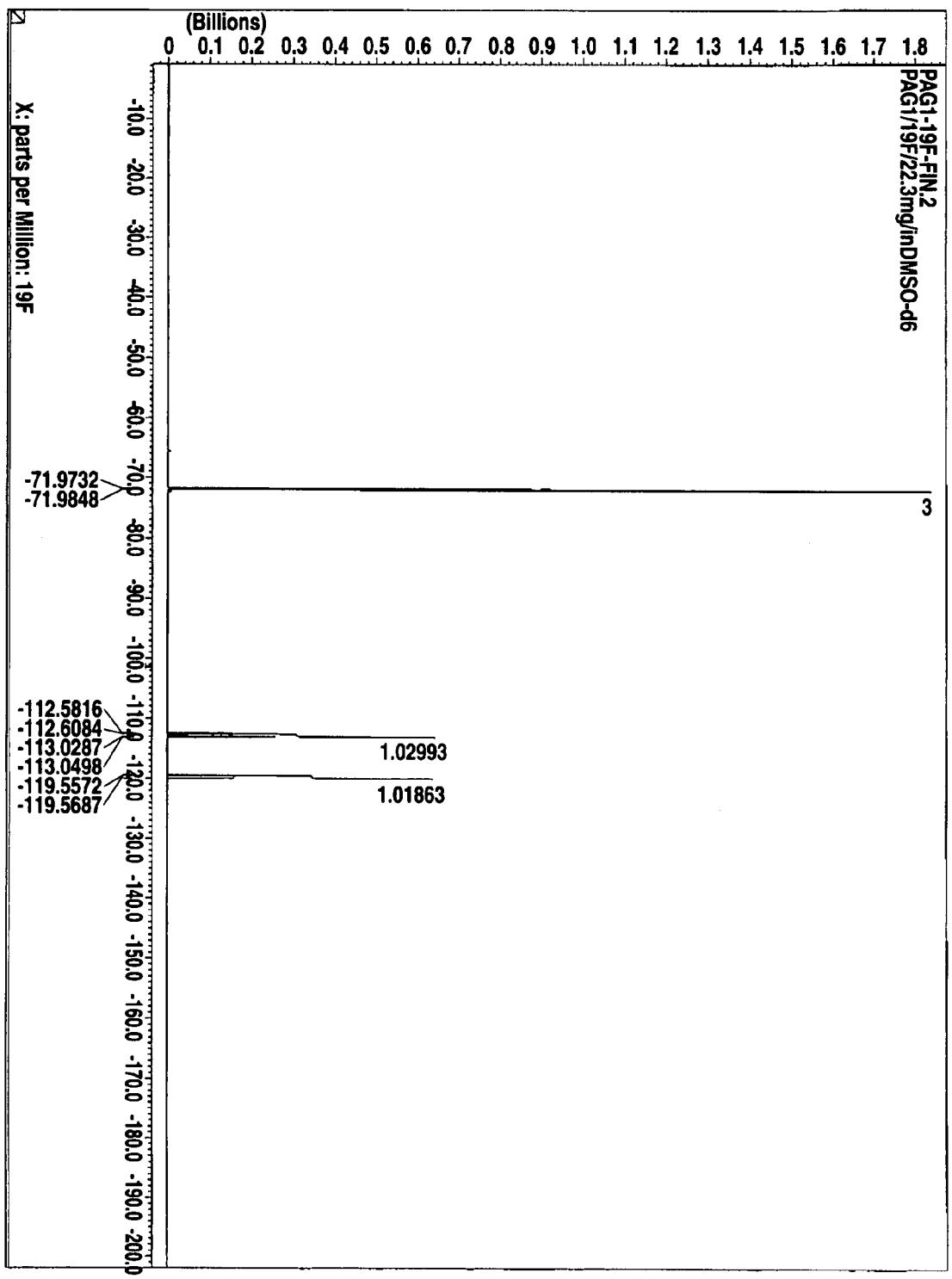
FIG. 4 is a diagram of $^{19}$F-NMR/DMSO-d$_6$ of PAG1 in Synthesis Example 11.

The target compound was analyzed by spectroscopy, with the data shown below. The NMR spectra ($^1$H-NMR and $^{19}$F-NMR/DMSO-d$_6$) are shown in FIGS. 3 and 4.

IR spectra (KBr disc, cm$^{-1}$) 3085, 3064, 1739, 1600, 1477, 1448, 1375, 1328, 1215, 1192, 1167, 1109, 1072, 1043, 1022, 995, 939, 904, 840, 802, 754, 746, 713, 684, 640, 621, 574, 552, 503

TOFMS (MALDI) POSITIVE M$^+$263 (corresponding to (C$_6$H$_5$)$_3$S$^+$) NEGATIVE M$^-$333 (corresponding to CF$_3$CH (OCOC$_6$H$_5$)CF$_2$SO$_3^-$)

Synthesis Example 12

Synthesis of triphenylsulfonium 1,1,3,3,3-pentafluoro-2-(4-phenylbenzoyloxy)propanesulfonate (PAG2)

The target compound was obtained by following the procedure of Synthesis Example 11 aside from using sodium 1,1,3,3,3-pentafluoro-2-(4-phenylbenzoyloxy)propane-1-sulfonate, obtained in Synthesis Example 10, instead of the sodium 1,1,3,3,3-pentafluoro-2-benzoyloxypropane-1-sulfonate used in Synthesis Example 11.

Figure 5:
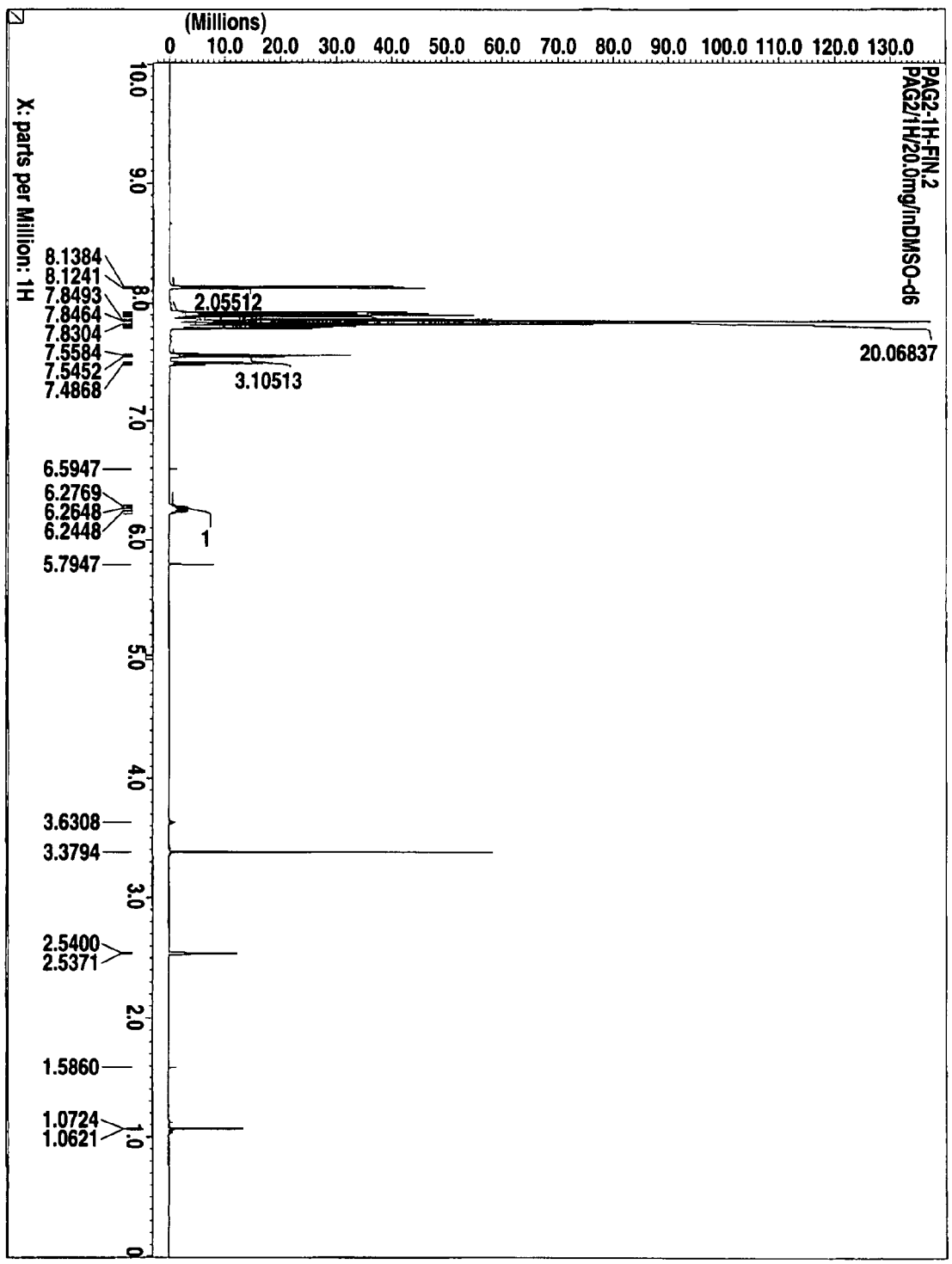
FIG. 5 is a diagram of $^1$H-NMR/DMSO-d$_6$ of PAG2 in Synthesis Example 12.
Figure 6:
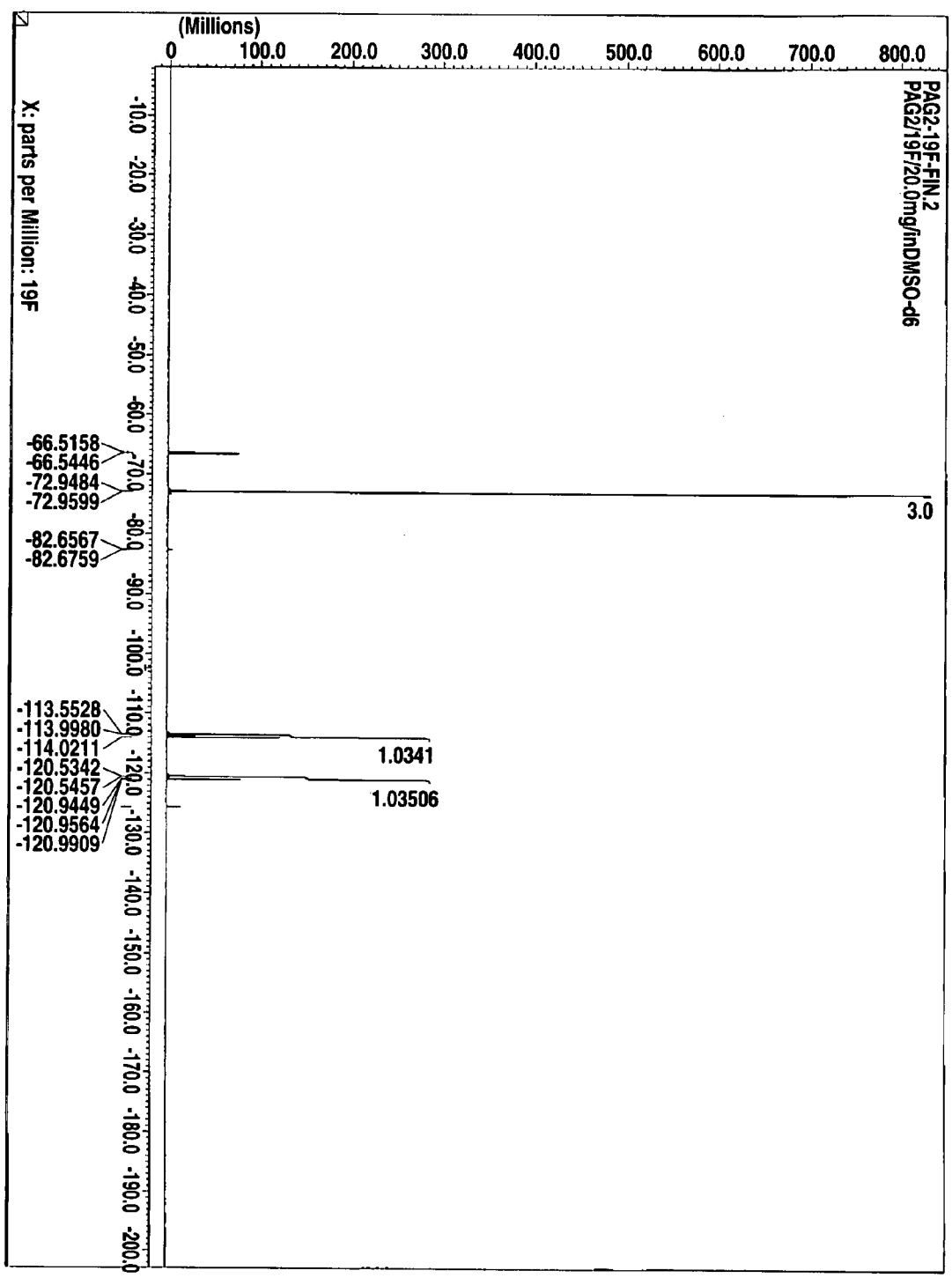
FIG. 6 is a diagram of $^{19}$F-NMR/DMSO-d$_6$ of PAG2 in Synthesis Example 12.

The target compound was analyzed by spectroscopy, with the data shown below. The NMR spectra ($^1$H-NMR and $^{19}$F-NMR/DMSO-d$_6$) are shown in FIGS. 5 and 6.

IR spectra (KBr disc, cm$^{-1}$) 3062, 1743, 1606, 1489, 1477, 1448, 1408, 1373, 1327, 1253, 1215, 1186, 1164, 1103, 1072, 1016, 1006, 995, 902, 858, 838, 781, 746, 700, 684, 640, 622, 574, 551, 536, 518, 501

TOFMS (MALDI) POSITIVE M$^+$263 (corresponding to (C$_6$H$_5$)$_3$S$^+$) NEGATIVE M$^-$409 (corresponding to CF$_3$CH (OCOC$_6$H$_4$C$_6$H$_5$) CF$_2$SO$_3^-$)

Synthesis Examples 13-26

Figure 7:
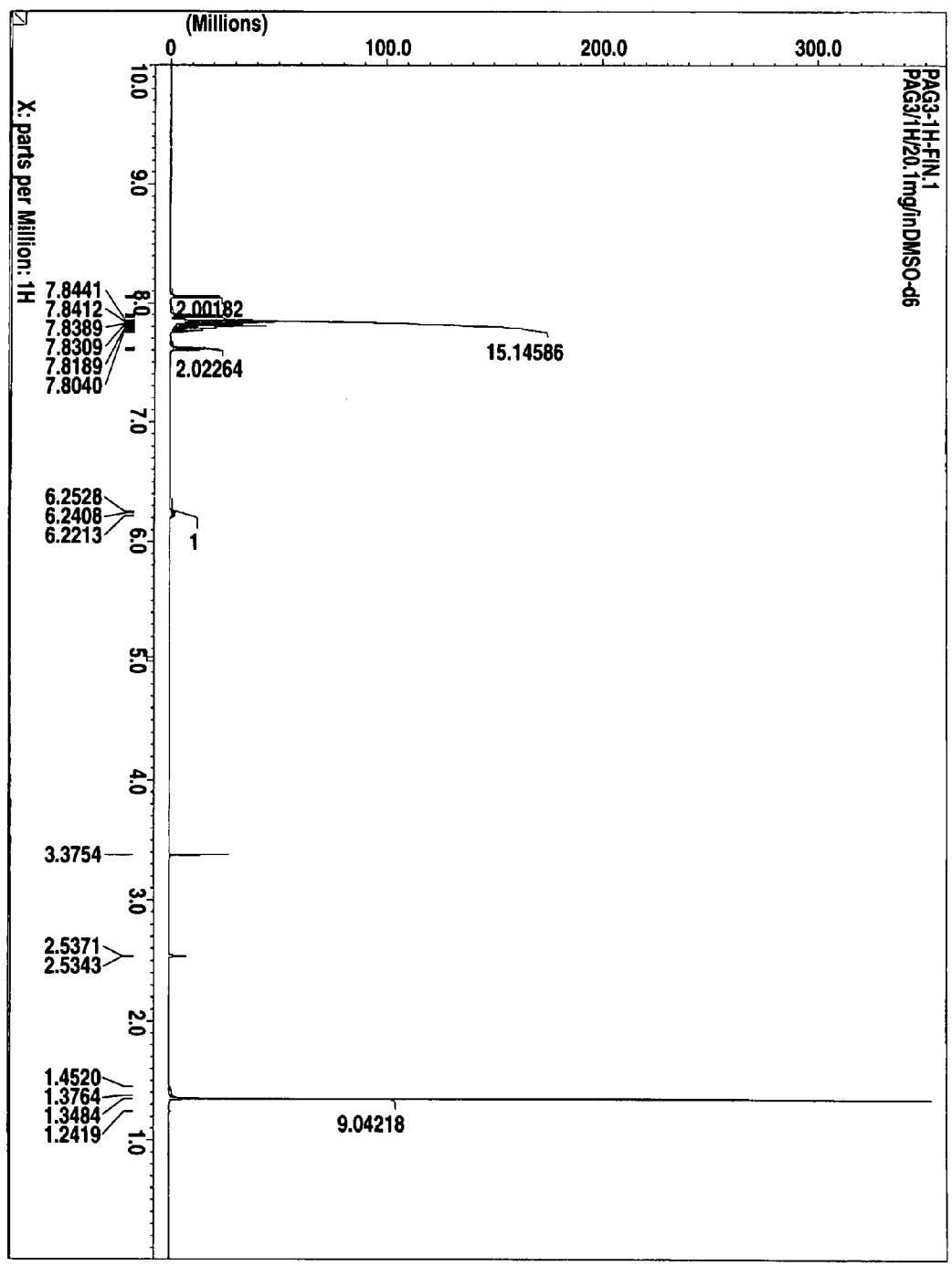
FIG. 7 is a diagram of $^1$H-NMR/DMSO-d$_6$ of PAG3 in Synthesis Example 13.
Figure 8:
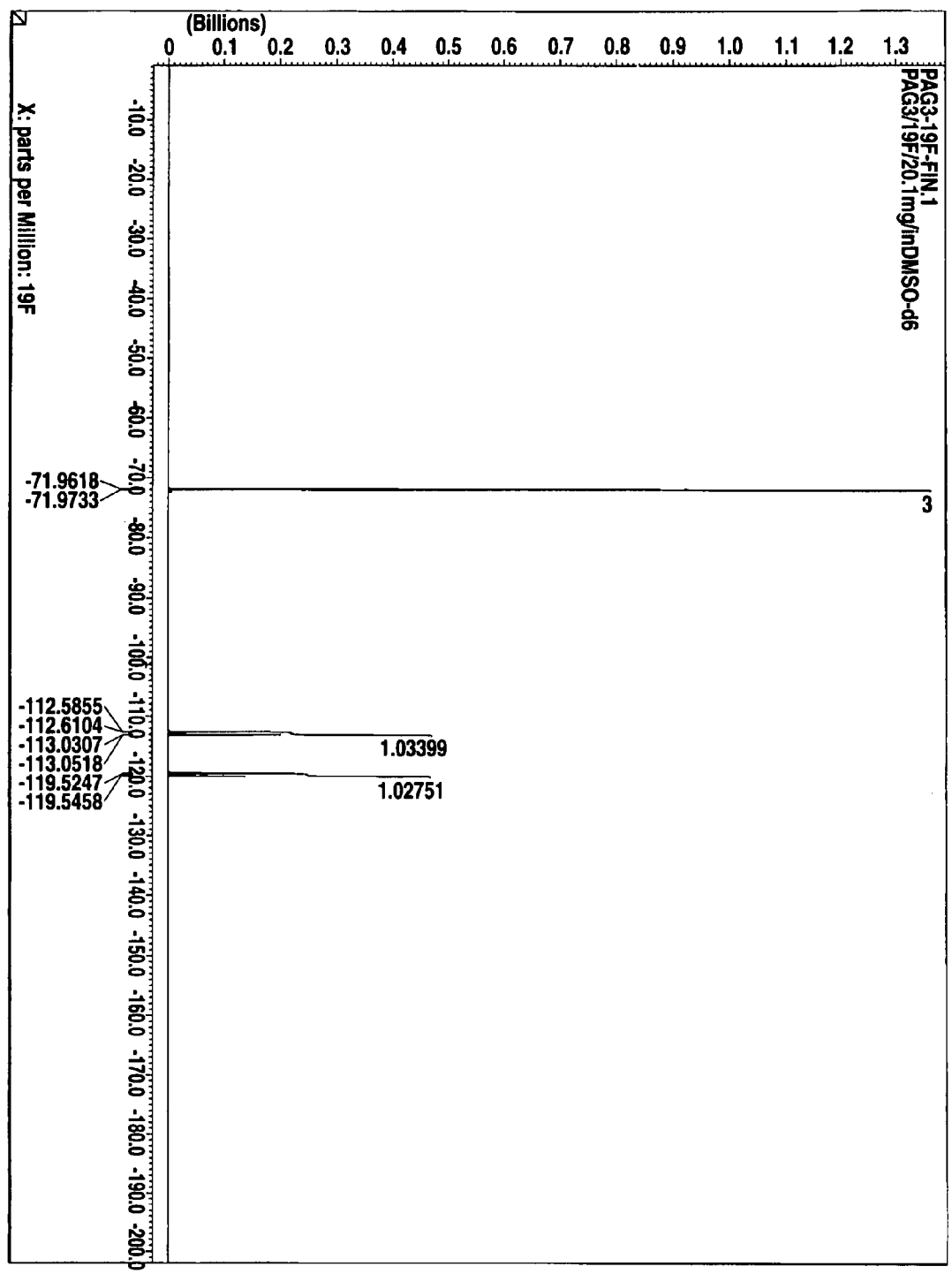
FIG. 8 is a diagram of $^{19}$F-NMR/DMSO-d$_6$ of PAG3 in Synthesis Example 13.
Figure 9:
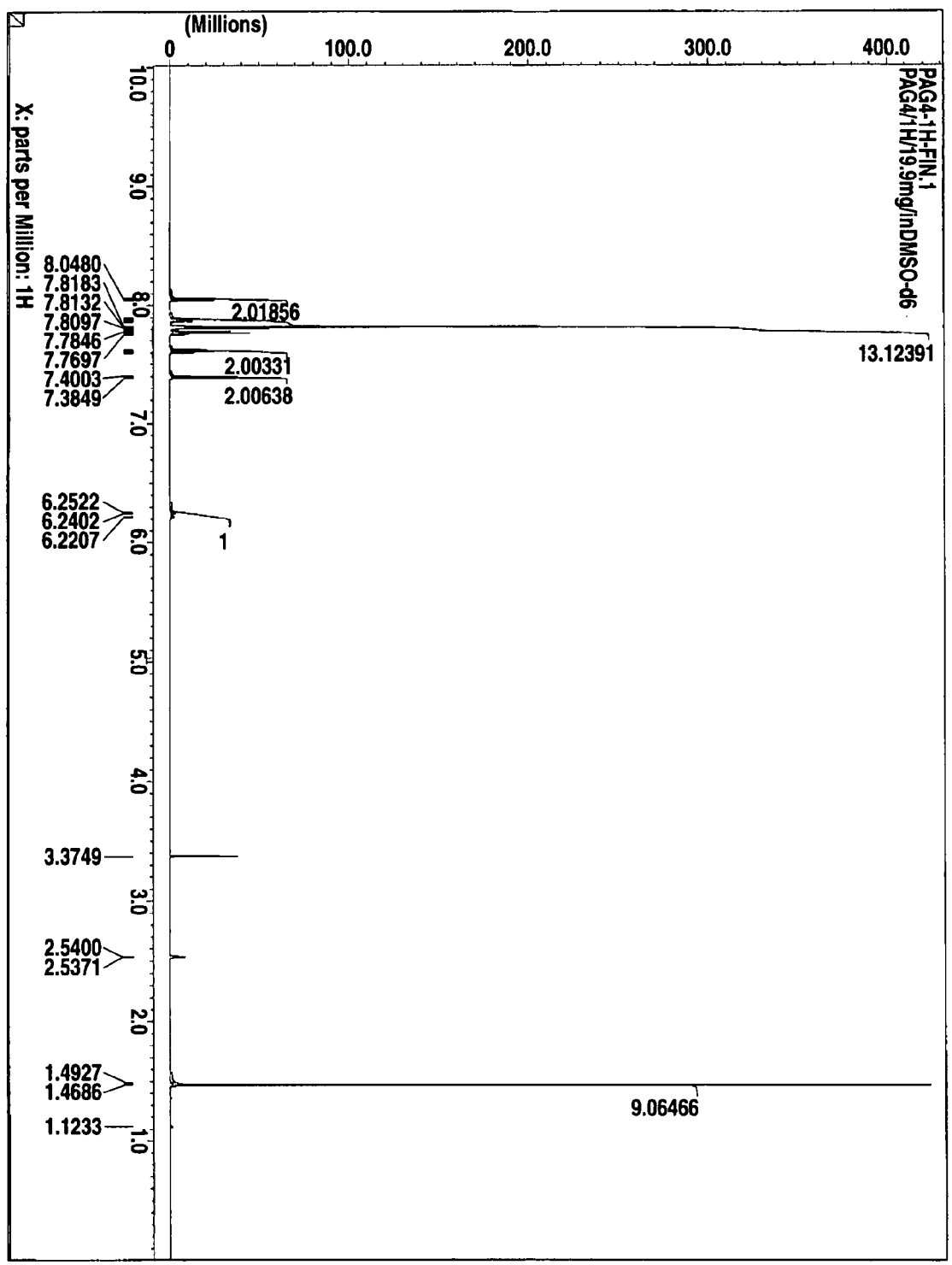
FIG. 9 is a diagram of $^1$H-NMR/DMSO-d$_6$ of PAG4 in Synthesis Example 14.
Figure 10:
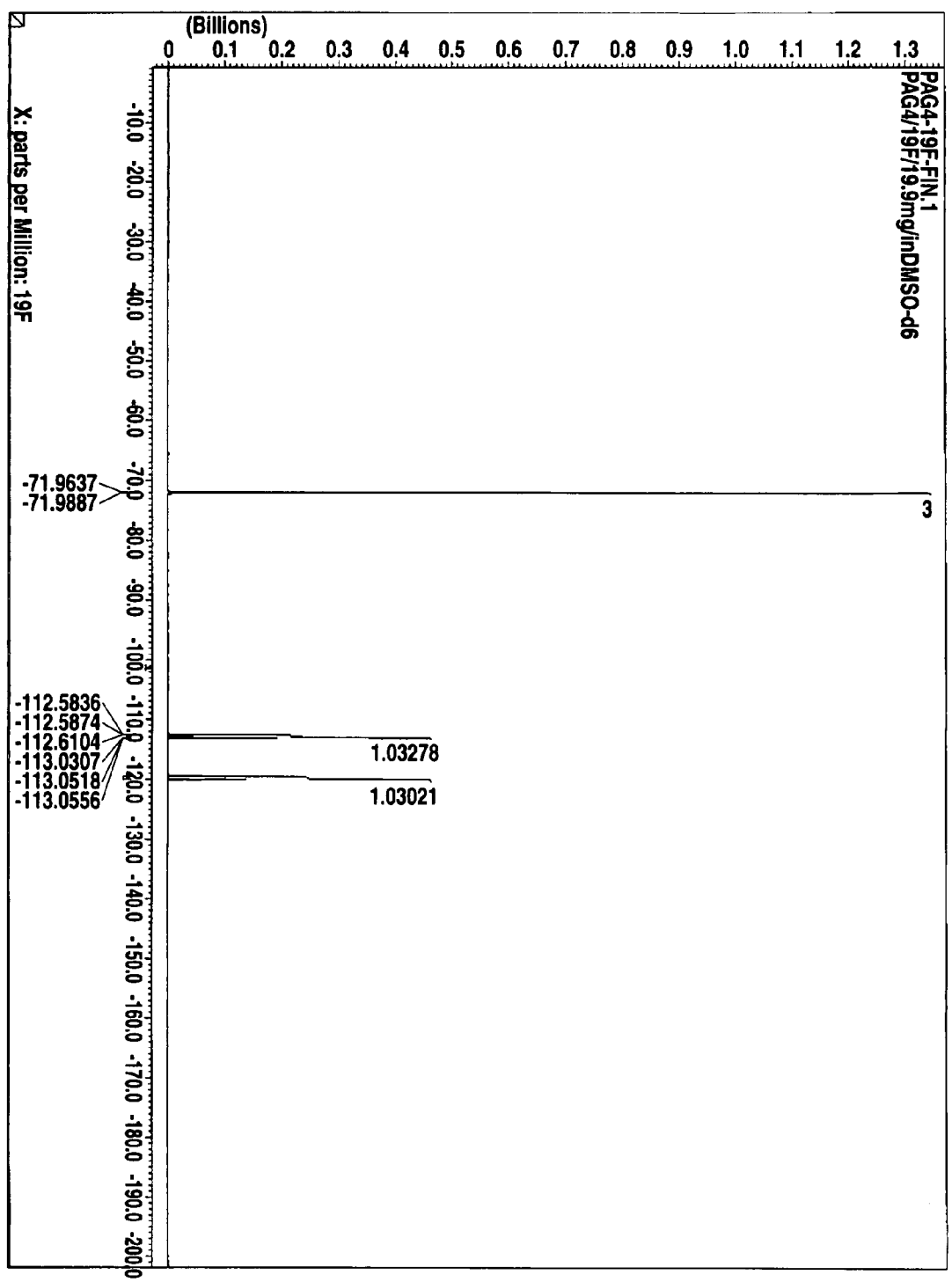
FIG. 10 is a diagram of $^{19}$F-NMR/DMSO-d$_6$ of PAG4 in Synthesis Example 14.

Target compounds were synthesized as in Synthesis Example 11 except that the onium salts prepared in Synthesis Examples 2 to 8 and the sulfonate salts prepared in Synthesis Examples 9 and 10 were used. The resulting onium salts PAG3 to PAG16 are shown below.
They were analyzed by spectroscopy. The NMR spectra ($^1$H-NMR and $^{19}$F-NMR/DMSO-$d_6$) of PAG3 are shown in FIGS. 7 and 8. The NMR spectra ($^1$H-NMR and $^{19}$F-NMR/DMSO-$d_6$) of PAG4 are shown in FIGS. 9 and 10.
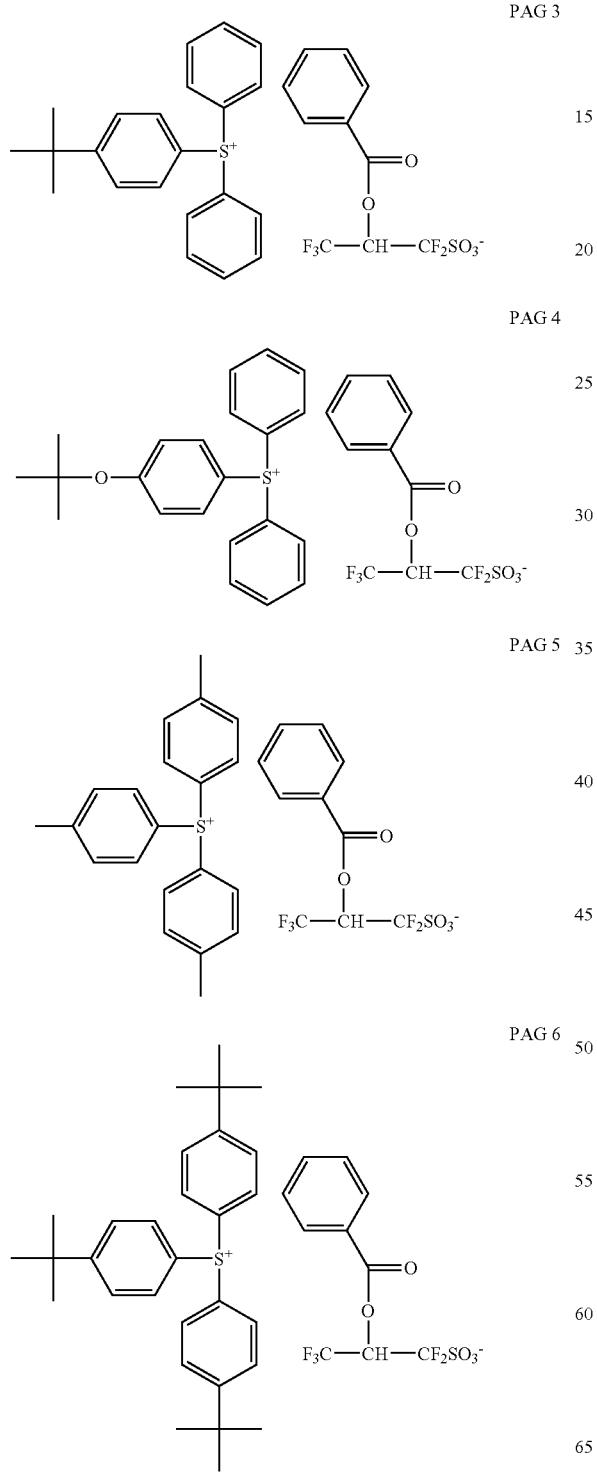
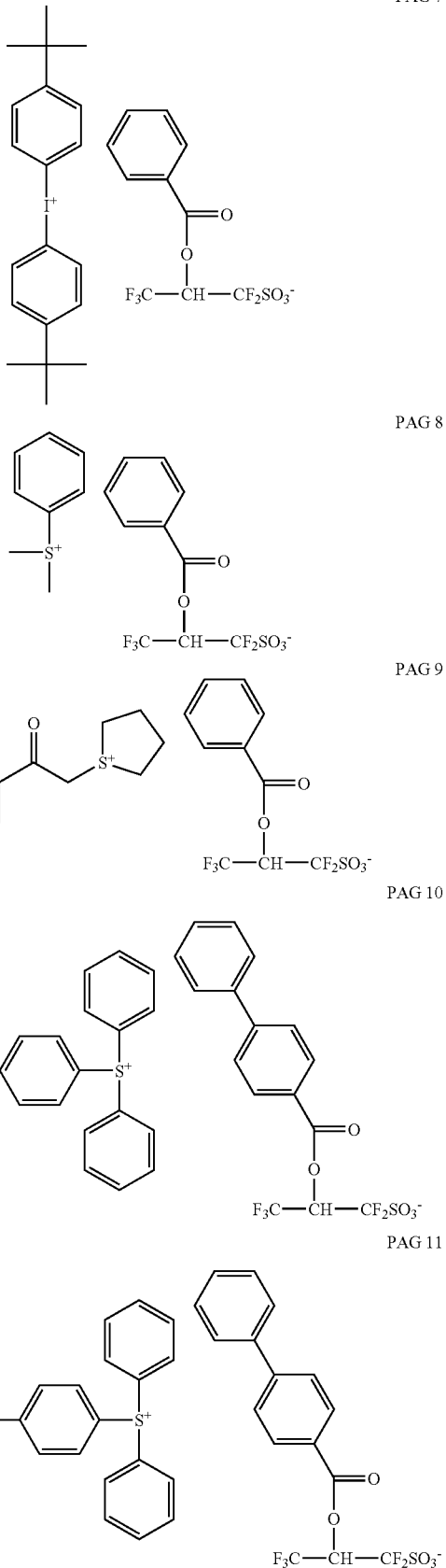

-continued

PAG 12

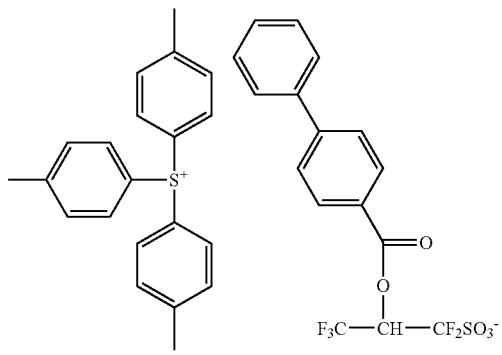

PAG 13

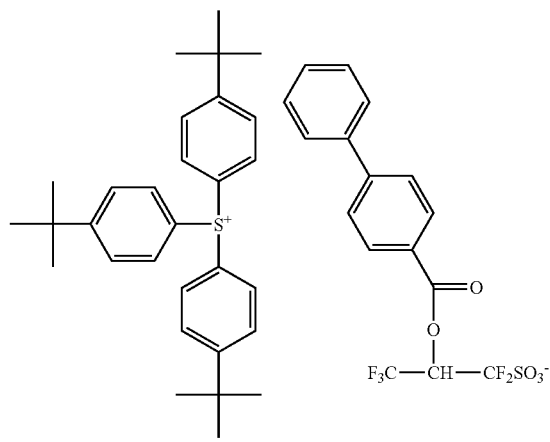

PAG 14

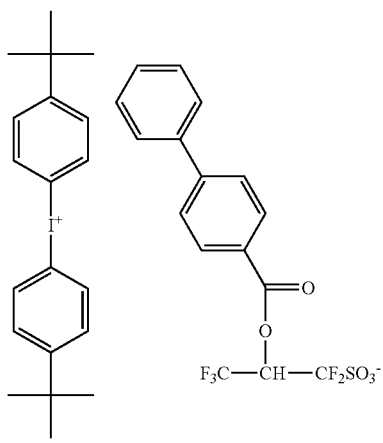

PAG 15

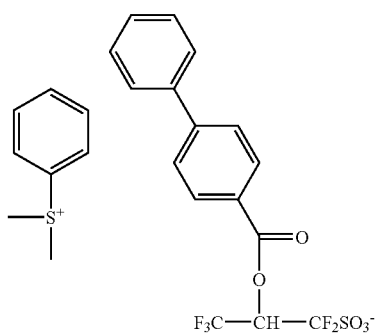

-continued

PAG 16

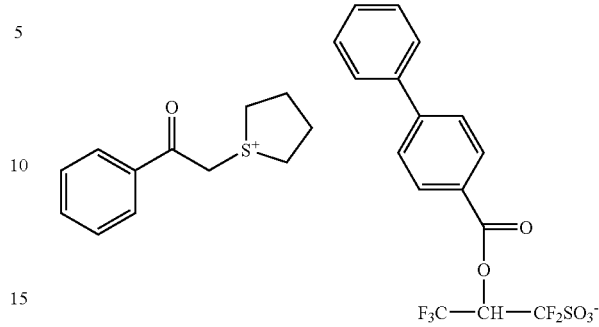

Synthesis Example 27

Synthesis of sodium 1,1,3,3,3-pentafluoro-2-(pivaloyloxy)-propanesulfonate (Anion 3)

The target sodium sulfonate was obtained by following the procedure of Synthesis Example 9 aside from using 1,1,3,3,3-pentafluoropropen-2-yl-pivaloate which had been synthesized by a conventional technique.

Figure 11:
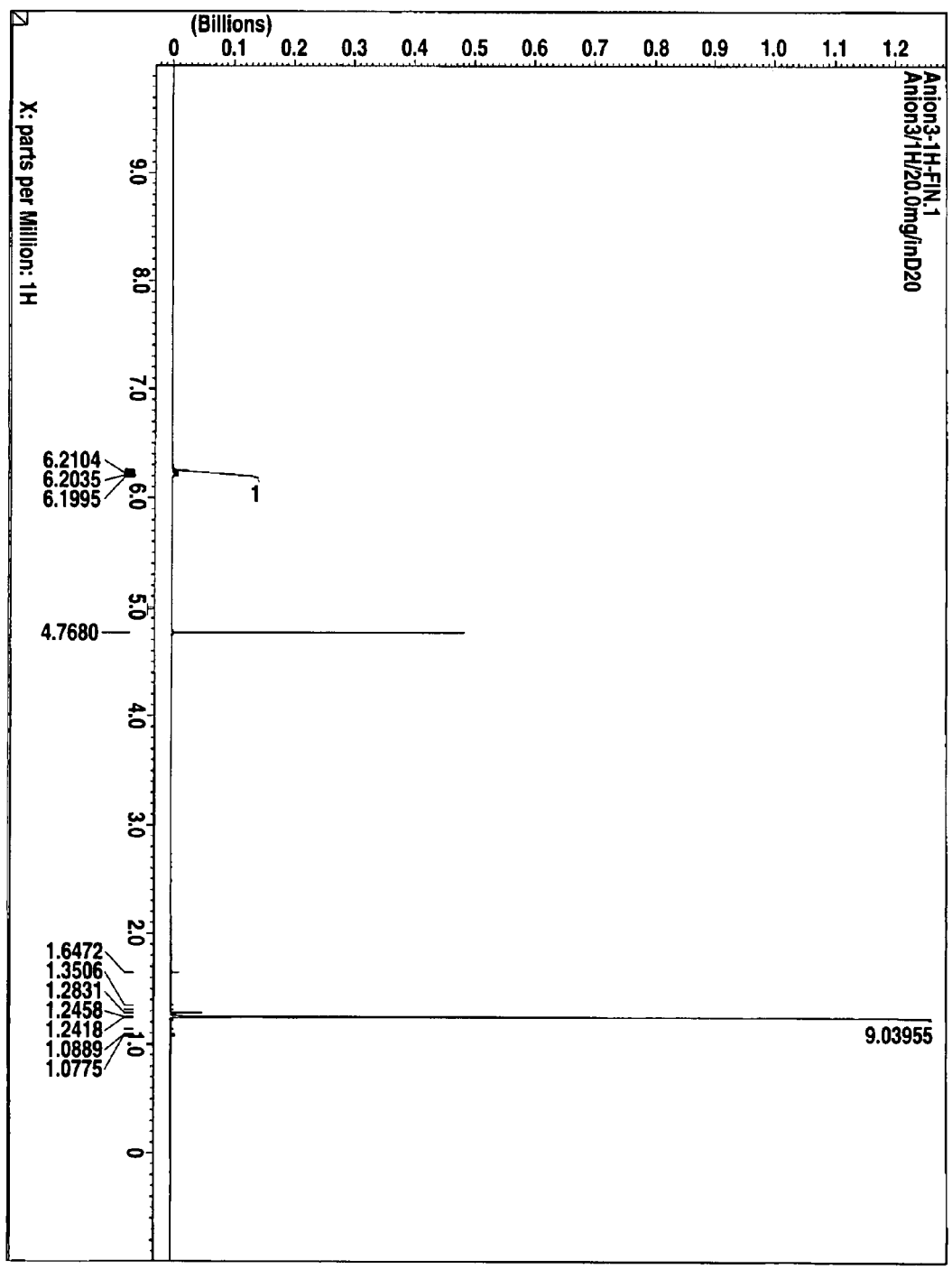
FIG. 11 is a diagram of $^1$H-NMR/D$_2$O of Anion 3 in Synthesis Example 27.
Figure 12:
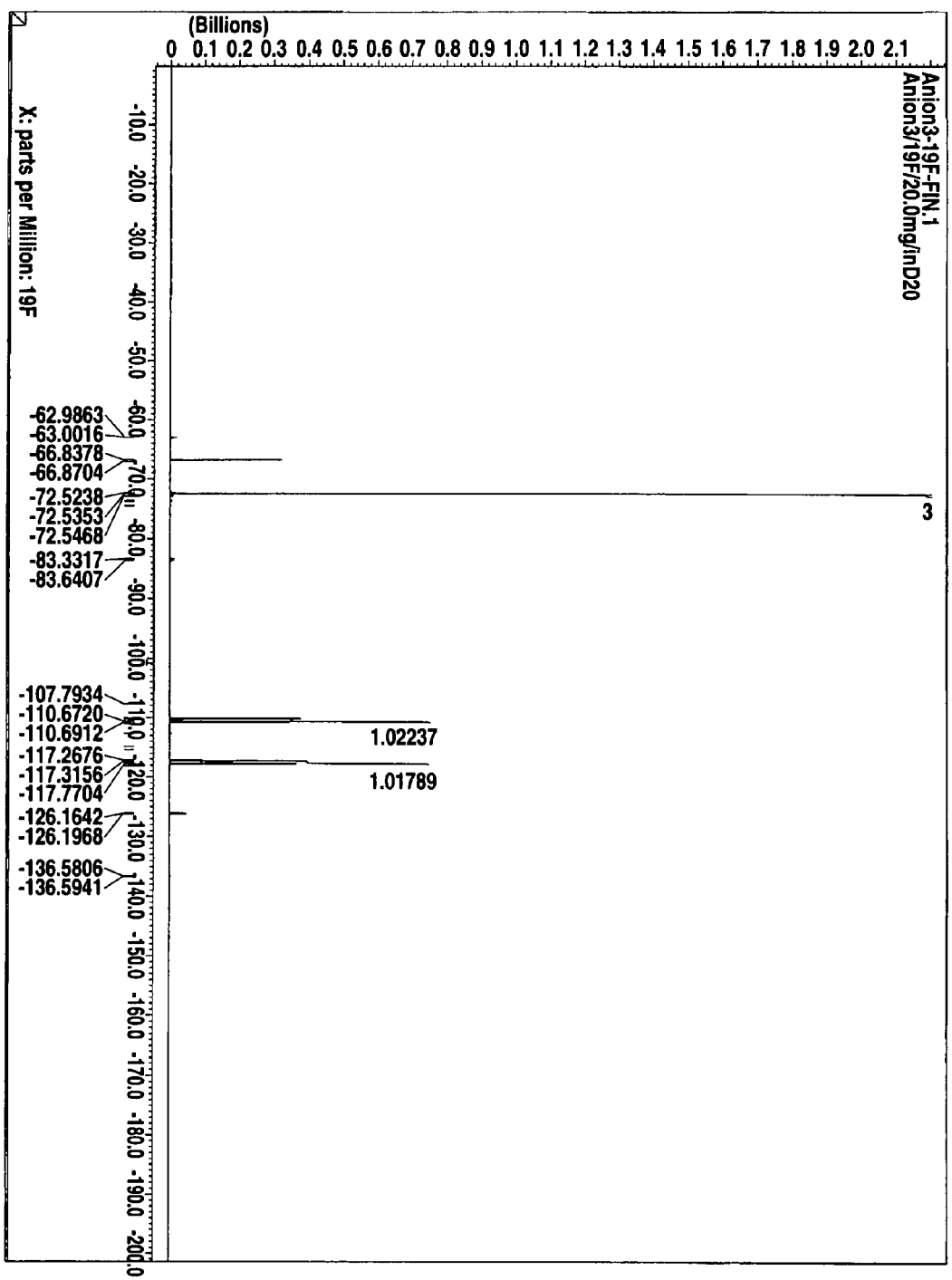
FIG. 12 is a diagram of $^{19}$F-NMR/D$_2$O of Anion 3 in Synthesis Example 27.

The target compound was analyzed by spectroscopy, with the data shown below. The NMR spectra ($^1$H-NMR and $^{19}$F-NMR/$D_2O$) are shown in FIGS. 11 and 12.

IR spectra (KBr disc, cm$^{-1}$) 1749, 1367, 1338, 1297, 1268, 1241, 1203, 1168, 1135, 1085, 998, 921, 838, 647, 628, 572

TOFMS (MALDI) NEGATIVE M$^-$313 (corresponding to $CF_3CH(OCOC_4H_9)CF_2SO_3^-$)

Synthesis Example 28

Synthesis of sodium 1,1,3,3,3-pentafluoro-2-(cyclohexane-carbonyloxy)propanesulfonate (Anion 4)

The target sodium sulfonate was obtained by following the procedure of Synthesis Example 9 aside from using 1,1,3,3,3-pentafluoropropen-2-yl-cyclohexanecarboxylate which had been synthesized by a conventional technique.

Figure 13:
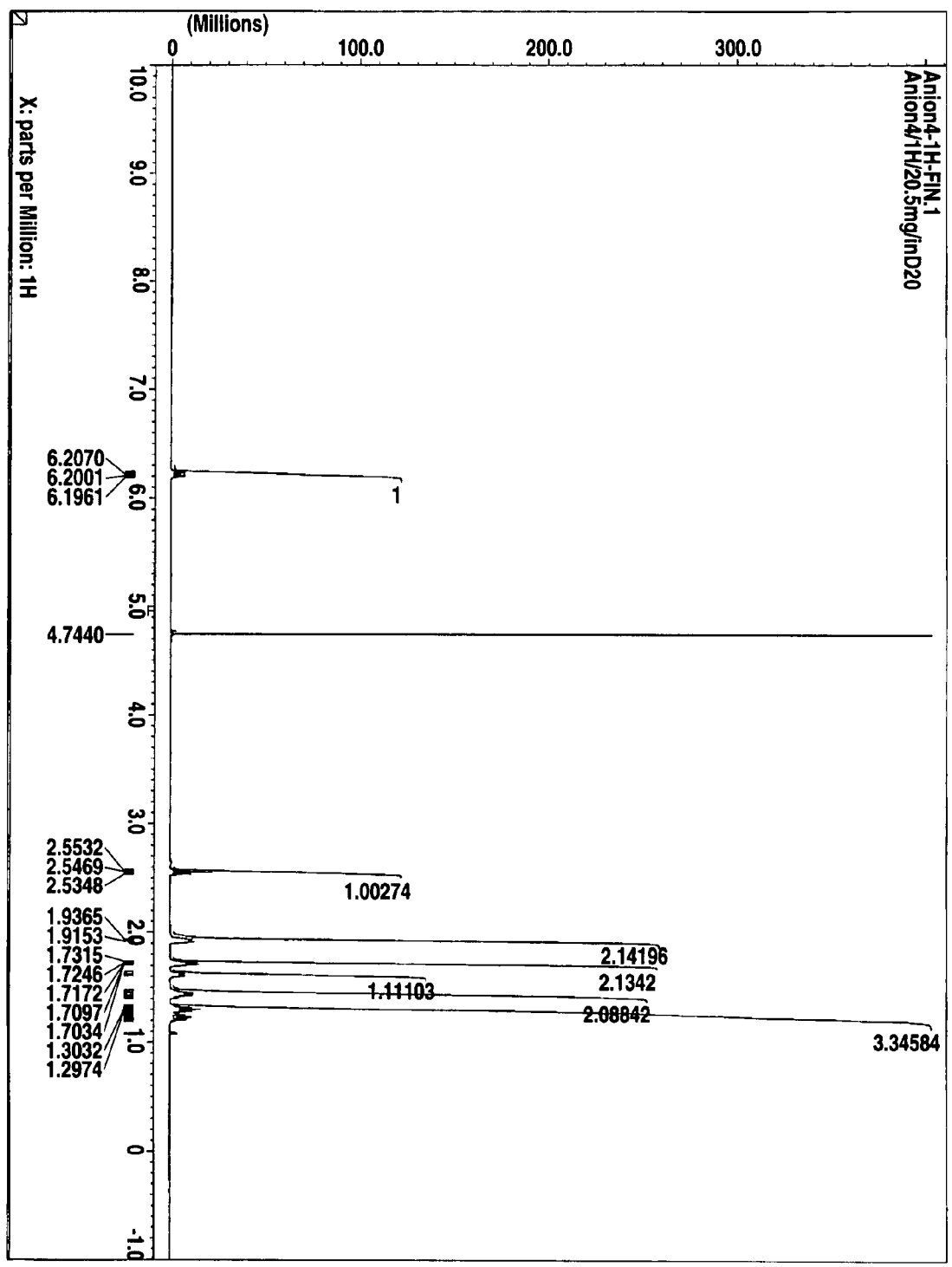
FIG. 13 is a diagram of $^1$H-NMR/D$_2$O of Anion 4 in Synthesis Example 28.
Figure 14:
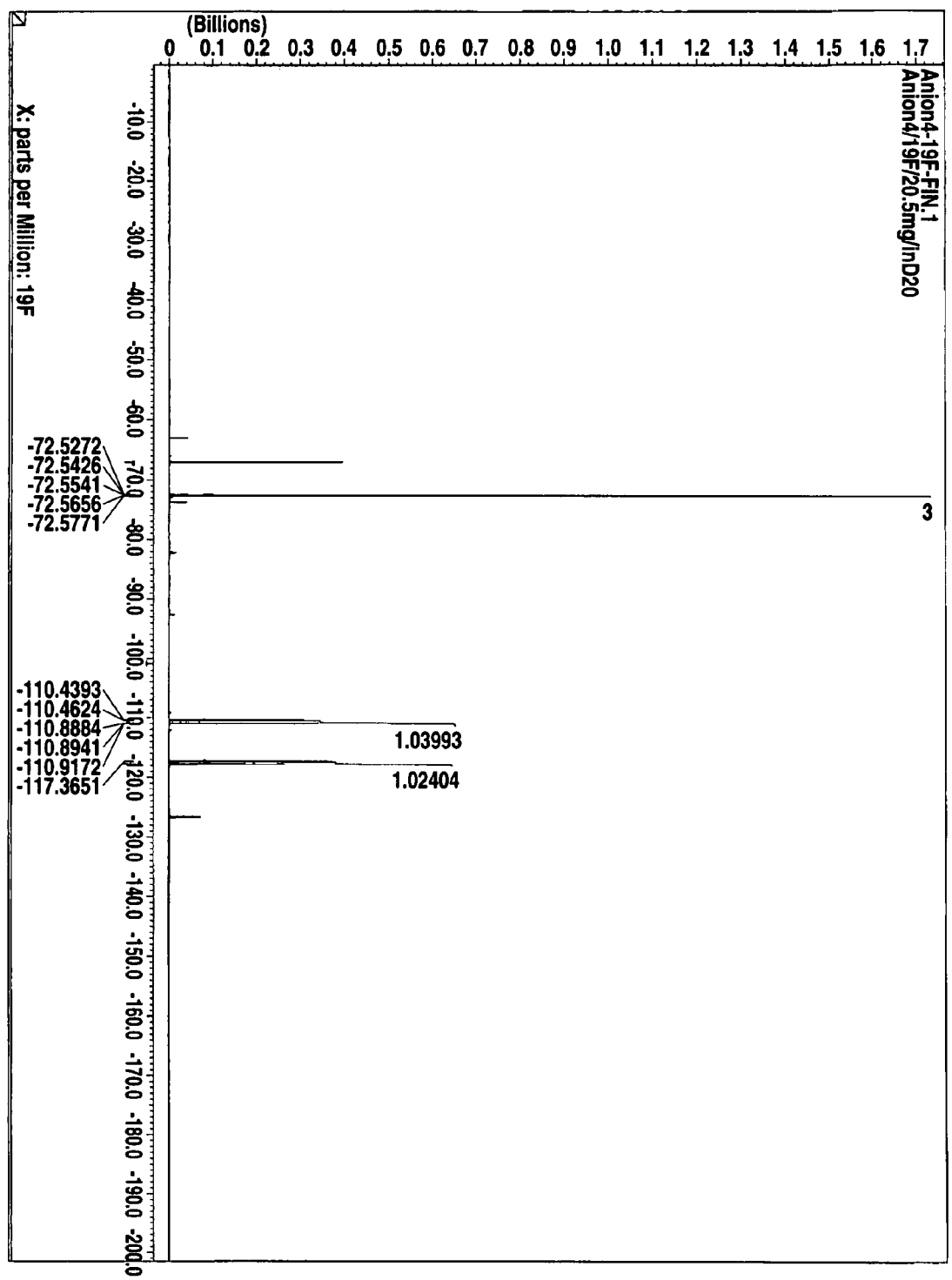
FIG. 14 is a diagram of $^{19}$F-NMR/D$_2$O of Anion 4 in Synthesis Example 28.

The target compound was analyzed by spectroscopy, with the data shown below. The NMR spectra ($^1$H-NMR and $^{19}$F-NMR/$D_2O$) are shown in FIGS. 13 and 14.

IR spectra (KBr disc, cm$^{-1}$) 1749, 1375, 1342, 1286, 1270, 1245, 1222, 1199, 1172, 1159, 1133, 1083, 1070, 1008, 1000, 943, 833, 647

TOFMS (MALDI) NEGATIVE M$^-$339 (corresponding to $CF_3CH(OCOC_6H_{11})CF_2SO_3^-$)

Synthesis Example 29

Synthesis of sodium 1,1,3,3,3-pentafluoro-2-(2-furoyloxy)-propanesulfonate (Anion 5)

The target sodium sulfonate was obtained by following the procedure of Synthesis Example 9 aside from using 1,1,3,3,3-pentafluoropropen-2-yl-furanyl-2-carboxylate which had been synthesized by a conventional technique.

Figure 15:
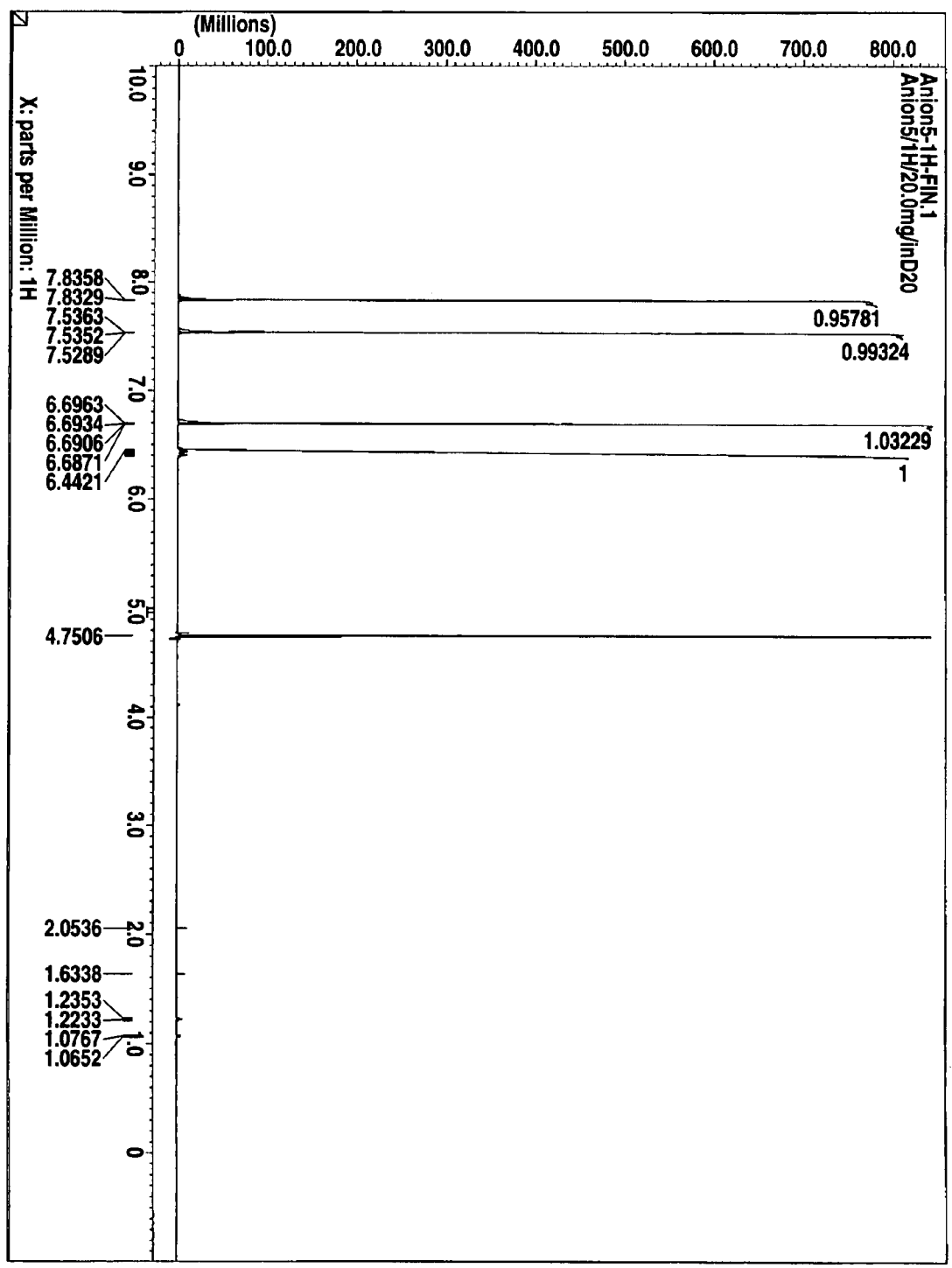
FIG. 15 is a diagram of $^1$H-NMR/D$_2$O of Anion 5 in Synthesis Example 29.
Figure 16:
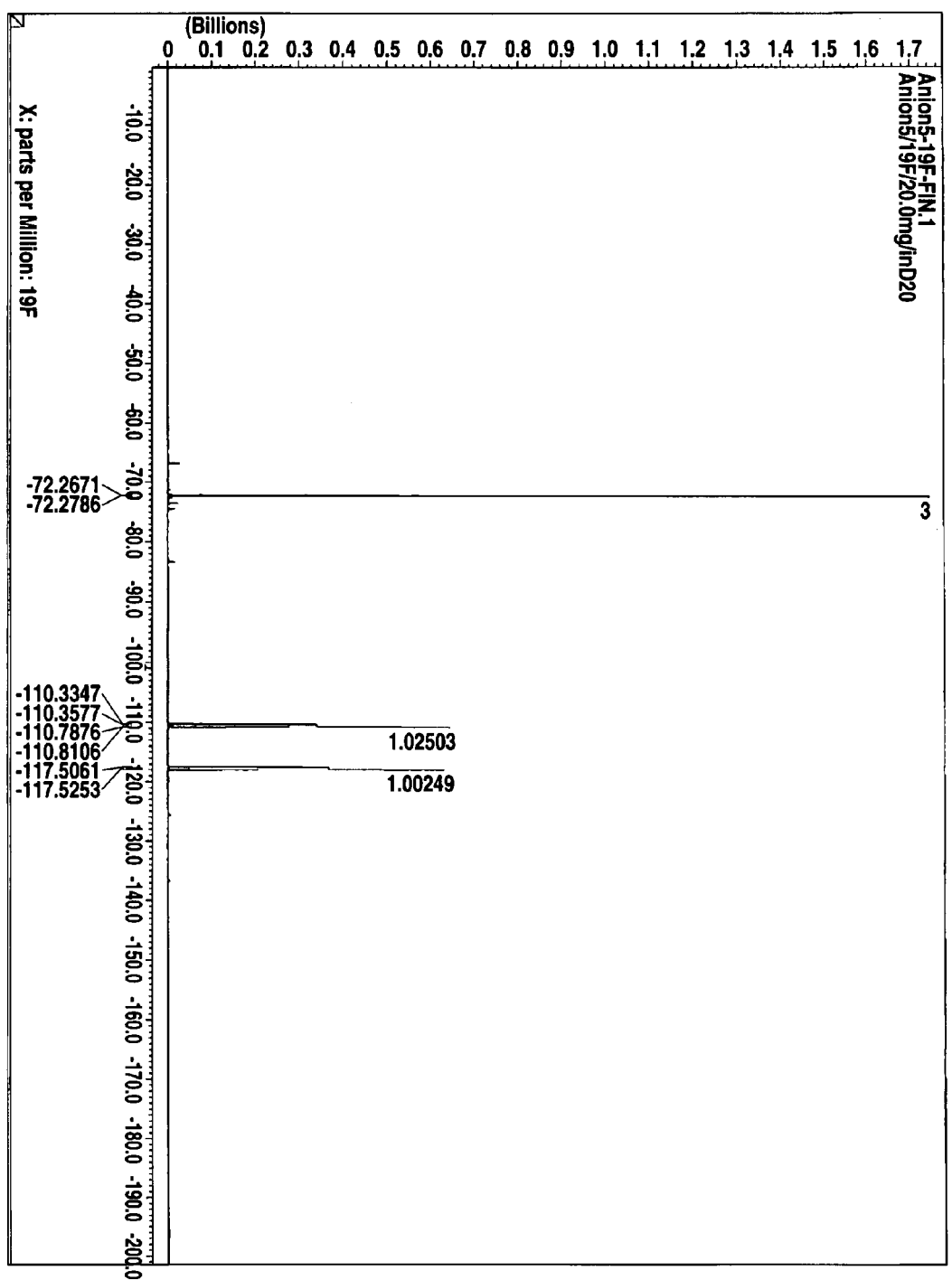
FIG. 16 is a diagram of $^{19}$F-NMR/D$_2$O of Anion 5 in Synthesis Example 29.

The target compound was analyzed by spectroscopy, with the data shown below. The NMR spectra ($^1$H-NMR and $^{19}$F-NMR/$D_2O$) are shown in FIGS. 15 and 16.

IR spectra (KBr disc, cm$^{-1}$) 1743, 1720, 1575, 1471, 1400, 1367, 1346, 1321, 1305, 1272, 1243, 1197, 1168, 1130, 1083, 1016, 1006, 933, 892, 779, 750, 651

TOFMS (MALDI) NEGATIVE M$^-$323 (corresponding to CF$_3$CH(OCOC$_4$H$_3$O)CF$_2$SO$_3{}^-$)

Synthesis Example 30

Synthesis of sodium 1,1,3,3,3-pentafluoro-2-(2-naphthoyl-oxy)propanesulfonate (Anion 6)

The target sodium sulfonate was obtained by following the procedure of Synthesis Example 9 aside from using 1,1,3,3,3-pentafluoropropen-2-yl-naphthalene-2-carboxylate which had been synthesized by a conventional technique.

Figure 17:
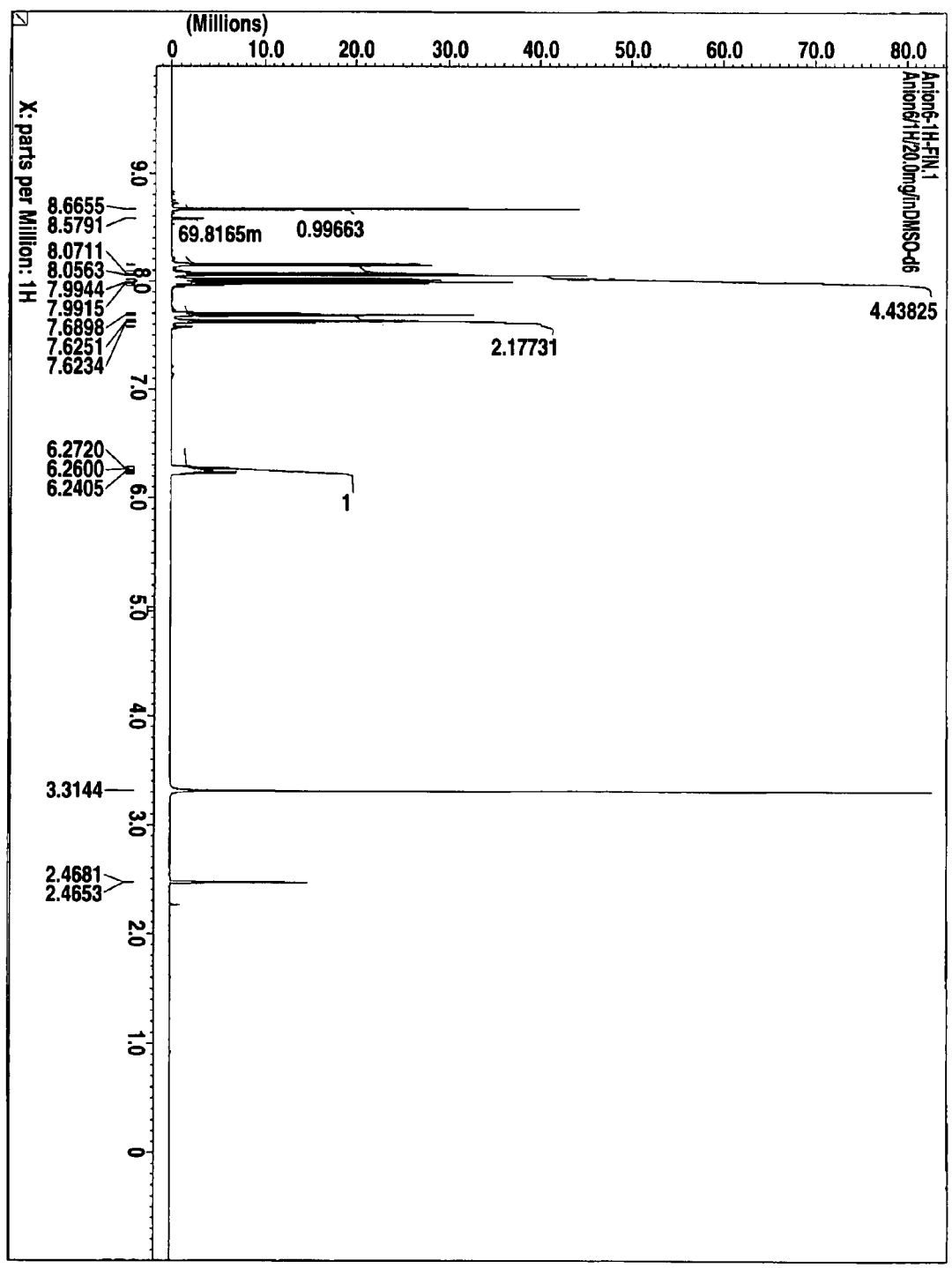
FIG. 17 is a diagram of $^1$H-NMR/DMSO-d$_6$ of Anion 6 in Synthesis Example 30.
Figure 18:
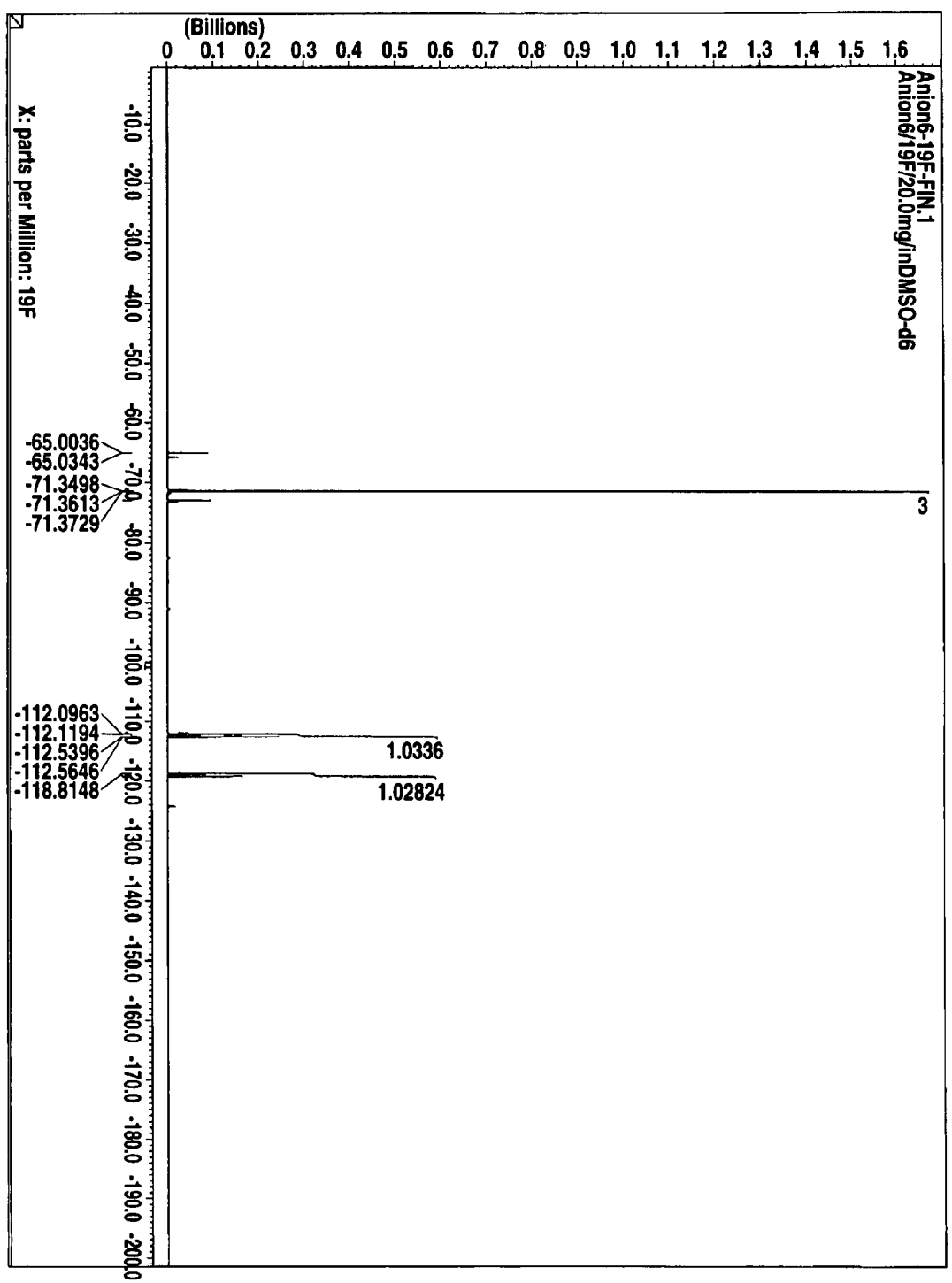
FIG. 18 is a diagram of $^{19}$F-NMR/DMSO-d$_6$ of Anion 6 in Synthesis Example 30.

The target compound was analyzed by spectroscopy, with the data shown below. The NMR spectra ($^1$H-NMR and $^{19}$F-NMR/DMSO-d$_6$) are shown in FIGS. 17 and 18.

IR spectra (KBr disc, cm$^{-1}$) 1745, 1365, 1344, 1288, 1261, 1238, 1195, 1164, 1130, 1105, 773, 759, 649

TOFMS (MALDI) NEGATIVE M$^-$389 (corresponding to CF$_3$CH(OCOC$_{10}$H$_{15}$)CF$_2$SO$_3{}^-$)

Synthesis Example 31

Synthesis of sodium 1,1,3,3,3-pentafluoro-2-(4-tert-butyl-benzoyloxy)propanesulfonate (Anion 7)

The target sodium sulfonate was obtained by following the procedure of Synthesis Example 9 aside from using 1,1,3,3,3-pentafluoropropen-2-yl-(4-tert-butyl)benzoate which had been synthesized by a conventional technique.

Figure 19:
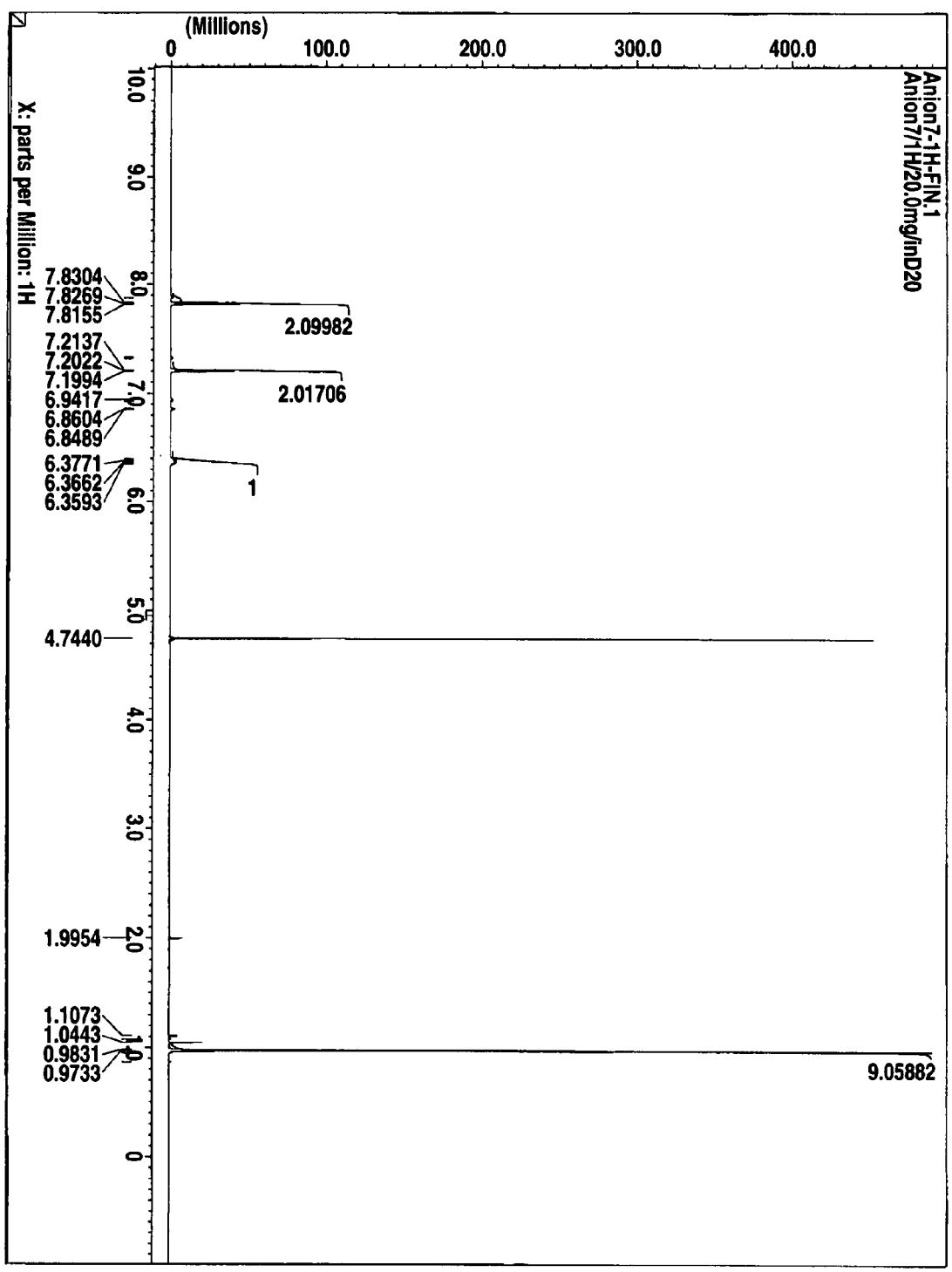
FIG. 19 is a diagram of $^1$H-NMR/D$_2$O of Anion 7 in Synthesis Example 31.
Figure 20:
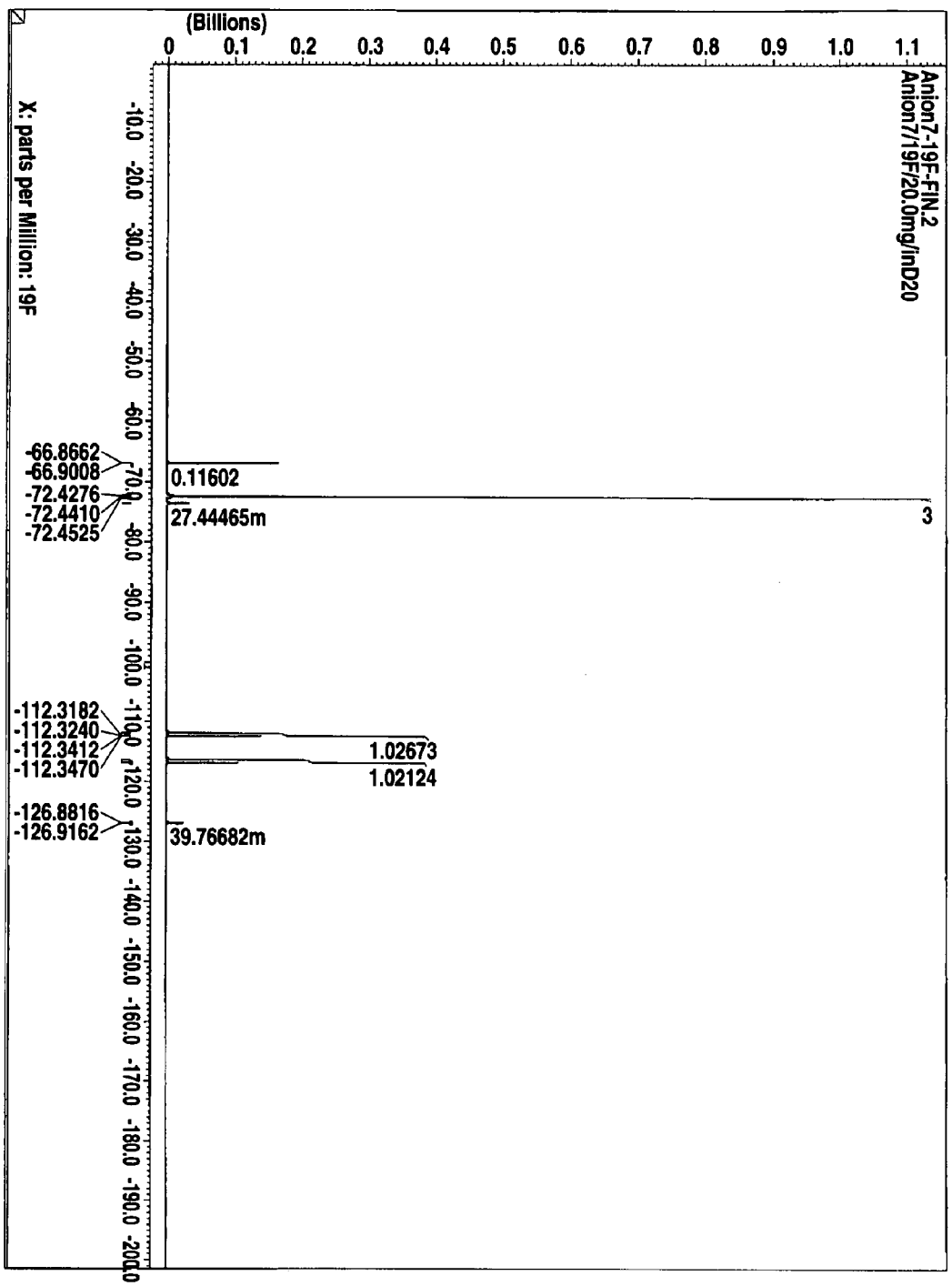
FIG. 20 is a diagram of $^{19}$F-NMR/D$_2$O of Anion 7 in Synthesis Example 31.
Figure 21:
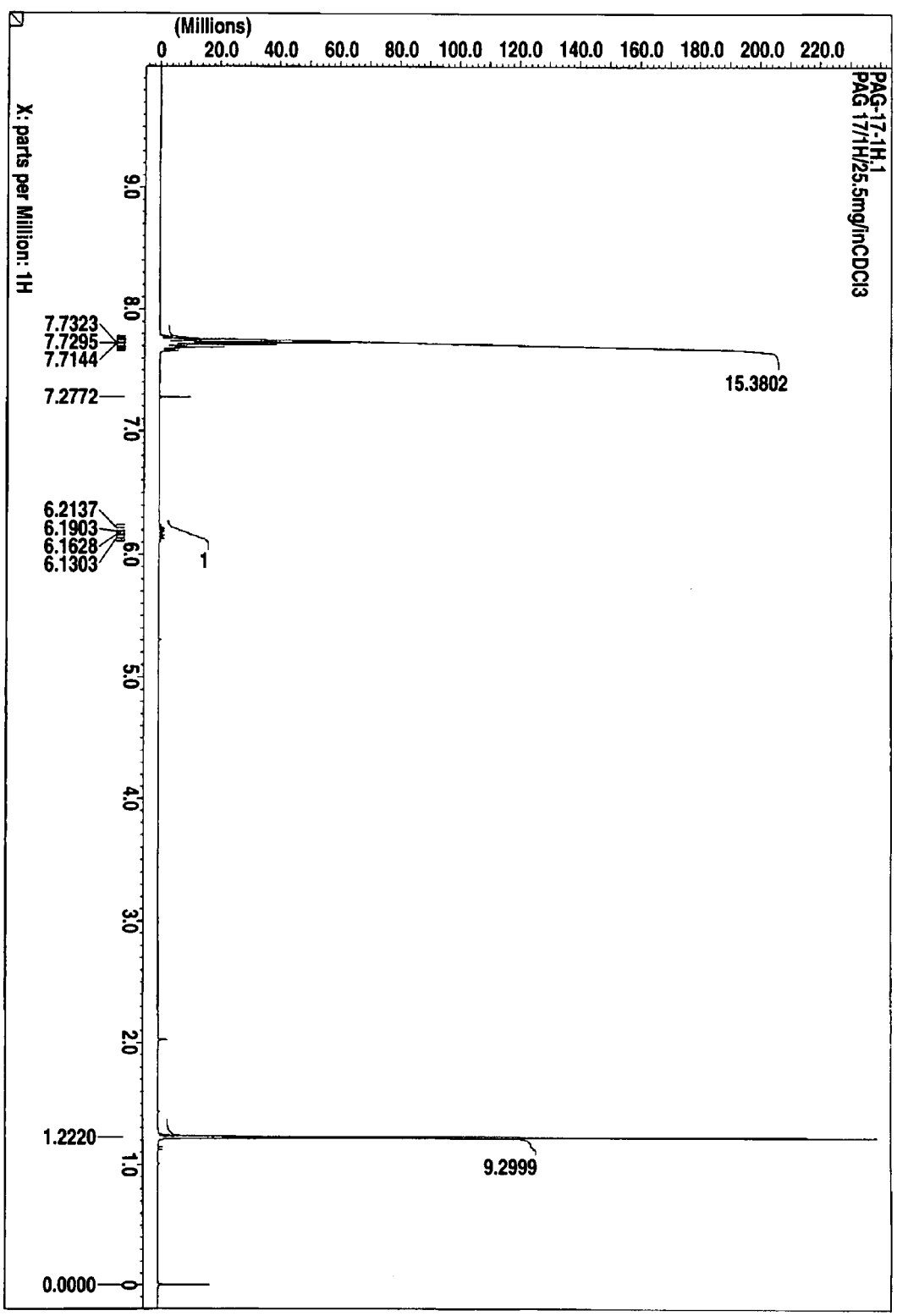
FIG. 21 is a diagram of $^1$H-NMR/CDCl$_3$ of PAG17 in Synthesis Example 33.
Figure 22:
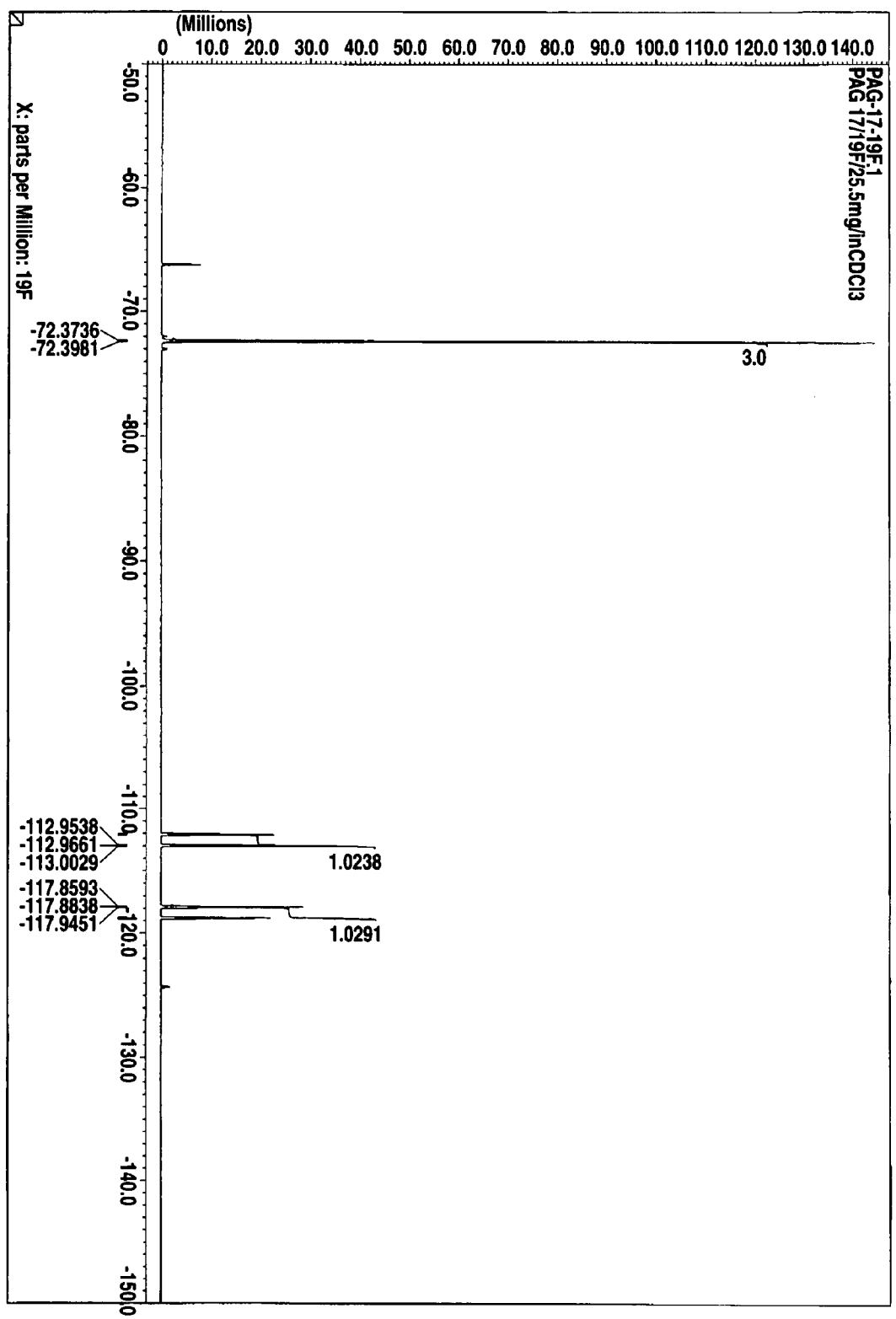
FIG. 22 is a diagram of $^{19}$F-NMR/CDCl$_3$ of PAG17 in Synthesis Example 33.
Figure 23:
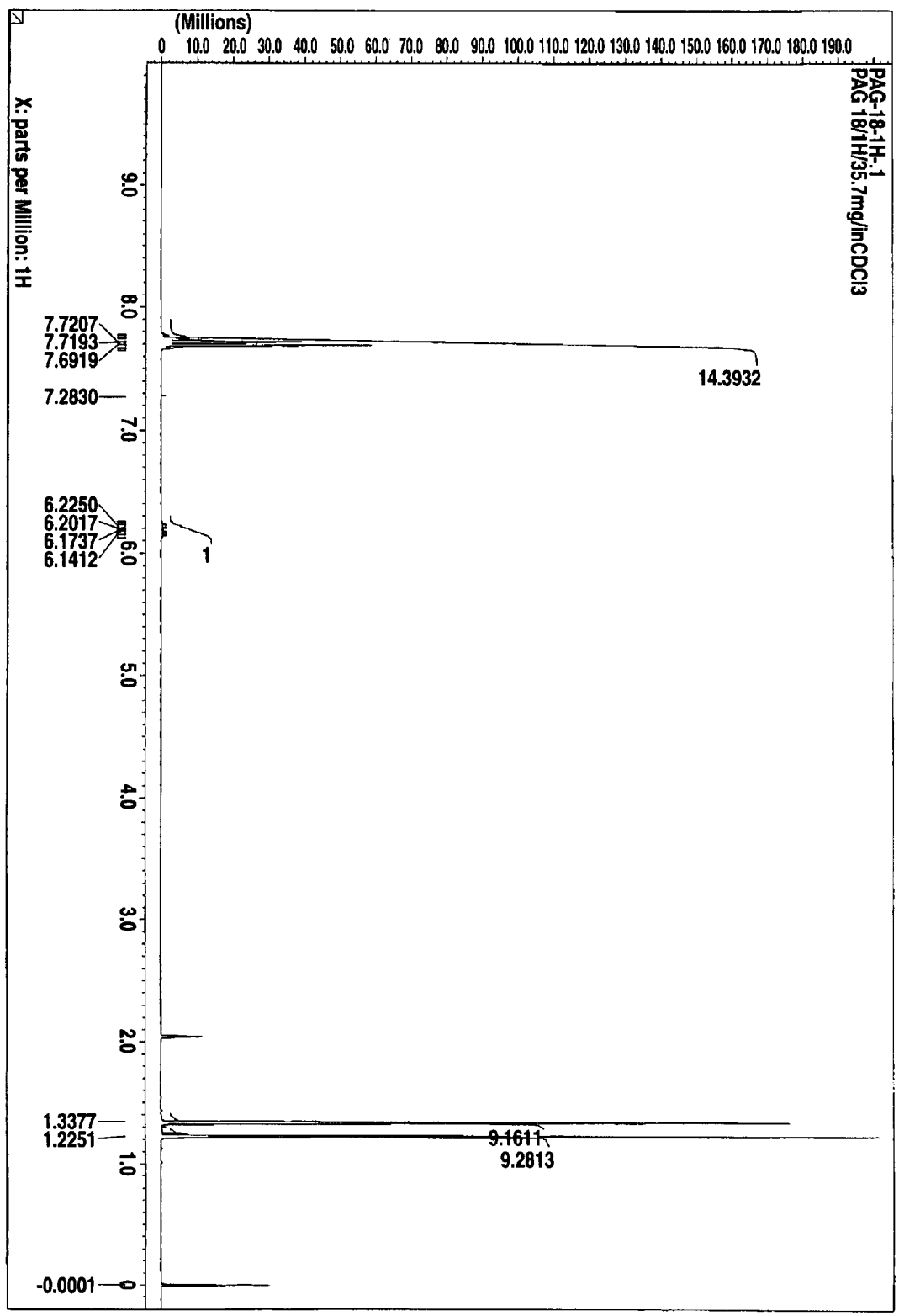
FIG. 23 is a diagram of $^1$H-NMR/CDCl$_3$ of PAG18 in Synthesis Example 34.
Figure 24:
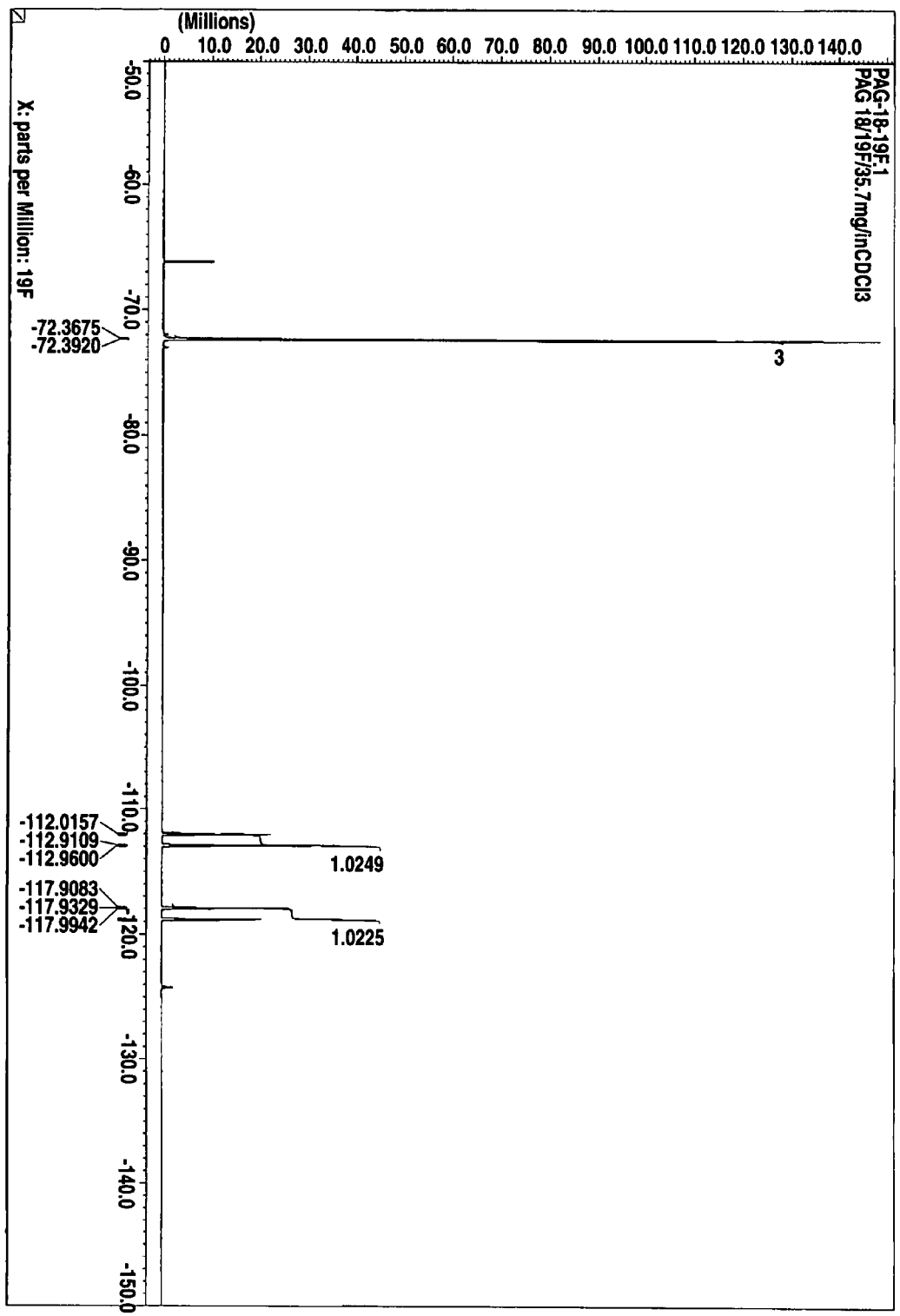
FIG. 24 is a diagram of $^{19}$F-NMR/CDCl$_3$ of PAG18 in Synthesis Example 34.
Figure 25:
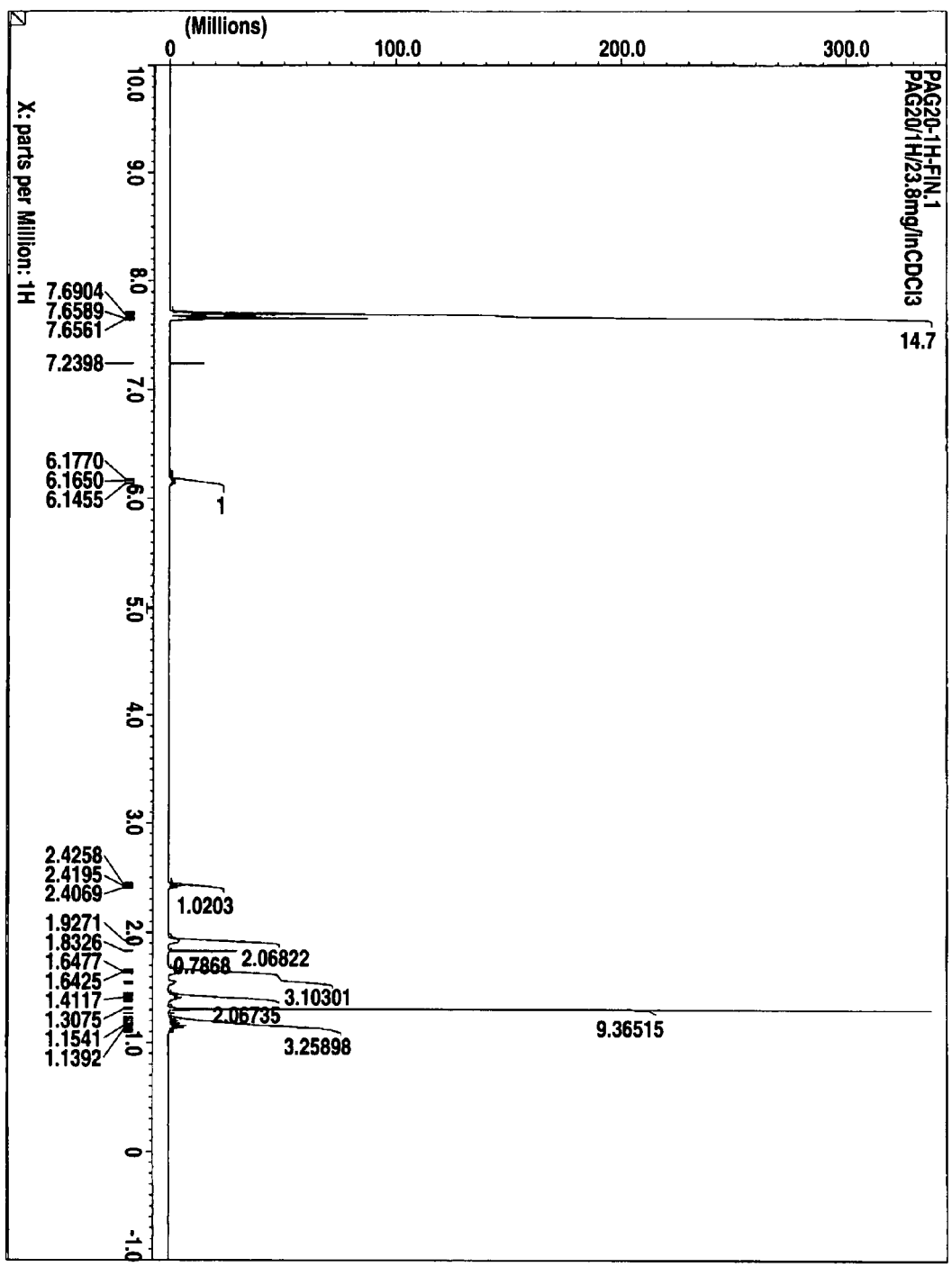
FIG. 25 is a diagram of $^1$H-NMR/CDCl$_3$ of PAG20 in Synthesis Example 36.
Figure 26:
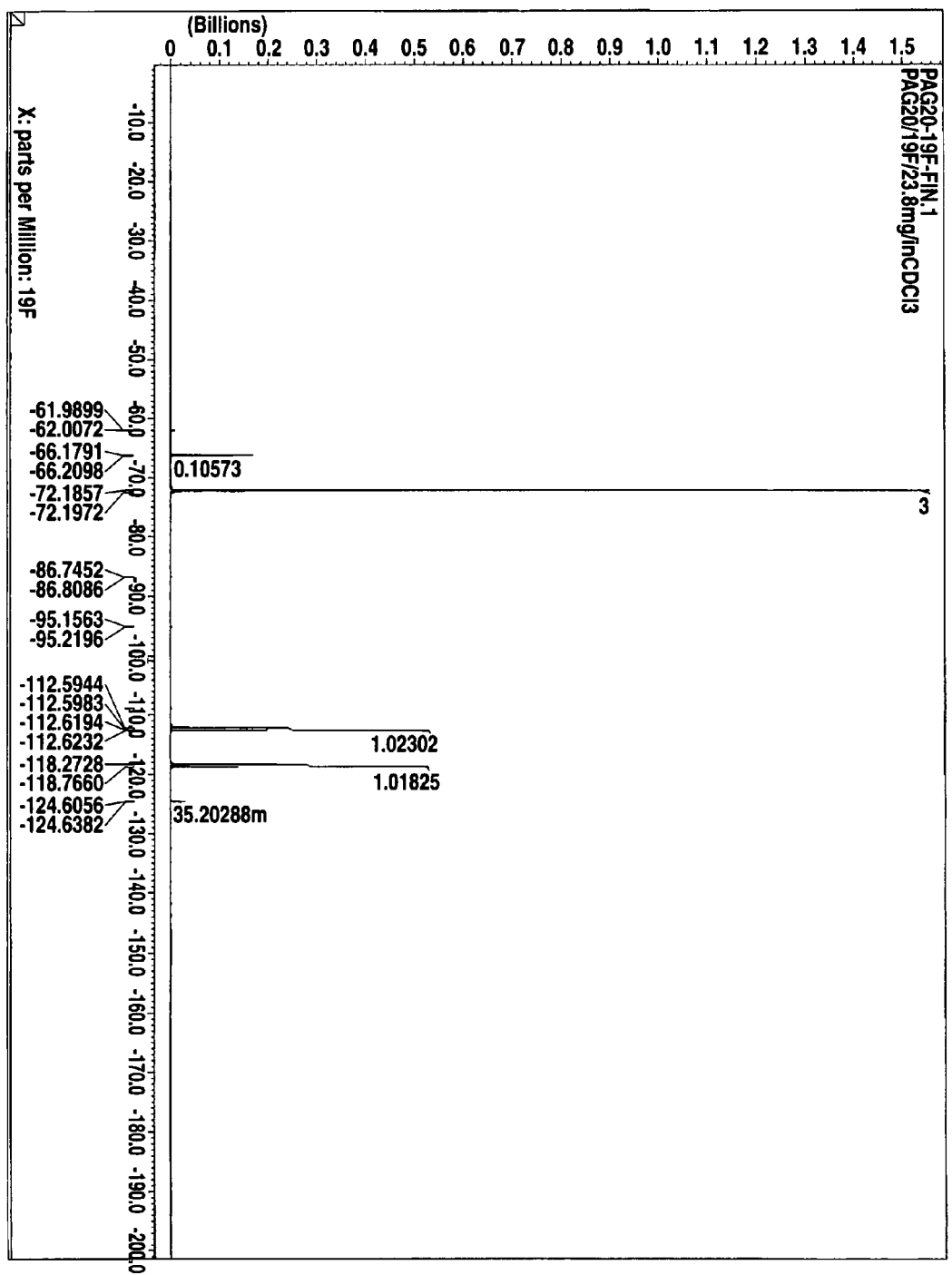
FIG. 26 is a diagram of $^{19}$F-NMR/CDCl$_3$ of PAG20 in Synthesis Example 36.
Figure 27:
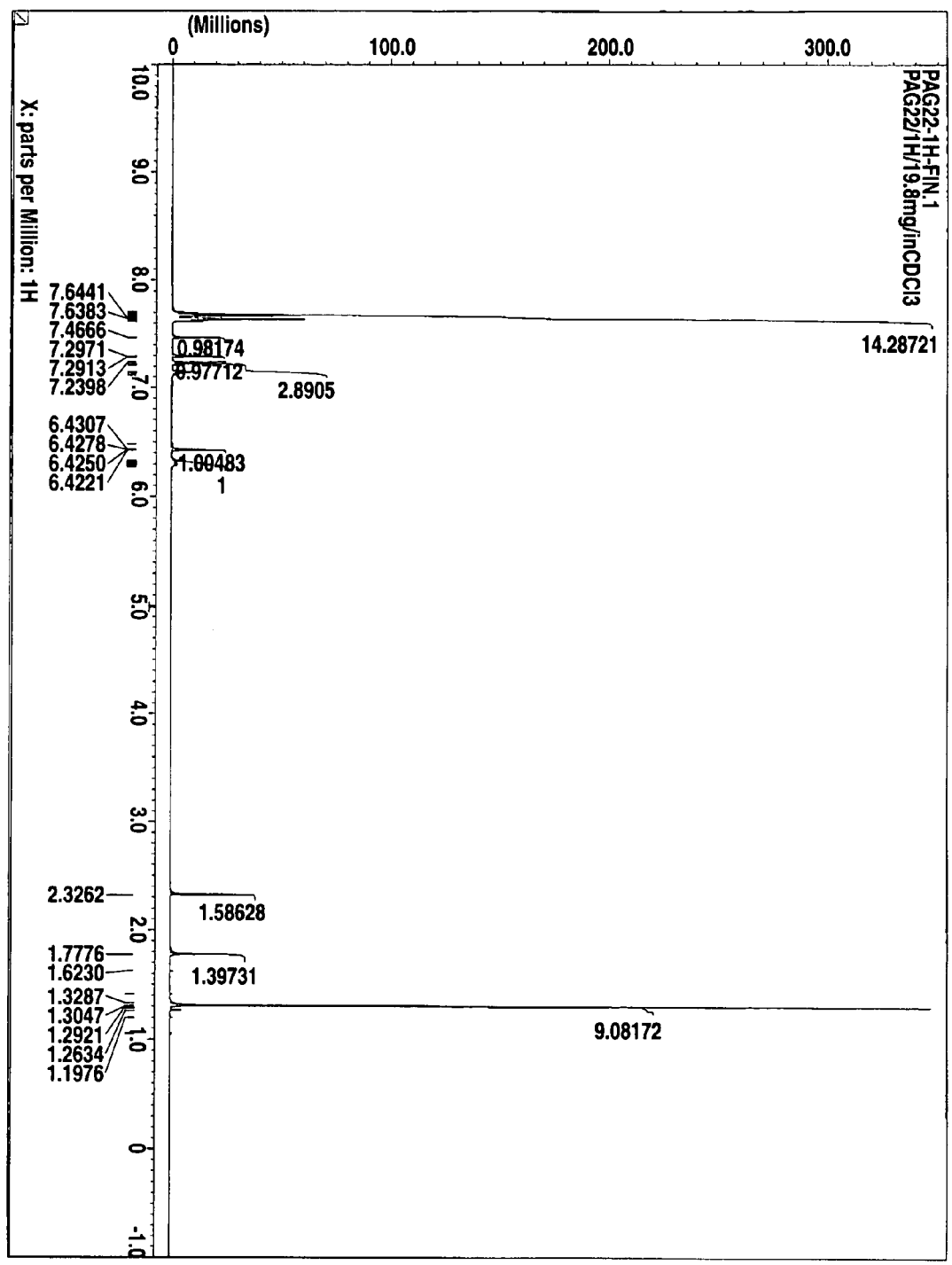
FIG. 27 is a diagram of $^1$H-NMR/CDCl$_3$ of PAG22 in Synthesis Example 38.
Figure 28:
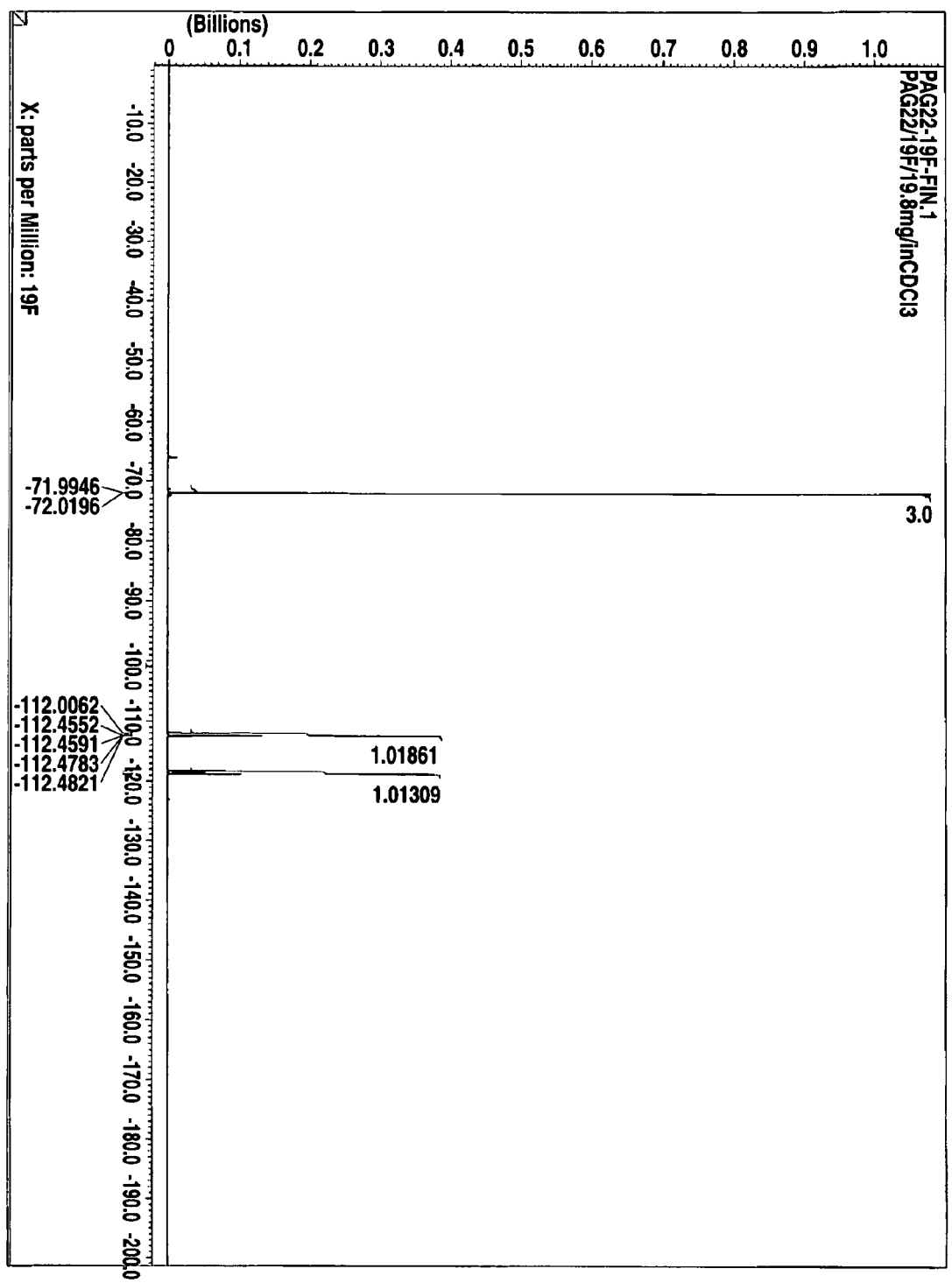
FIG. 28 is a diagram of $^{19}$F-NMR/CDCl$_3$ of PAG22 in Synthesis Example 38.
Figure 29:
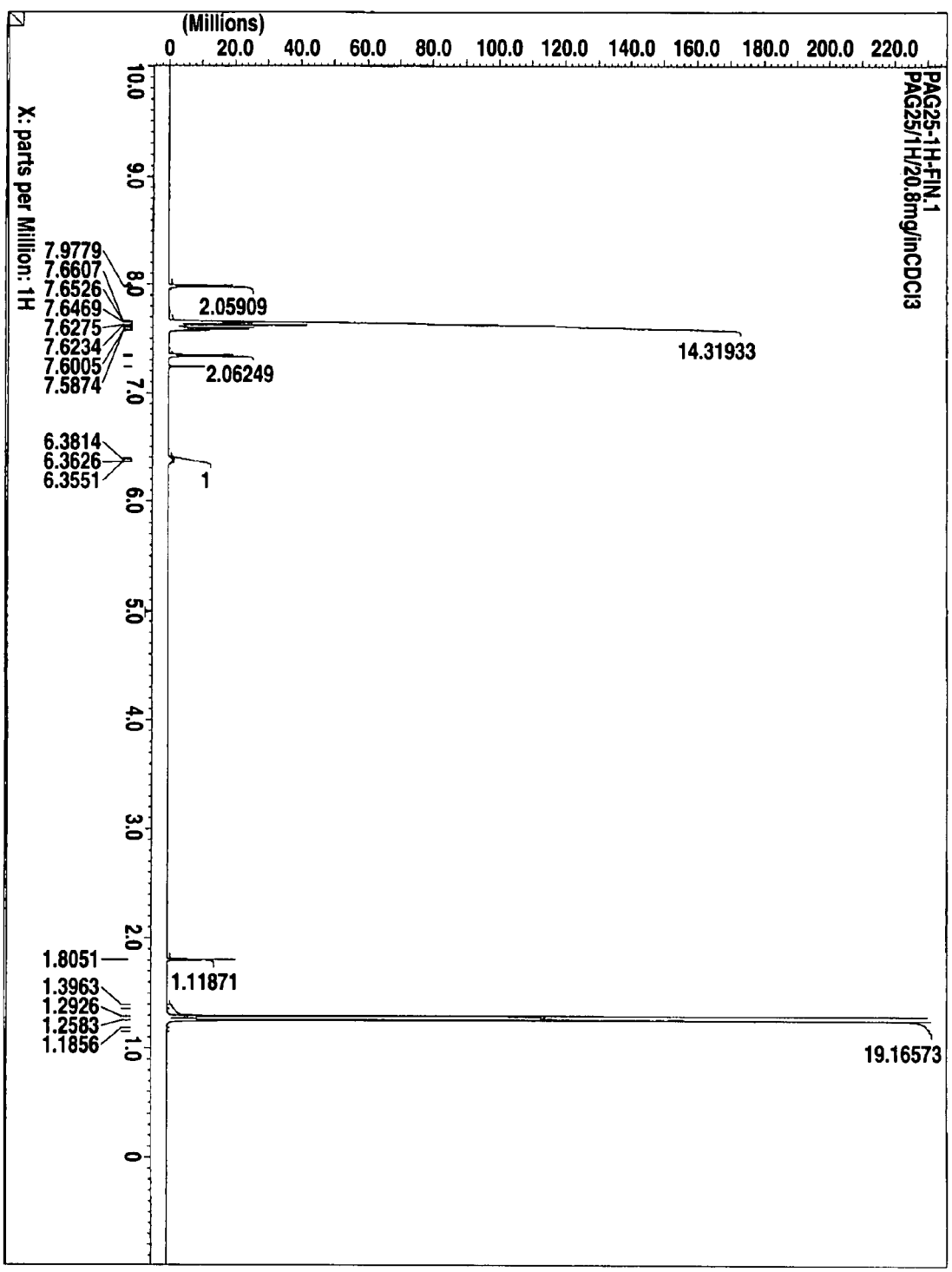
FIG. 29 is a diagram of $^1$H-NMR/CDCl$_3$ of PAG25 in Synthesis Example 41.
Figure 30:
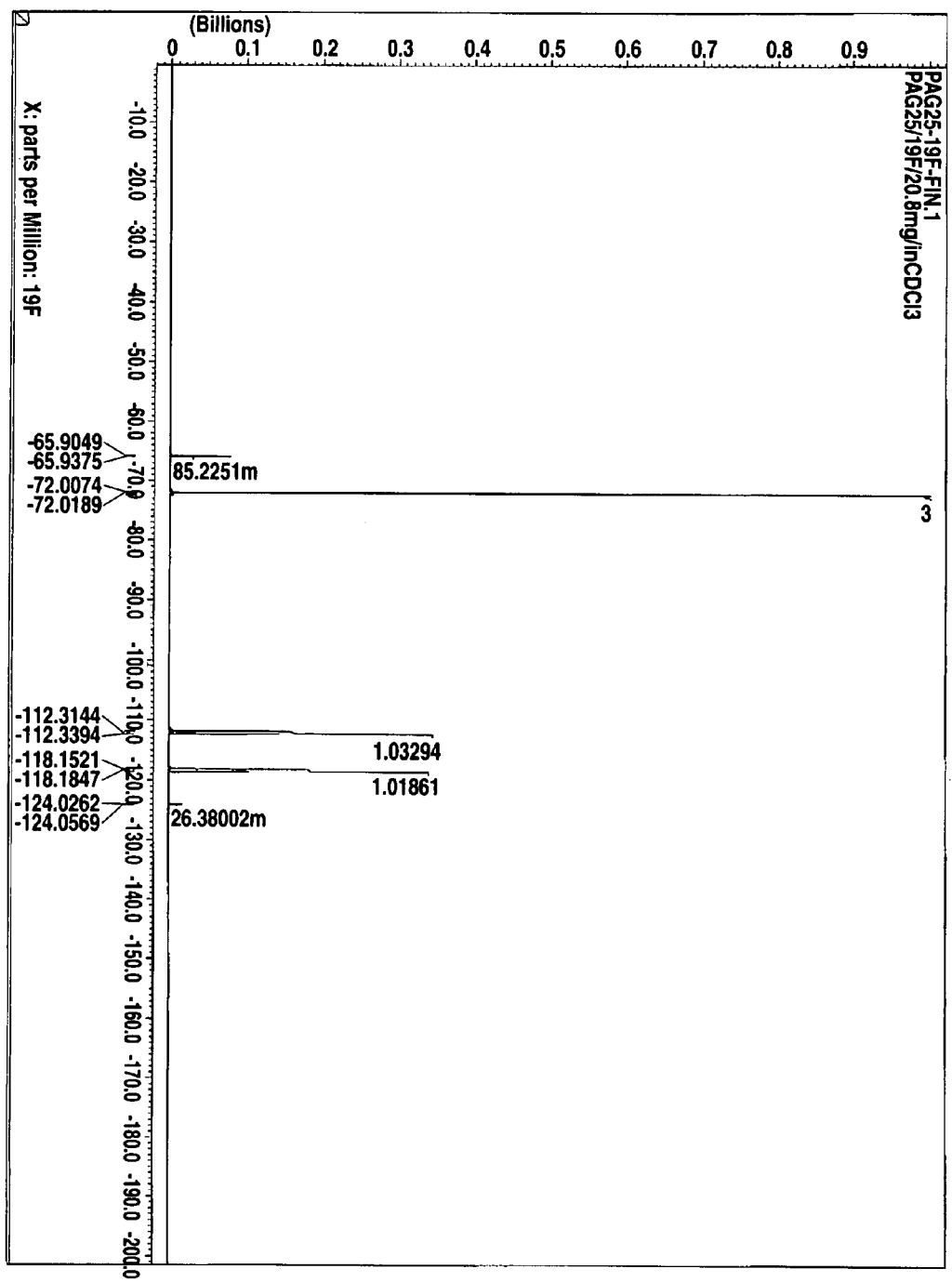
FIG. 30 is a diagram of $^{19}$F-NMR/CDCl$_3$ of PAG25 in Synthesis Example 41.
Figure 31:
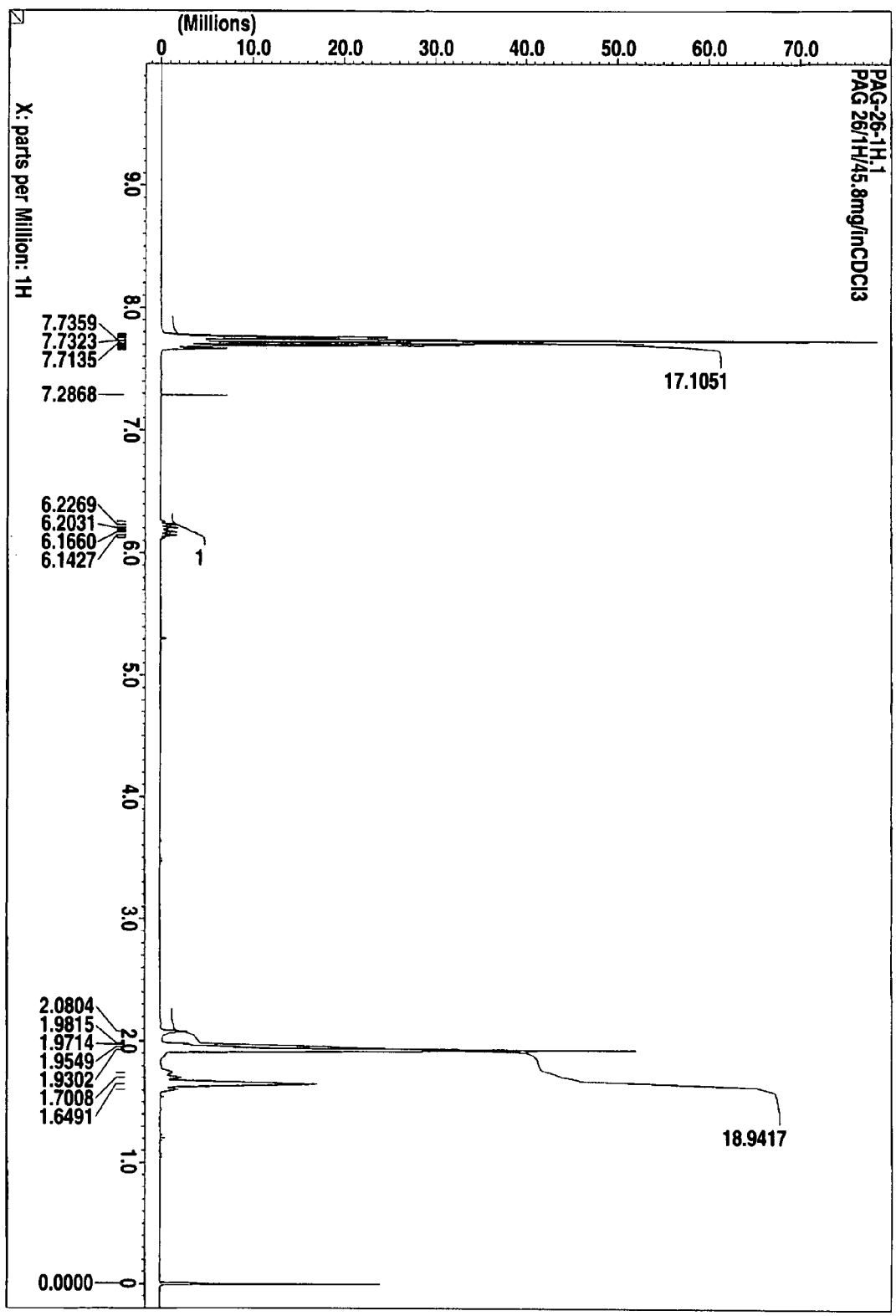
FIG. 31 is a diagram of $^1$H-NMR/CDCl$_3$ of PAG26 in Synthesis Example 42.
Figure 32:
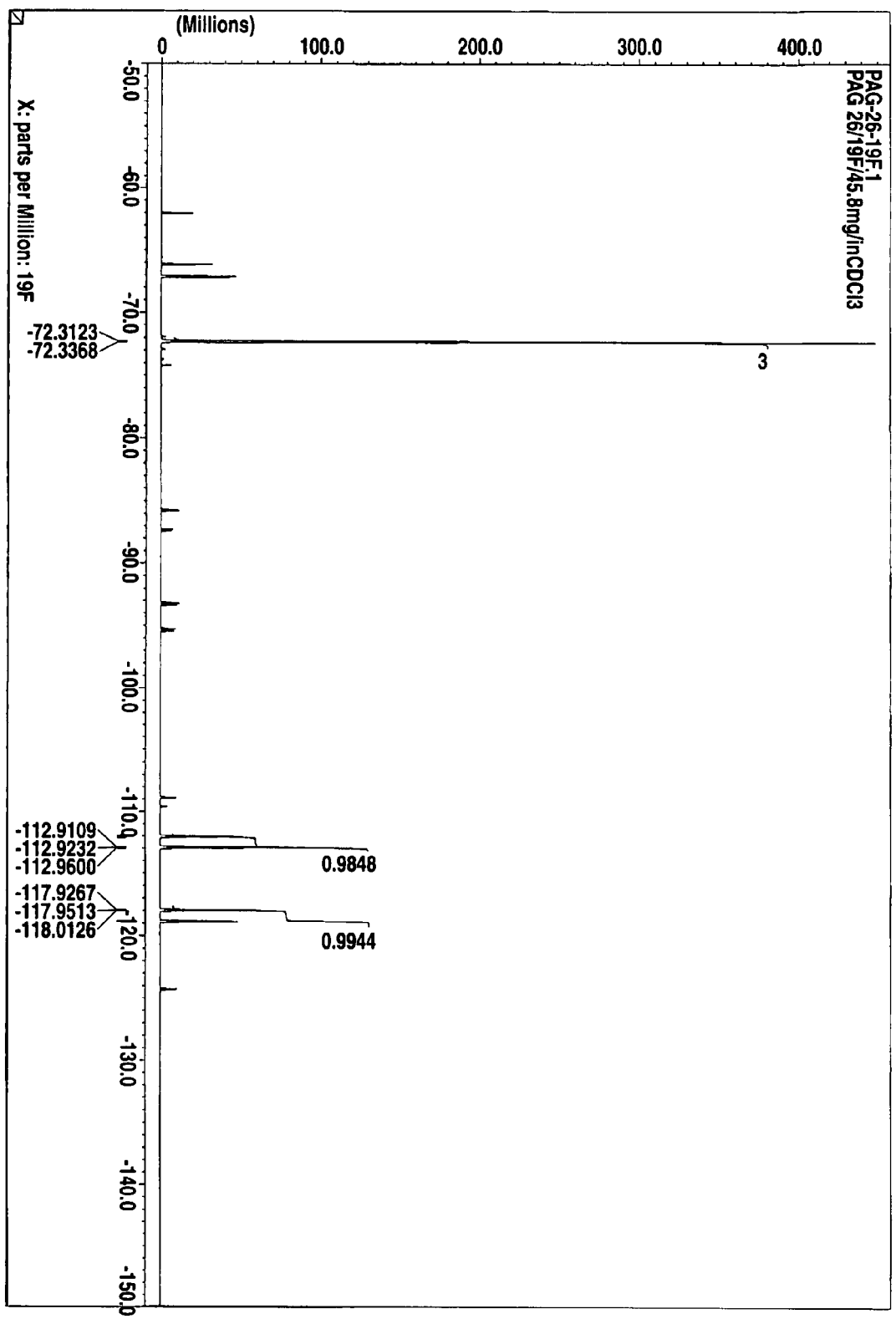
FIG. 32 is a diagram of $^{19}$F-NMR/CDCl$_3$ of PAG26 in Synthesis Example 42.
Figure 33:
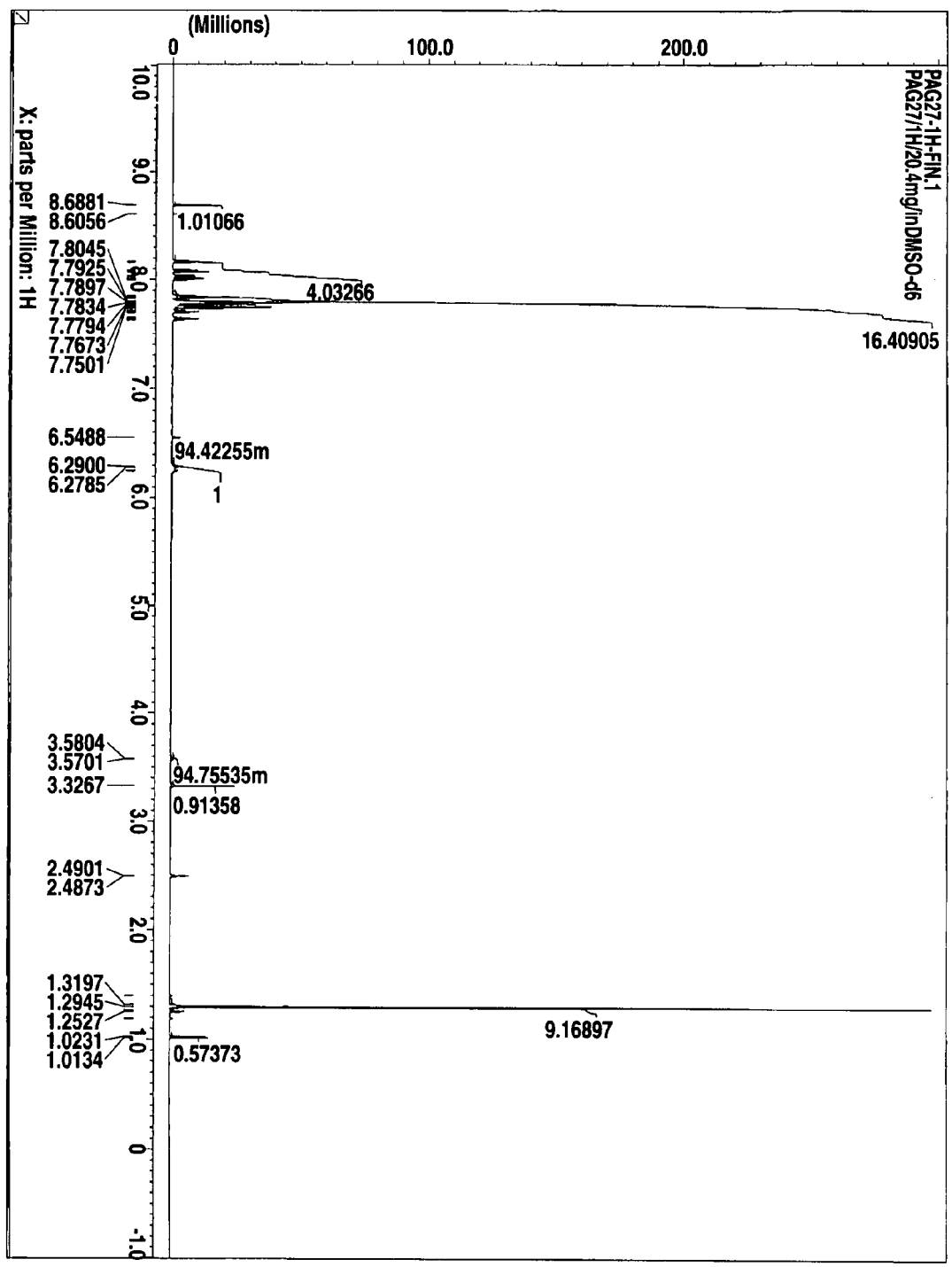
FIG. 33 is a diagram of $^1$H-NMR/DMSO-d$_6$ of PAG27 in Synthesis Example 43.
Figure 34:
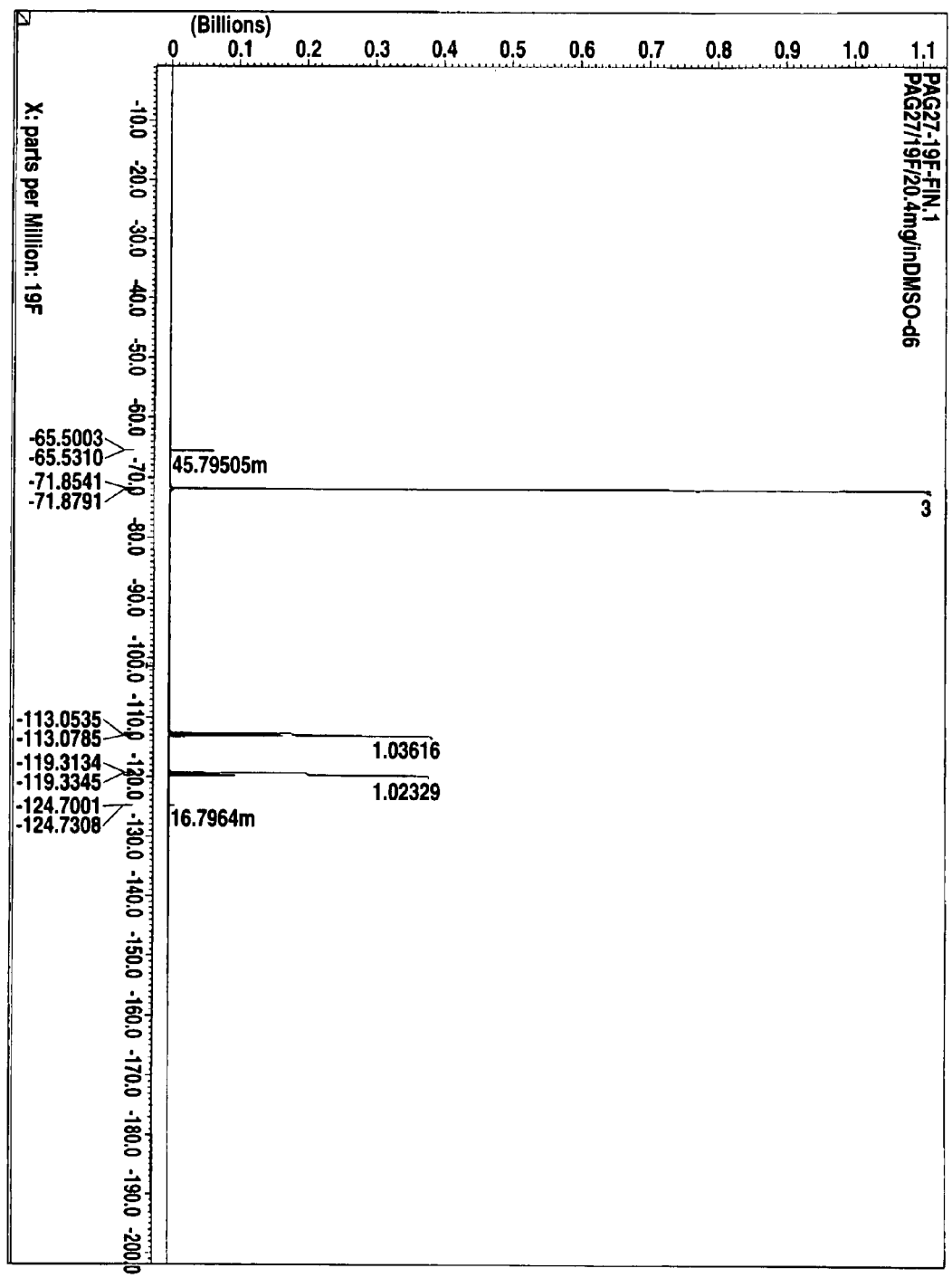
FIG. 34 is a diagram of $^{19}$F-NMR/DMSO-d$_6$ of PAG27 in Synthesis Example 43.

The target compound was analyzed by spectroscopy. The NMR spectra ($^1$H-NMR and $^{19}$F-NMR/D$_2$O) are shown in FIGS. 19 and 20.

TOFMS (MALDI) NEGATIVE M$^-$389 (corresponding to CF$_3$CH(OCOC$_6$H$_4$C$_4$H$_9$)CF$_2$SO$_3{}^-$)

Synthesis Example 32

Synthesis of sodium 1,1,3,3,3-pentafluoro-2-(1-adamantane-carbonyloxy)propanesulfonate The target sodium sulfonate was obtained by following the procedure of Synthesis Example 9 aside from using 1,1,3,3,3-pentafluoropropen-2-yl-adamantane-1-carboxylate which had been synthesized by a conventional technique.

Synthesis Examples 33-43

Target compounds were synthesized as in Synthesis Example 11 except that the onium salts prepared in Synthesis Examples 1 to 8 and the sulfonate salts prepared in Synthesis Examples 27 to 32 were used. The resulting onium salts PAG17 to PAG27 are shown below.

They were analyzed by spectroscopy. The NMR spectra ($^1$H-NMR and $^{19}$F-NMR/CDCl$_3$, $^1$H-NMR and $^{19}$F-NMR/DMSO-d$_6$) of PAG17, PAG18, PAG20, PAG22, PAG25, PAG26 and PAG27 are shown in FIGS. 21 to 34.

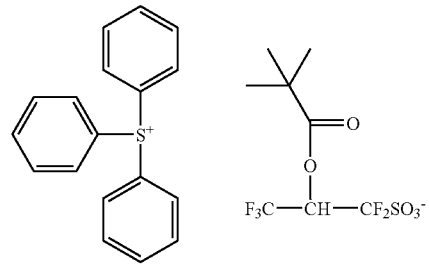

PAG 17

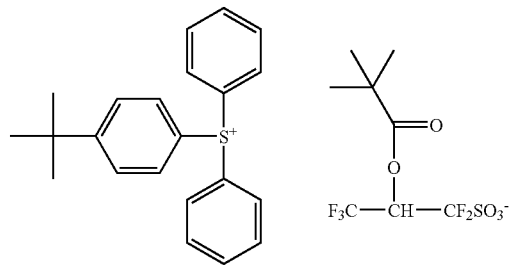

PAG 18

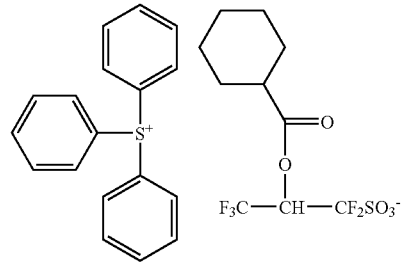

PAG 19

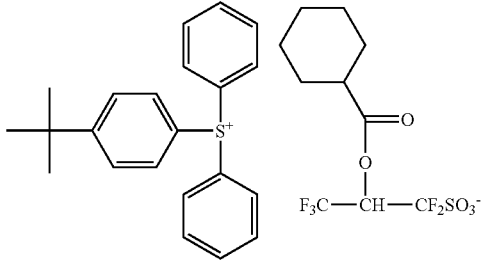

PAG 20

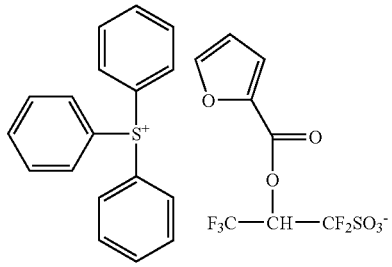

PAG 21

PAG 22
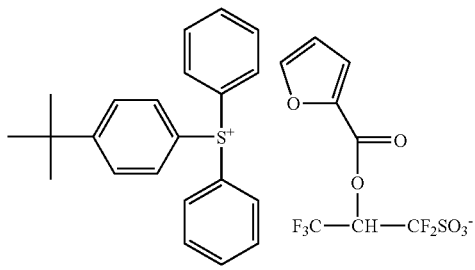

PAG 26
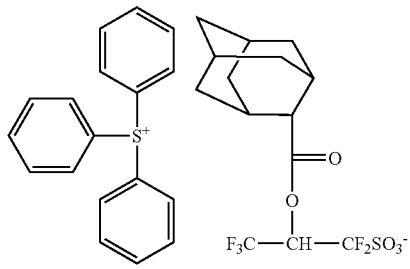

PAG 23
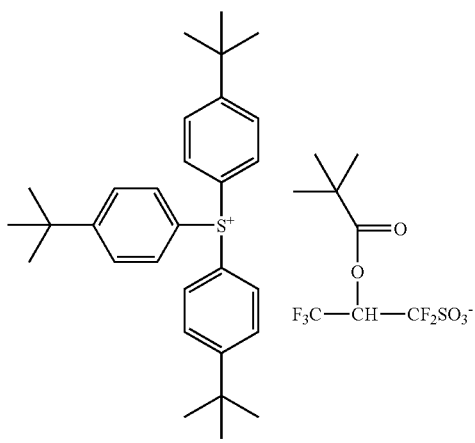

PAG 27
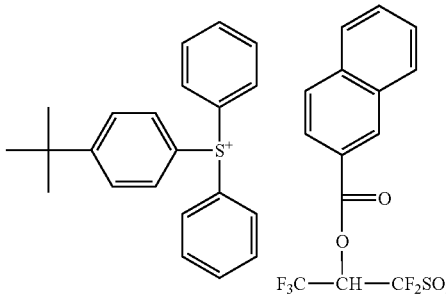

Synthesis Example 44

Synthesis of triphenylsulfonium 1,1,3,3,3-pentafluoro-2-acetyloxypropane-1-sulfonate (PAG28)

Hydrolysis of Carboxylic Ester in Anion Followed by Re-esterification with Carboxylic Anhydride In 104 g of methanol was dissolved 34.4 g of triphenylsulfonium 1,1,3,3,3-pentafluoro-2-benzoyloxypropane-1-sulfonate prepared in Synthesis Example 11, 2.5 g of sodium hydroxide in 7.5 g of water was added to the solution whereupon reaction took place for one hour under ice cooling. The reaction was monitored by thin layer chromatography (TLC), and the disappearance of the reactant spot was confirmed, after which 6.8 g of 12N hydrochloric acid was added to quench the reaction. 270 g of dichloromethane was added to the reaction solution, from which the organic layer was separated and concentrated, leaving 28 g of the concentrate. To an aliquot (3.0 g) of the concentrate were added 28 g of methylene chloride and 0.7 g of pyridine. Under ice cooling, 0.8 g of acetic anhydride was added dropwise to the solution, then 0.7 g of triethylamine and 0.04 g of 4-(N,N-dimethylamino) pyridine added. The mixture was stirred for 4 hours. The reaction was quenched with 20 g of water, after which the organic layer was separated, washed with 50 g of water three times, and concentrated. The target compound was obtained as 3 g of oil.

PAG 24
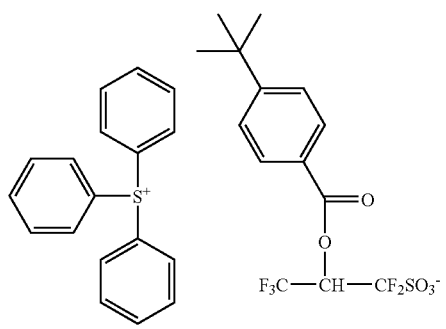

PAG 25
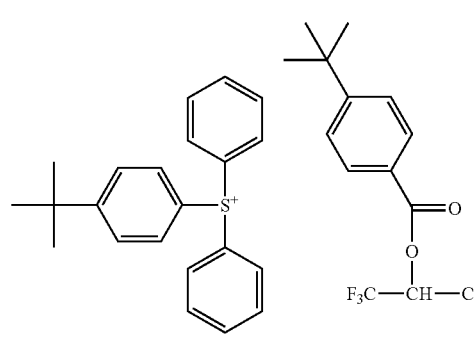

Figure 35:
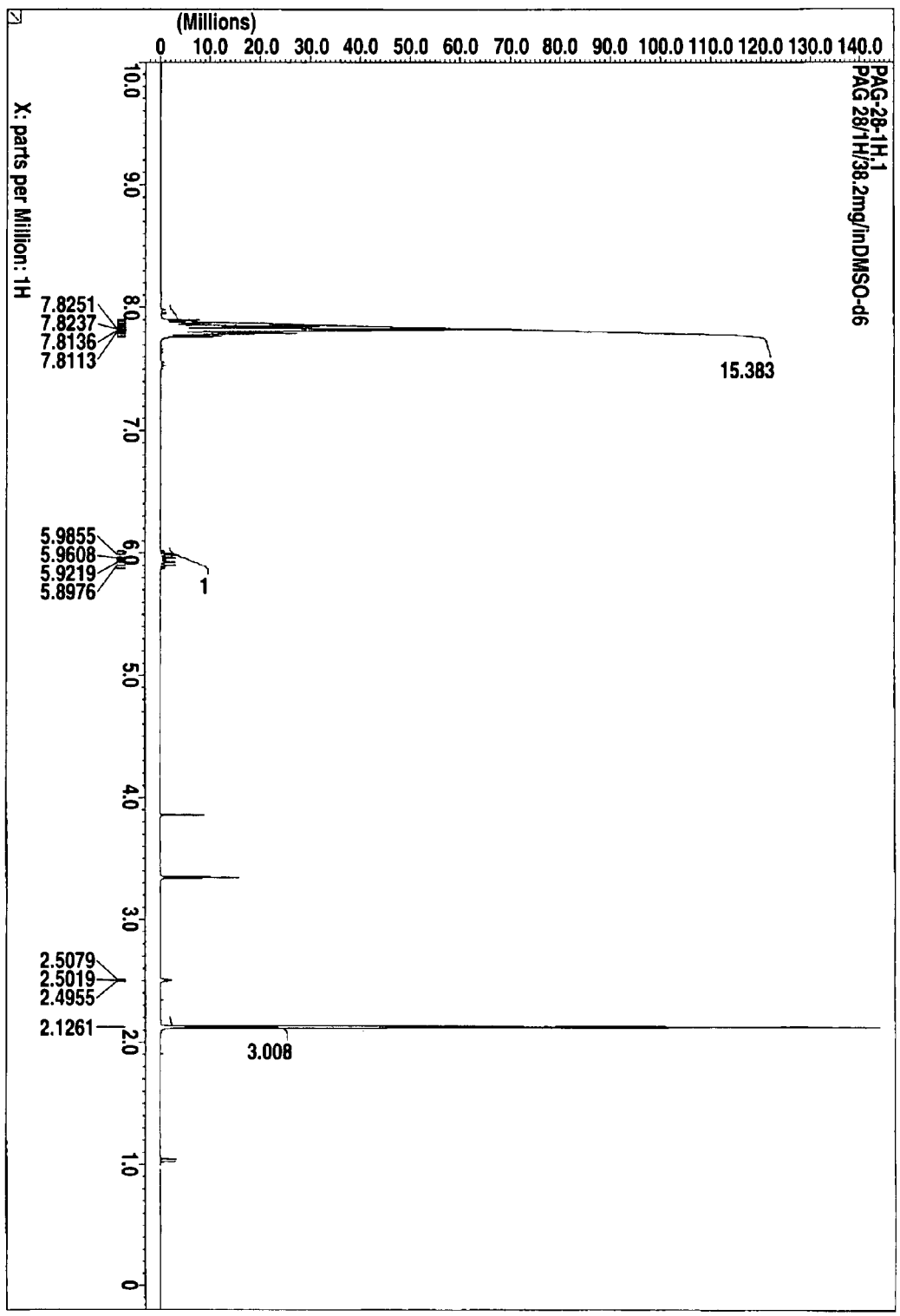
FIG. 35 is a diagram of $^1$H-NMR/DMSO-d$_6$ of PAG28 in Synthesis Example 44.
Figure 36:
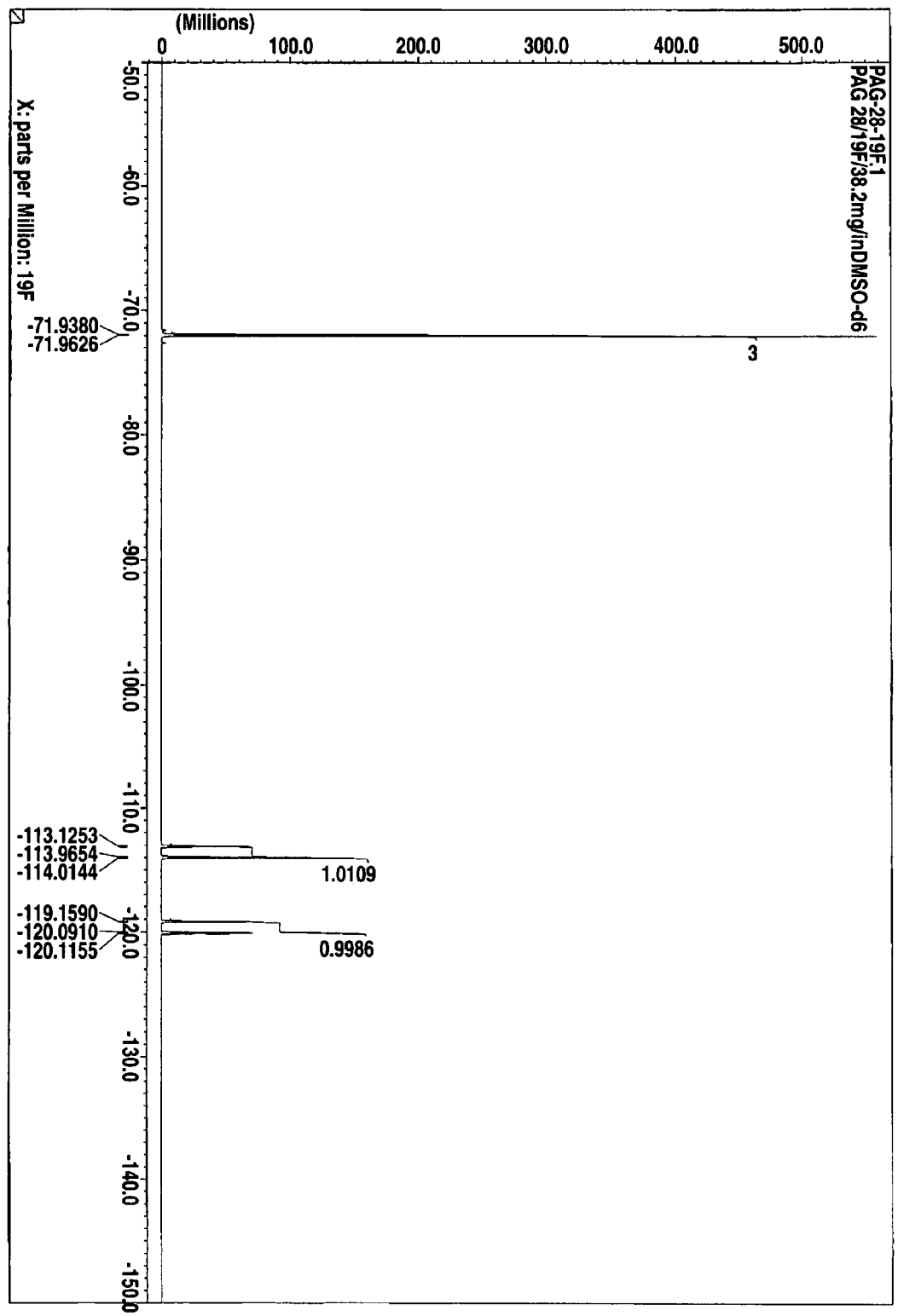
FIG. 36 is a diagram of $^{19}$F-NMR/DMSO-d$_6$ of PAG28 in Synthesis Example 44.

The target compound was analyzed by spectroscopy, with the data shown below. The NMR spectra ($^1$H-NMR and $^{19}$F-NMR/DMSO-$d_6$) are shown in FIGS. 35 and 36.

IR spectra (KBr, cm$^{-1}$) 3089, 3064, 2971, 1779, 1581, 1477, 1448, 1373, 1322, 1253, 1213, 1186, 1164, 1116, 1091, 1072, 995, 919, 750, 684, 642

TOFMS (MALDI) POSITIVE M$^+$263 (corresponding to $(C_6H_5)_3S^+$) NEGATIVE M$^-$269 (corresponding to CF$_3$CH(OCOCH$_3$)CF$_2$SO$_3^-$)

Synthesis Example 45

Synthesis of trimethylammonium 1,1,3,3,3-pentafluoro-2-(pivaloyloxy)propanesulfonate (PAG29)

Triethylamine was dissolved in cold water. To the solution, hydrochloric acid was added, and sodium 1,1,3,3,3-pentafluoro-2-(pivaloyloxy)propanesulfonate prepared in Synthesis Example 27 and dichloromethane were added, whereupon the mixture was stirred. The organic layer was separated and washed with water. From the organic layer as washed, the dichloromethane was distilled off in vacuum. Diethyl ether was added to the residue for recrystallization. The crystals were filtered and dried, obtaining the target compound in a yield of 75%.

Spectral analysis data of the target compound are shown below.

NMR spectra ($^1$H-NMR/DMSO-$d_6$, 300 MHz) 8.81 (1H, (b)N$\underline{H}^+$), 5.85-6.00 (1H, (m)C$\underline{H}$), 3.05-3.36 (6H, (m)C$\underline{H_2}$), 1.14-1.19 (15H, (m)C$\underline{H_2}$C$\underline{H_3}$ and C(C$\underline{H_3}$)$_3$)

IR spectra (KBr, cm$^{-1}$) 3052, 2991, 2968, 1770, 1477, 1400, 1375, 1327, 1279, 1232, 1211, 1190, 1169, 1118, 1070, 989, 916, 644

TOFMS (MALDI) POSITIVE M+102 (corresponding to $(C_6H_5)_3NH^+$) NEGATIVE M$^-$313 (corresponding to $CF_3CH(OCO(CH_3)_3)CF_2SO_3^-$)

Thermogravimetric Analysis (TGA)

Temperature at which a weight change of 0.1% or more occurred while heating from 30° C. at a rate of 10° C./min: 207° C.

Synthesis Example 46

Synthesis of tetrabutylammonium 1,1,3,3,3-pentafluoro-2-(pivaloyloxy)propanesulfonate (PAG30)

Commercially available tetra-n-butylammonium hydrogen sulfate was combined with sodium 1,1,3,3,3-pentafluoro-2-(pivaloyloxy)propanesulfonate in Synthesis Example 27, dichloromethane, and water, whereupon the mixture was stirred. The organic layer was separated and washed with water. From the organic layer as washed, the dichloromethane was distilled off in vacuum. Diethyl ether was added to the residue for recrystallization. The crystals were filtered and dried, obtaining the target compound in a yield of 75%.

Spectral analysis data of the target compound are shown below.

NMR spectra ($^1$H-NMR/DMSO-$d_6$, 300 MHz) 5.85-6.00 (1H, (m)C$\underline{H}$), 3.13-3.18 (8H, (m)C$\underline{H_2}$), 1.51-1.61 (8H, (m)C$\underline{H_2}$), 1.26-1.33 (8H, (q)C$\underline{H_2}$), 1.16 (9H, (s)C(C$\underline{H_3}$)$_3$), 0.90-0.95 (12H, (t)C$\underline{H_2}$C$\underline{H_3}$)

IR spectra (KBr, cm$^{-1}$) 2968, 2939, 2879, 1774, 1475, 1263, 1252, 1214, 1182, 1166, 1112, 1070, 916, 642

TOFMS (MALDI) POSITIVE M$^+$242 (corresponding to $(C_4H_9)_4N^+$) NEGATIVE M$^-$313 (corresponding to $CF_3CH(OCO(CH_3)_3)CF_2SO_3^-$)

TGA

Temperature at which a weight change of 0.1% or more occurred while heating from 30° C. at a rate of 10° C./min: 219° C.

Examples and Comparative Examples

Undercoat solutions (Examples 1 to 7, Comparative Example 1) and silicon-containing undercoat (intermediate layer) solutions (Examples 8 to 11, Comparative Example 2) were prepared by dissolving resins (Polymers 1 to 7), acid generators (PAG1 to 30 synthesized in Synthesis Examples, or RFPAG1, RFPAG2), and crosslinkers (CR1, CR2) in a solvent, and filtering through a fluororesin filter with a pore size of 0.1 μm. Some polymers are available as propylene glycol monomethyl ether acetate solution, and in such a case, the amount calculated as solids is shown in Table 1.

TABLE 1

| | | Polymer (pbw) | Cross linker (pbw) | Acid generator (pbw) | Organic solvent (pbw) |
|---|---|---|---|---|---|
| Example | 1 | Polymer 1 (28.0) | CR1 (10.0) | PAG7 (1.0) | PGMEA (100) |
| | 2 | Polymer 1 (28.0) | CR1 (10.0) | PAG29 (1.0) | PGMEA (100) |
| | 3 | Polymer 2 (28.0) | CR1 (10.0) | PAG30 (1.0) | PGMEA (100) |
| | 4 | Polymer 3 (28.0) | CR2 (10.0) | PAG8 (1.0) | PGMEA (100) |
| | 5 | Polymer 4 (28.0) | CR1 (10.0) | PAG14 (1.0) | PGMEA (100) |
| | 6 | Polymer 4 (28.0) | CR2 (10.0) | PAG30 (1.0) | PGMEA (100) |
| | 7 | Polymer 5 (28.0) | CR1 (10.0) | PAG29 (1.0) | PGMEA (100) |
| | 8 | Polymer 6 (28.0) | | PAG7 (1.0) | PGMEA (100) |
| | 9 | Polymer 7 (28.0) | | PAG14 (1.0) | PGMEA (100) |
| | 10 | Polymer 8 (28.0) | | PAG29 (1.0) | PGMEA (100) |
| | 11 | Polymer 8 (28.0) | CR1 (5.0) | PAG30 (1.0) | PGMEA (100) |
| Comparative Example | 1 | Polymer 1 (28.0) | CR1 (10.0) | RFPAG1 (1.0) | PGMEA (100) |
| | 2 | Polymer 8 (28.0) | CR1 (10.0) | PFPAG2 (1.0) | PGMEA (100) |

The abbreviations in Table 1 have the following meaning.
Polymer 1: 1-naphthol:dicyclopentadiene = 0.77:0.23 in molar ratio, Mw 5200, Mw/Mn 2.8 (compound of Synthesis Example 2 in JP-A 2004-205685)
Polymer 2: glycidyl-substituted 1-naphthol:dicyclopentadiene = 0.55:0.46 in molar ratio, Mw 6100, Mw/Mn 3.1 (compound of Synthesis Example 4 in JP-A 2004-205685)
Polymer 3: phenol:dicyclopentadiene = 0.68:0.32 in molar ratio, Mw 3400, Mw/Mn 3.8 (compound of Synthesis Example 1 in JP-A 2004-205685)
Polymer 4: m-cresol:4,4'-(9H-fluoren-9-ylidene)bisphenol novolac = 0.67:0.33 in molar ratio, Mw 6000, Mw/Mn 3.7 (compound of Synthesis Example 1 in JP-A 2005-128509)
Polymer 5: acenaphthylene:4,4'-(9H-fluoren-9-ylidene)-bisphenol novolac = 0.34:0.66 in molar ratio, Mw 9300, Mw/Mn 3.8 (compound of Synthesis Example 7 in JP-A 2005-128509)

TABLE 1-continued

|  | Polymer (pbw) | Cross linker (pbw) | Acid generator (pbw) | Organic solvent (pbw) |
|---|---|---|---|---|

Polymer 6: a polymer prepared from 139 g of 2-(3,4-epoxy-cyclohexyl)ethyltrimethoxysilane and 32 g of phenyltrimethoxysilane (compound of Synthesis Example 2 in JP-A 2005-018054)
Polymer 7: a polymer prepared from 24.6 g of 2-(3,4-epoxy-cyclohexyl)ethyltrimethoxysilane, 19.8 g of phenyltrimethoxysilane, and 28.6 g of spiro[2-oxooxolane-3,5'-bicyclo[2.2.1]heptane-trimethoxysilane], Mw 2300 (compound of Synthesis Example 8 in JP-A 2004-310019)
Polymer 8: a polymer prepared from 102 g of 2-(3,4-epoxy-cyclohexyl)ethyltrimethoxysilane, 71 g of tetraethoxysilane, 35 g of phenyltrimethoxy-silane, and 44 g of (2,3-dimethoxypropoxy)-propyltrimethoxysilane (compound of Synthesis Example 3 in JP-A 2005-352104)
RFPAG1: tetrabutylammonium trifluoromethanesulfonate
RFPAG2: bis(4-tert-butylphenyl)iodonium nonafluoro-1-butanesulfonate
CR1: 1,3,4,6-tetrakis(methoxymethyl)glycoluril
CR2: hexa(methoxymethyl)melamine
PGMEA: propylene glycol monomethyl ether acetate having 0.1 wt % of Fluorad FC-430 (Sumitomo 3M Co., Ltd.) dissolved therein Each of the undercoat forming materials (Examples 1 to 7; Comparative Example 1) was coated onto a silicon substrate having a $SiO_2$ layer of 300 nm thick laid thereon and baked at 220° C. for 60 seconds to form an undercoat layer of 300 nm thick. The coating, baking and subsequent development steps were carried out using a coater/developer system Clean Track Act® 8 (Tokyo Electron Ltd.).

The number of airborne particles with a diameter of 0.30 μm within the system Clean Track Act 8 was continuously monitored by means of an airborne particle counter KR-11A (Rion Co. Ltd.), with the results shown in Table 2. The undercoat materials of Examples 1 to 7 showed maximum values of 10 to 10,000 particles/liter, whereas the material of Comparative Example 1 showed a maximum value of more than 400,000 particles/liter. The data suggest that the undercoat material of the invention has a minimized content of volatile component which is countable as airborne particles.

TABLE 2

|  | (Maximum) number per liter of airborne particles |
|---|---|
| Example 1 | 10,000 |
| Example 2 | 10 |
| Example 3 | 100 |

TABLE 2-continued

|  | (Maximum) number per liter of airborne particles |
|---|---|
| Example 4 | 5,000 |
| Example 5 | 9,000 |
| Example 6 | 50 |
| Example 7 | 10 |
| Comparative Example 1 | 400,000 |

Next, each of the silicon-containing undercoat-forming solutions (intermediate layer-forming solutions) of Examples 8 to 11 and Comparative Example 2 was coated onto the undercoat layer and baked at 200° C. for 60 seconds to form a silicon-containing film of 100 nm thick. A resist solution was prepared by dissolving the components in a solvent as shown in Table 3 and filtering through a fluoroplastic filter with a pore size of 0.1 μm, after which it was coated onto the silicon-containing film and baked at 120° C. for 60 seconds. In this way, a multilayer film including a photoresist layer of 200 nm thick was formed. It is noted that ArF Resist 3 is a silicon-containing resist solution. Thus, ArF Resist 3 was coated onto the undercoat layer to form a photoresist layer of 100 nm thick without a need for a silicon-containing intermediate layer.

TABLE 3

|  | Polymer (pbw) | Acid generator (pbw) | Sensitivity modifier (pbw) | Organic solvent (pbw) |
|---|---|---|---|---|
| ArF Resist 1 | ArF Polymer 1 (100) | PAG1 (2.2) | BASE1 (0.3) | PGMEA (1,200) |
| ArF Resist 2 | ArF Polymer 1 (100) | PAG17 (2.2) | BASE1 (0.3) | PGMEA (1,200) |
| ArF Resist 3 | ArF Polymer 2 (100) | RFPAG3 (2.2) | BASE1 (0.3) | PGMEA (1,200) |

The abbreviations in Table 3 have the following meaning.
ArF Polymer 1: poly(3-oxo-2,7-dioxatricyclo[4.2.1.0$^{4,8}$]-9-nonyl methacrylate/3-hydroxy-1-adamantyl methacrylate/2-ethyl-2-adamantyl methacrylate), molar ratio = 0.40:0.30:0.30, Mw = 7,800
ArF Polymer 2: 2-tert-butoxycarbonyl-norbornane-co-2-methoxy-carbonyl-5(6)-norbornane-co-(2-hydroxy-2,2-bistrifluoromethyl)ethyl-norbornane polysilsesquioxane, molar ratio = 0.30:0.50:0.20, Mw = 3,500
RFPAG3: triphenylsulfonium nonafluoro-1-butanesulfonate
BASE1: tris(2-methoxymethoxyethyl)amine
PGMEA: propylene glycol monomethyl ether acetate having 0.1 wt % of Fluorad FC-430 (Sumitomo 3M Co., Ltd.) dissolved therein Table 4 shows lamination combinations of the undercoat layer, intermediate layer, and photoresist layer. Using an ArF laser stepper S305B (Nikon Corp., NA 0.68, σ 0.85, 2/3 annular illumination, Cr mask), the wafer having a photoresist layer coated thereon was exposed, then baked (PEB) at 110° C. for 60 seconds, and developed for 60 seconds with a 2.38 wt % aqueous solution of tetramethylammonium hydroxide (TMAH), thereby giving a positive pattern. The profile of the 0.12 μm line-and-space pattern was observed under a scanning electron microscope S-4700 (Hitachi Ltd.). The results are shown in Table 5.

TABLE 4

|  | Undercoat layer | Intermediate layer (SOG) | Resist layer |
|---|---|---|---|
| Example 12 | Example 1 | Example 8 | ArF Resist 1 |
| Example 13 | Example 4 | Example 8 | ArF Resist 1 |
| Example 14 | Example 3 | Example 9 | ArF Resist 2 |
| Example 15 | Example 2 |  | ArF Resist 3 |
| Example 16 | Example 5 | Example 11 | ArF Resist 2 |
| Example 17 | Example 6 | Example 11 | ArF Resist 1 |
| Example 18 | Example 7 | Comparative Example 2 | ArF Resist 2 |
| Example 19 | Comparative Example 1 | Example 9 | ArF Resist 2 |
| Example 20 | Example 5 | Comparative Example 2 | ArF Resist 2 |
| Example 21 | Example 6 |  | ArF Resist 3 |
| Example 22 | Example 1 | Example 10 | ArF Resist 2 |
| Comparative Example 3 | Comparative Example 1 | Comparative Example 2 | ArF Resist 1 |

Note that in Table 4, the undercoat layer and intermediate layer are designated by Examples or Comparative Examples where they were prepared.

The resist pattern can be transferred to the silicon-containing intermediate layer and/or the undercoat layer by ordinary etching techniques. Specifically, the transfer of the silicon-free resist pattern to the silicon-containing intermediate layer (SOG film) was carried out using a dry etching equipment TE-8500P (Tokyo Electron Ltd.). A set of etching conditions is shown below.

| Chamber pressure | 40.0 Pa |
| RF power | 1000 W |
| Gap | 9 mm |
| CHF$_3$ gas flow rate | 20 ml/min |
| CF$_4$ gas flow rate | 60 ml/min |
| Ar gas flow rate | 200 ml/min |
| Time | 30 sec |

Next, the pattern transferred to the SOG film or the silicon-containing resist pattern (the multilayer film of Examples 15 and 21) was transferred to the undercoat layer by oxygen gas etching. A set of etching conditions is shown below.

| Chamber pressure | 60.0 Pa |
| RF power | 600 W |
| Ar gas flow rate | 40 ml/min |
| O$_2$ gas flow rate | 60 ml/min |
| Gap | 9 mm |
| Time | 20 sec |

Finally, the SiO$_2$ substrate was processed using the patterned undercoat layer as a mask. A set of etching conditions is shown below.

| Chamber pressure | 40.0 Pa |
| RF power | 1300 W |
| Gap | 9 mm |
| CHF$_3$ gas flow rate | 30 ml/min |
| CF$_4$ gas flow rate | 30 ml/min |
| Ar gas flow rate | 100 ml/min |
| Time | 60 sec |

A cross section of the pattern was observed under an SEM S-4700 (Hitachi, Ltd.). It was found that the pattern profiles remained satisfactory after fluorine etching (intermediate layer etching), after oxygen etching (undercoat layer etching), and after substrate processing (SiO$_2$ substrate etching). The results are shown in Table 5 together with the resist profile.

TABLE 5

|  | Resist profile after development | Profile after intermediate layer etching | Profile after undercoat layer etching | Profile after SiO$_2$ substrate etching |
|---|---|---|---|---|
| Example 12 | rectangular | rectangular | rectangular | rectangular |
| Example 13 | rectangular | rectangular | rectangular | rectangular |
| Example 14 | rectangular | rectangular | rectangular | rectangular |
| Example 15 | rectangular |  | rectangular | rectangular |
| Example 16 | rectangular | rectangular | rectangular | rectangular |
| Example 17 | rectangular | rectangular | rectangular | rectangular |
| Example 18 | rectangular | rectangular | rectangular | rectangular |
| Example 19 | rectangular | rectangular | rectangular | rectangular |
| Example 20 | rectangular | rectangular | rectangular | rectangular |
| Example 21 | rectangular |  | rectangular | rectangular |
| Example 22 | rectangular | rectangular | rectangular | rectangular |
| Comparative Example 3 | somewhat footing | rectangular | rectangular | rectangular |

The undercoat material of the invention is effective in restraining the generation of airborne particles within the boater as is evident from Table 2, and ensures that the resist profile and the undercoat layer profile after oxygen etching and substrate processing remain satisfactory (rectangular, i.e., perpendicular profile) as is evident from Table 5. The thermal acid generator is susceptible to alkaline hydrolysis due to the presence of ester within its molecule as seen from Synthesis Example 44. It is fully expected that quick hydrolysis of the thermal acid generator residue occurs upon disposal of the spent solution. Accordingly, it poses no environmental burden as opposed to non-degradable perfluoroalkanesulfonic acids.

Japanese Patent Application No. 2006-135169 is incorporated herein by reference.

Although some preferred embodiments have been described, many modifications and variations may be made thereto in light of the above teachings. It is therefore to be understood that the invention may be practiced otherwise than as specifically described without departing from the scope of the appended claims.

The invention claimed is:

1. A thermal acid generator of generating an acid on heating at or above 100° C., having the general formula (1a):

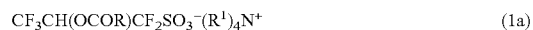

$$CF_3CH(OCOR)CF_2SO_3^-(R^1)_4N^+ \quad (1a)$$

wherein R is a substituted or unsubstituted, straight, branched or cyclic alkyl group of 1 to 20 carbon atoms or a substituted or unsubstituted aryl group of 6 to 14 carbon atoms, R$^1$ is each independently hydrogen, a substituted or unsubstituted, straight, branched or cyclic alkyl, alkenyl or oxoalkyl group of 1 to 10 carbon atoms, or a substituted or unsubstituted aryl, aralkyl or aryloxoalkyl group of 6 to 18 carbon atoms, or any two or more of $R^1$ may bond together to form a ring with the nitrogen atom.

2. A resist undercoat material for use as an undercoat layer beneath a chemically amplified photoresist layer, comprising a resin, an acid crosslinker, and an onium salt having the general formula (1):

$$CF_3CH(OCOR)CF_2SO_3^-(R^1)_m A^+ \quad (1)$$

wherein R is a substituted or unsubstituted, straight, branched or cyclic alkyl group of 1 to 20 carbon atoms or a substituted or unsubstituted aryl group of 6 to 14 carbon atoms, A is a nitrogen, sulfur or iodine atom, m is 4 when A is a nitrogen atom, m is 3 when A is a sulfur atom, or m is 2 when A is an iodine atom, $R^1$ is each independently hydrogen, a substituted or unsubstituted, straight, branched or cyclic alkyl, alkenyl or oxoalkyl group of 1 to 10 carbon atoms, or a substituted or unsubstituted aryl, aralkyl or aryloxoalkyl group of 6 to 18 carbon atoms, or any two or more of $R^1$ may bond together to form a ring with A, with the proviso that $R^1$ is not hydrogen when A is a sulfur or iodine atom.

3. A resist undercoat material for use as an undercoat layer beneath a chemically amplified photoresist layer, comprising a resin, an acid crosslinker, and a thermal acid generator of generating an acid on heating at or above 100° C., the acid having the general formula (2):

$$CF_3CH(OCOR)CF_2SO_3^-H^+ \quad (2)$$

wherein R is a substituted or unsubstituted, straight, branched or cyclic alkyl group of 1 to 20 carbon atoms or a substituted or unsubstituted aryl group of 6 to 14 carbon atoms.

4. The resist undercoat material of claim 2, wherein said resin contains silicon atoms.

5. The resist undercoat material of claim 2, wherein said resin and said acid crosslinker are included within a common resin.

6. The resist undercoat material of claim 2, further comprising an organic solvent.

7. A lithographic process for forming a pattern in a substrate, comprising the steps of:
applying the resist undercoat material of claim 3 onto at least a substrate to form a resist undercoat layer,
applying a resist topcoat material in the form of a photoresist composition onto the undercoat layer to form a resist topcoat layer, thus constructing a multilayer resist film,
exposing the multilayer resist film in a pattern circuit region to radiation,
developing with a developer to form a resist pattern in the resist topcoat layer, and
etching the resist undercoat layer and the substrate through the patterned resist topcoat layer as a mask for forming a pattern in the substrate.

8. A lithographic process for forming a pattern in a substrate, comprising the steps of:
applying the silicon-containing resist undercoat material of claim 4 onto at least a substrate to form a resist undercoat layer,
applying a resist topcoat material in the form of a photoresist composition onto the undercoat layer to form a resist topcoat layer, thus constructing a multilayer resist film,
exposing the multilayer resist film in a pattern circuit region to radiation,
developing with a developer to form a resist pattern in the resist topcoat layer,
etching the resist undercoat layer through the patterned resist topcoat layer as a mask, and
etching the substrate through the patterned resist undercoat layer as a mask for forming a pattern in the substrate.

9. A lithographic process for forming a pattern in a substrate, comprising the steps of:
applying the resist undercoat material of claim 3 onto at least a processable substrate to form an organic undercoat layer,
applying a silicon-containing intermediate layer onto the undercoat layer,
applying a photoresist composition onto the intermediate layer to form a photoresist layer,
exposing the photoresist layer in a predetermined region to radiation,
developing with a developer to form a patterned photoresist layer,
processing the intermediate layer through the patterned photoresist layer as a mask by means of a dry etching apparatus,
removing the patterned photoresist layer,
etching the undercoat layer through the processed intermediate layer as a mask, and
processing the processable substrate through the processed undercoat layer as a mask.

* * * * *